(12) United States Patent
Ema et al.

(10) Patent No.: US 7,539,963 B2
(45) Date of Patent: May 26, 2009

(54) SEMICONDUCTOR DEVICE GROUP AND METHOD FOR FABRICATING THE SAME, AND SEMICONDUCTOR DEVICE AND METHOD FOR FABRICATING THE SAME

(75) Inventors: Taiji Ema, Kawasaki (JP); Hideyuki Kojima, Kawasaki (JP); Toru Anezaki, Kawasaki (JP); Shinichi Nakagawa, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 10/969,240

(22) Filed: Oct. 21, 2004

(65) Prior Publication Data

US 2005/0110071 A1    May 26, 2005

(30) Foreign Application Priority Data

Oct. 24, 2003  (JP) ............................. 2003-364358
Nov. 6, 2003   (JP) ............................. 2003-377265

(51) Int. Cl.
G06F 9/45     (2006.01)
G06F 17/50    (2006.01)
G06F 9/455    (2006.01)

(52) U.S. Cl. ......................................... 716/10; 716/11
(58) Field of Classification Search ............. 716/16–17, 716/10–11
See application file for complete search history.

(56) References Cited

U.S. PATENT DOCUMENTS 5,889,304 A    3/1999    Watanabe et al.

6,130,168 A *  10/2000   Chu et al. .................. 438/717

(Continued)

FOREIGN PATENT DOCUMENTS

JP    HEI 10-199994 (A)    7/1998

(Continued)

OTHER PUBLICATIONS

German Office Action dated Jan. 31, 2006, issued in corresponding German Patent Application No. 10 2004 051 588.3-33.

(Continued)

*Primary Examiner*—Jack Chiang
*Assistant Examiner*—Suresh Memula
(74) *Attorney, Agent, or Firm*—Westerman, Hattori, Daniels & Adrian, LLP.

(57) ABSTRACT

The semiconductor group comprises a first semiconductor device including a first design macro and a nonvolatile memory, and a second semiconductor device including a second design macro having identity with the first design macro and including no nonvolatile memory. The first design macro includes a first active region and a first device isolation region formed on a first semiconductor substrate. The second design macro includes a second active region and a second device isolation region formed on a second semiconductor substrate. A curvature radius of an upper end of the first active region in a cross section is larger than a curvature radius of an upper end of the second active region in a cross section. A difference in height between a surface of the first active region and a surface of the first device isolation region is larger than a difference in height between a surface of the second active region and a surface of the device isolation region.

11 Claims, 48 Drawing Sheets

U.S. PATENT DOCUMENTS

| | | | |
|---|---|---|---|
| 6,368,970 B1 * | 4/2002 | Abdul-Hak et al. | 438/690 |
| 6,970,383 B1 * | 11/2005 | Han et al. | 365/185.28 |
| 2002/0050609 A1 * | 5/2002 | Park et al. | 257/315 |
| 2003/0041308 A1 * | 2/2003 | Ganesan et al. | 716/4 |
| 2003/0073038 A1 * | 4/2003 | Hotta et al. | 430/311 |
| 2003/0204387 A1 * | 10/2003 | Upreti | 703/14 |
| 2004/0023473 A1 * | 2/2004 | Divakaruni et al. | 438/551 |
| 2004/0070421 A1 * | 4/2004 | Kapoor | 326/38 |
| 2004/0251512 A1 * | 12/2004 | Khan et al. | 257/510 |

FOREIGN PATENT DOCUMENTS

| | | |
|---|---|---|
| JP | HEI 11-317458 (A) | 11/1999 |
| JP | 2000-269450 (A) | 9/2000 |
| JP | 2000-315733 (A) | 11/2000 |
| JP | 2000-315738 (A) | 11/2000 |
| JP | 2001-015618 (A) | 1/2001 |
| JP | 2001-068652 (A) | 3/2001 |
| JP | 2001-196470 (A) | 7/2001 |
| JP | 2002-368145 (A) | 12/2002 |
| JP | 2003-007863 (A) | 1/2003 |

OTHER PUBLICATIONS

Stephen Keeney, "A 130nm generation high density Etox flash memory technology", IEDM 2001.

* cited by examiner

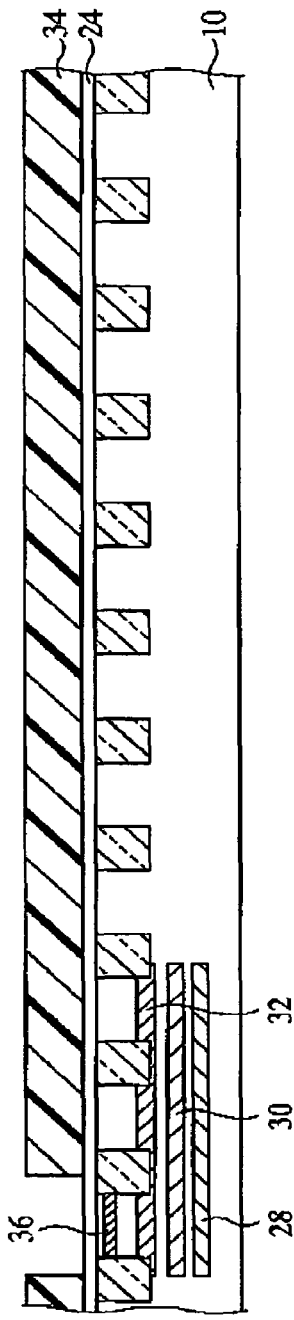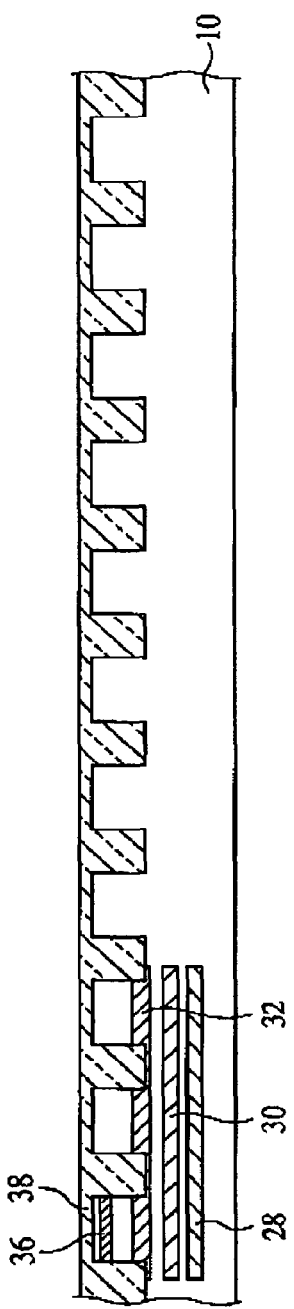
FIG. 8A
FIG. 8B

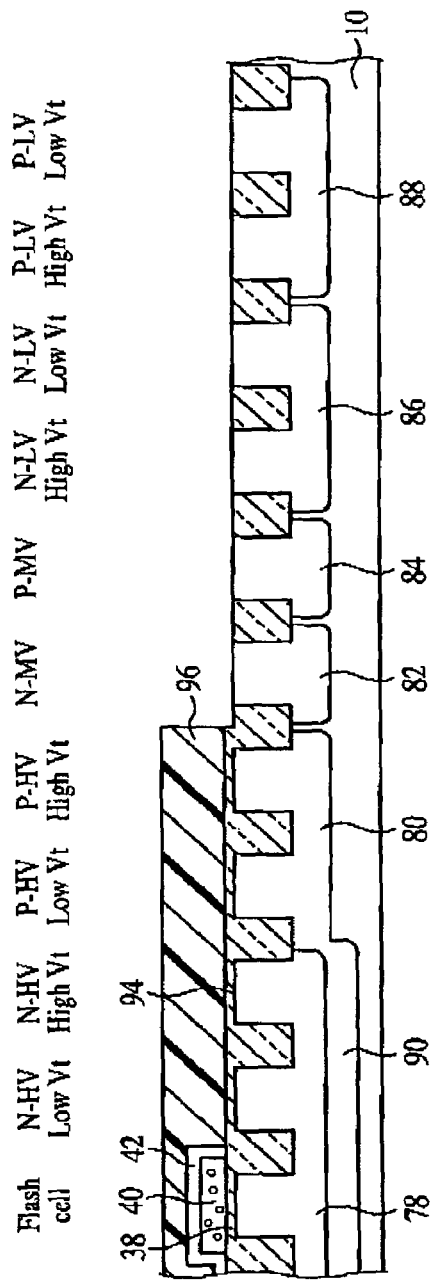

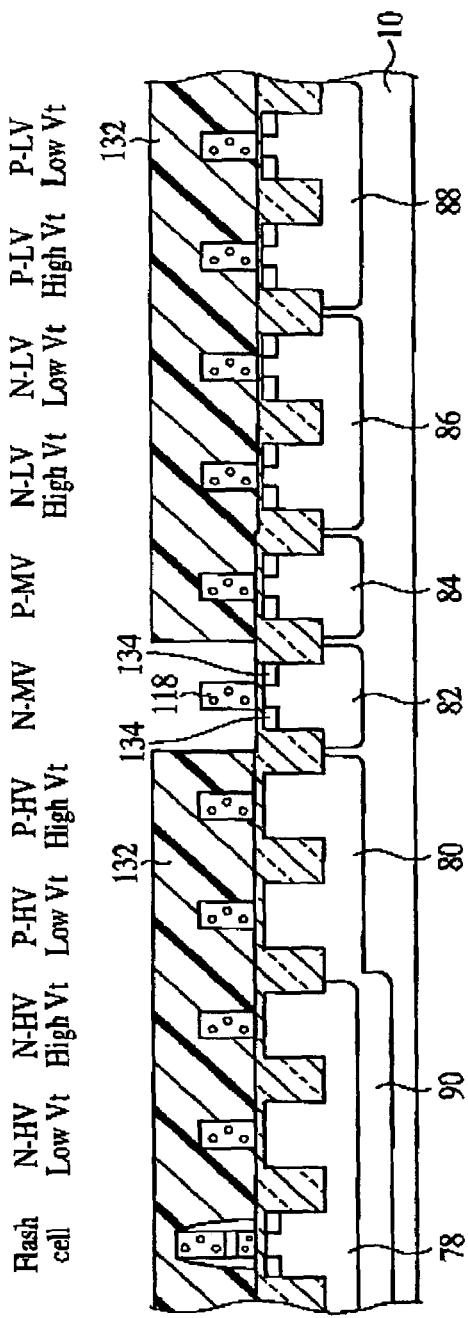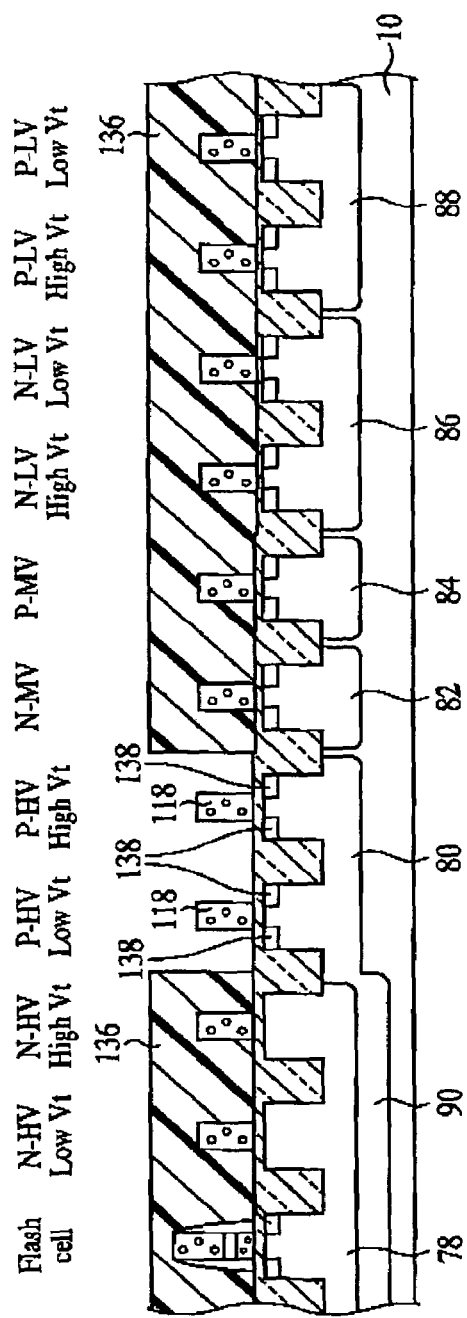
FIG. 18A
FIG. 18B

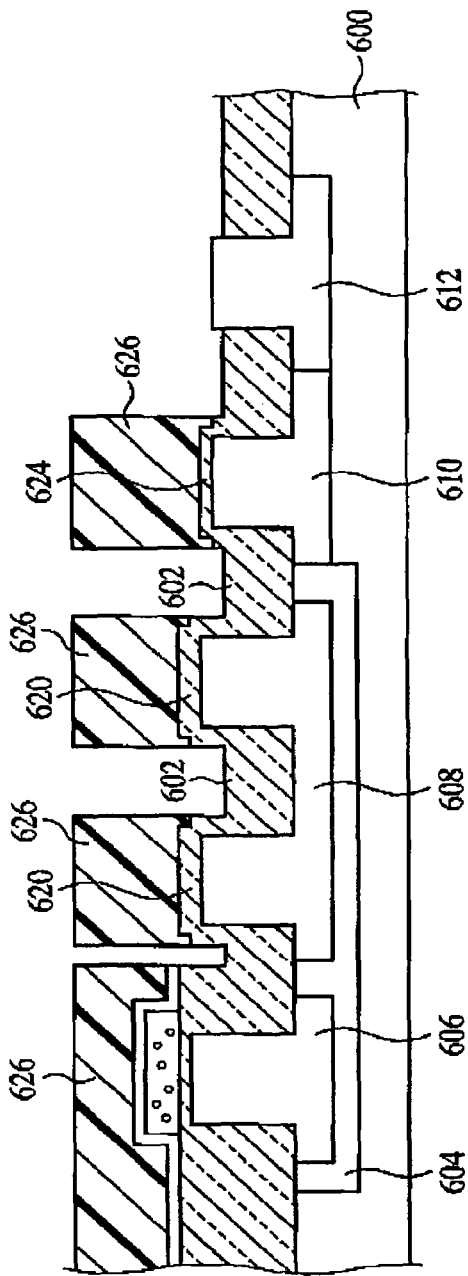
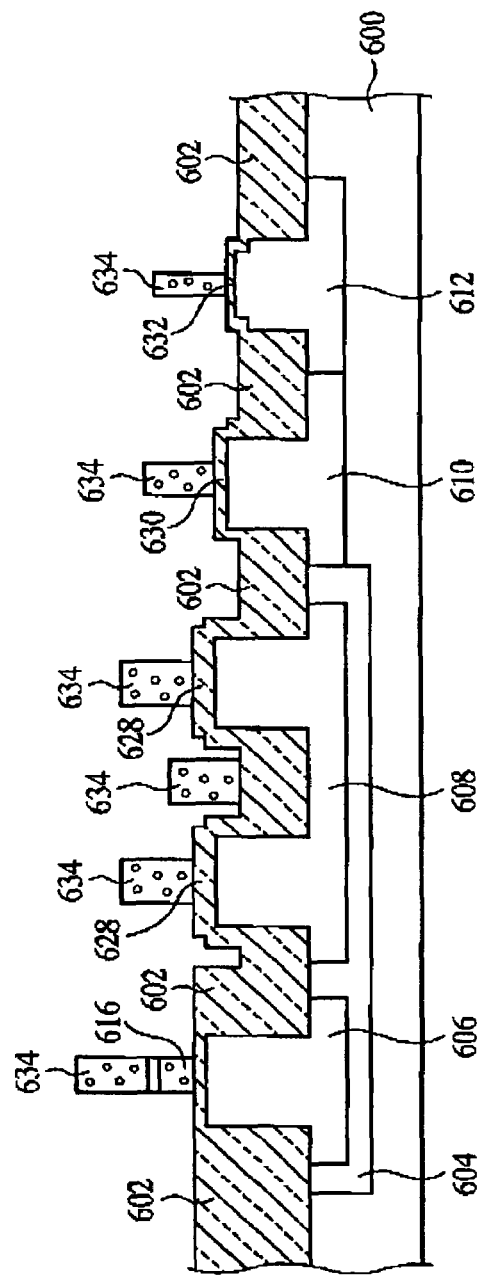
FIG. 24A
FIG. 24B

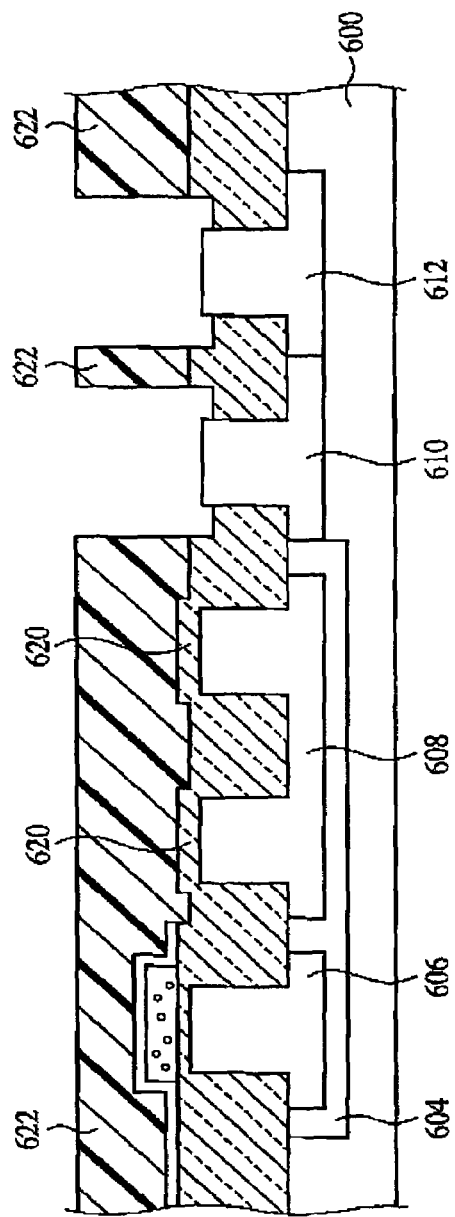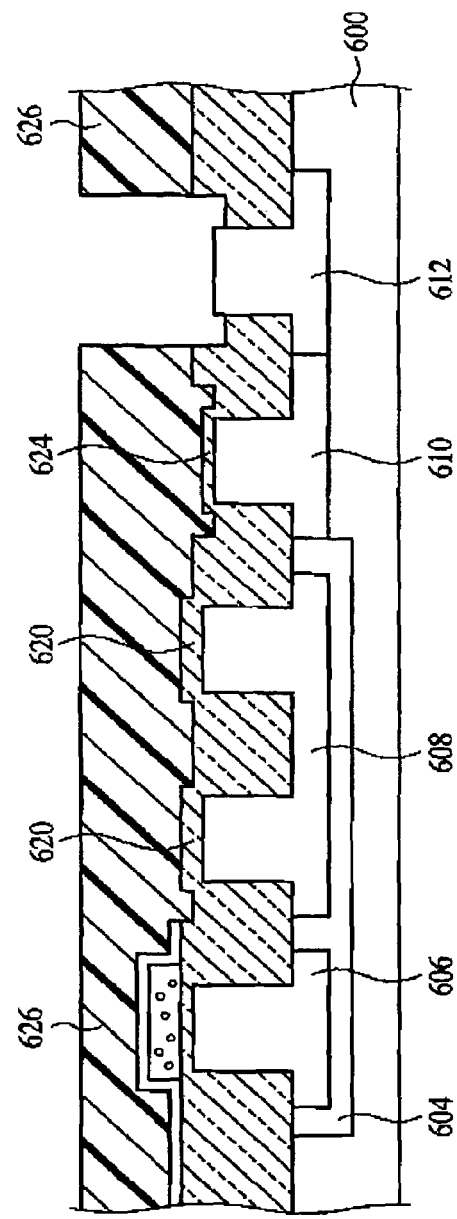
FIG. 25A
FIG. 25B

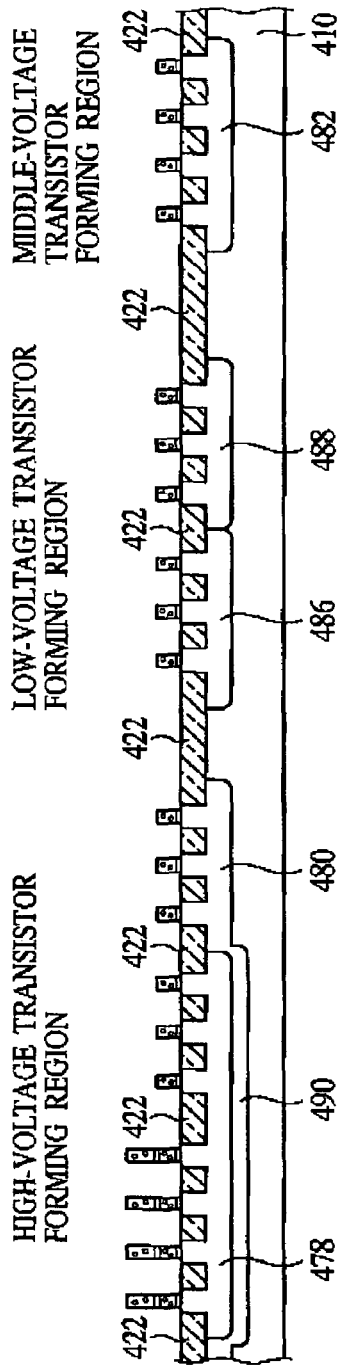
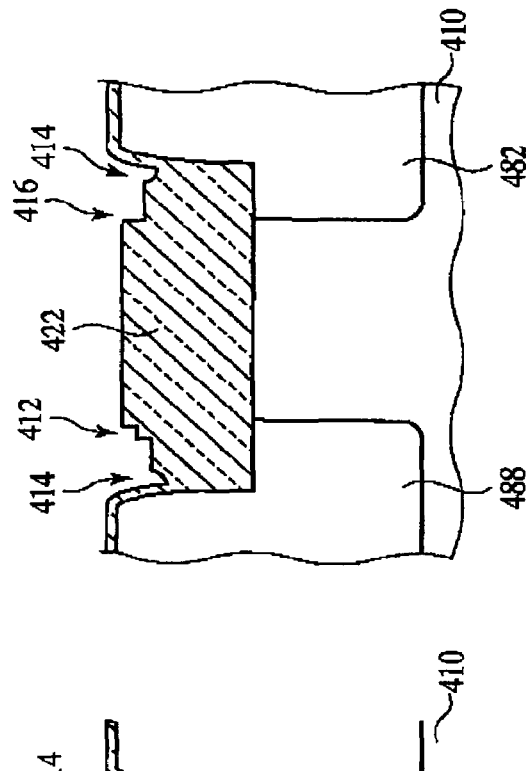
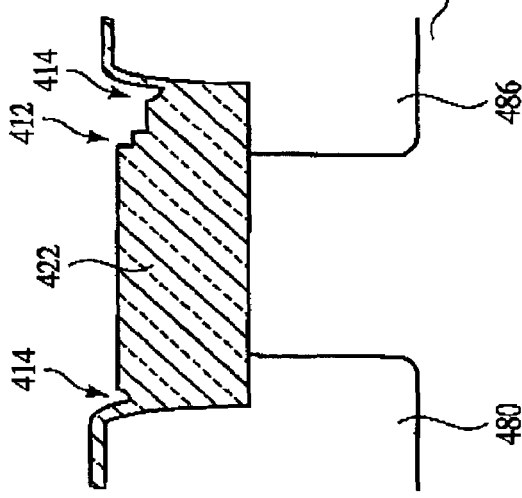

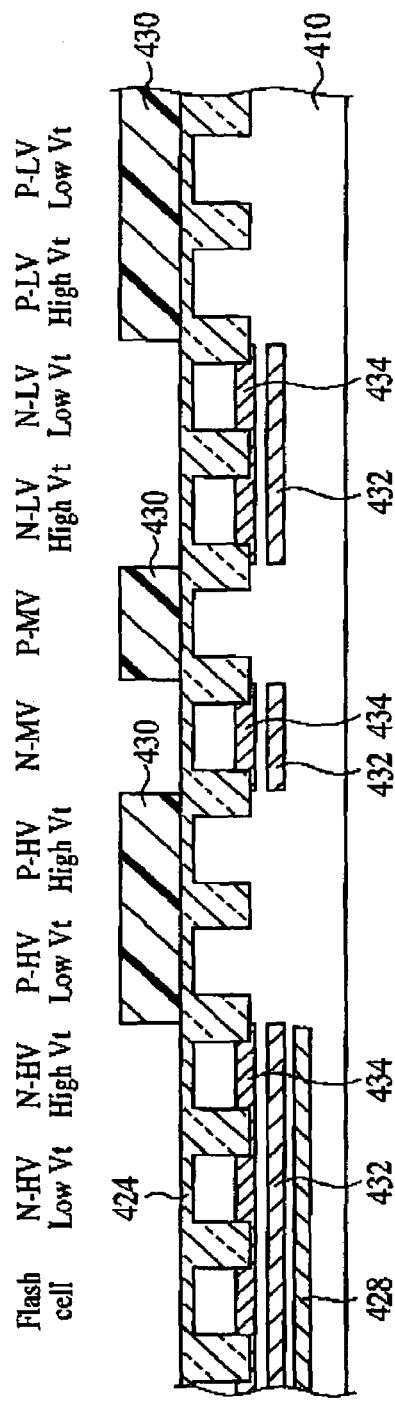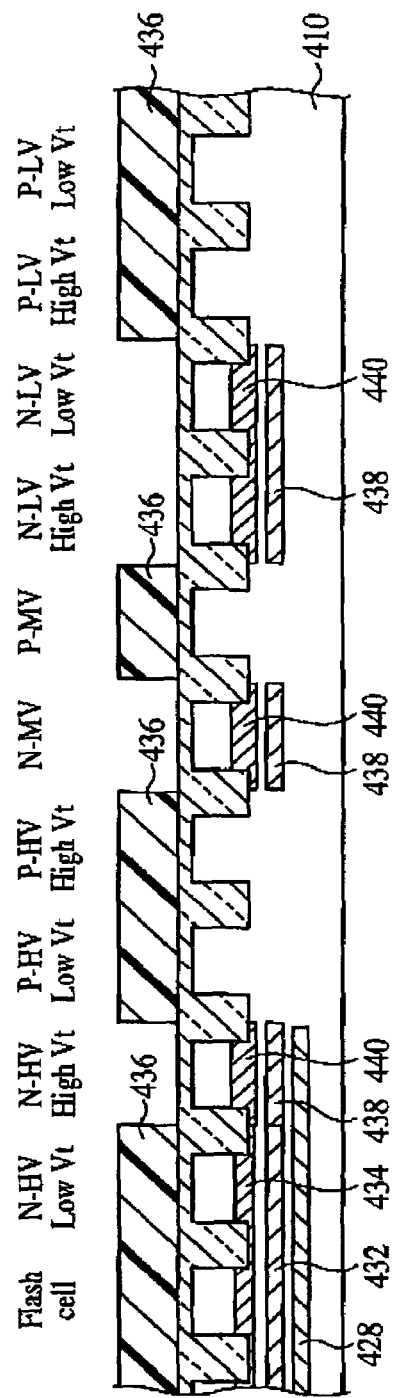
FIG. 31A
FIG. 31B

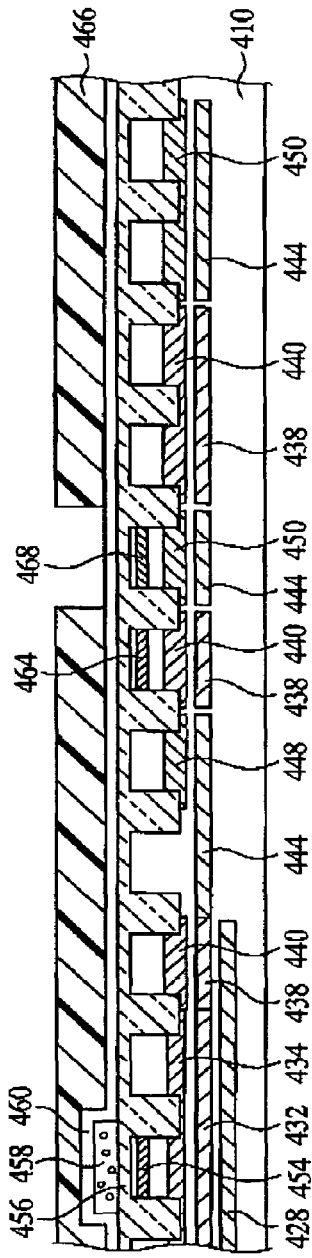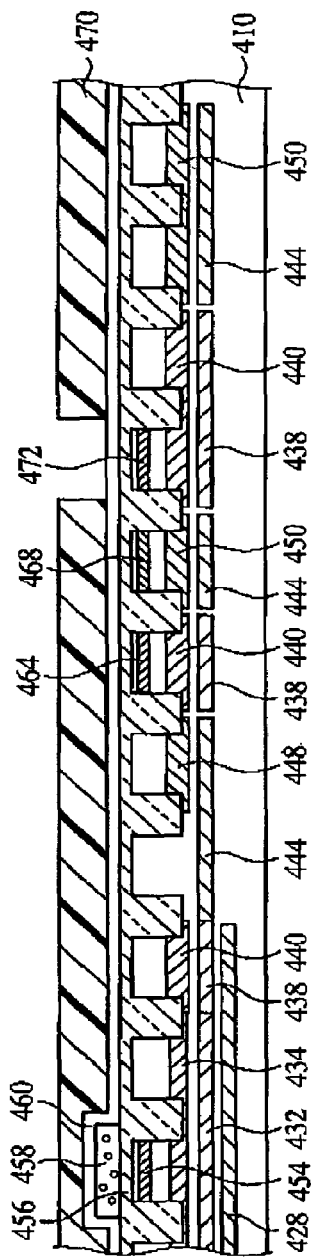

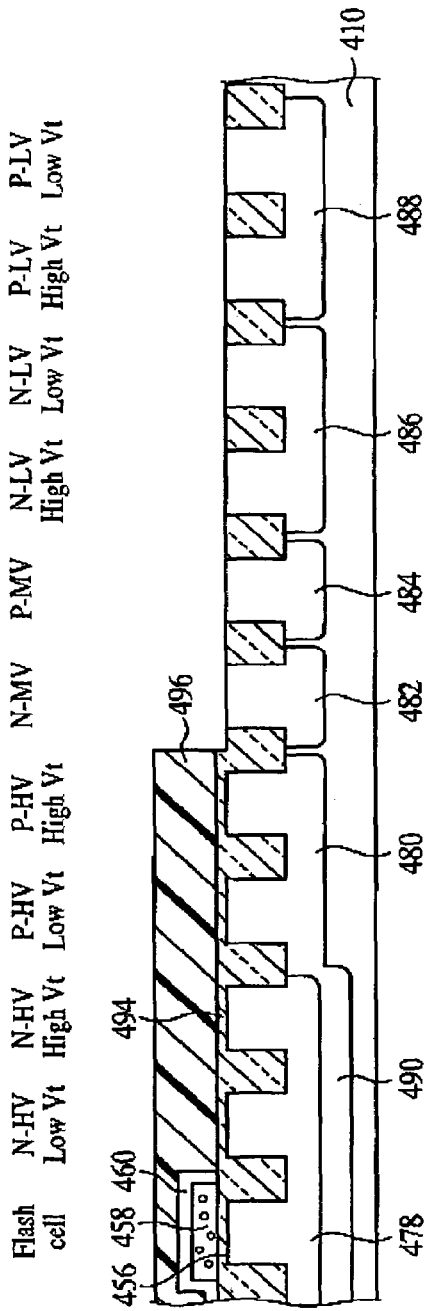
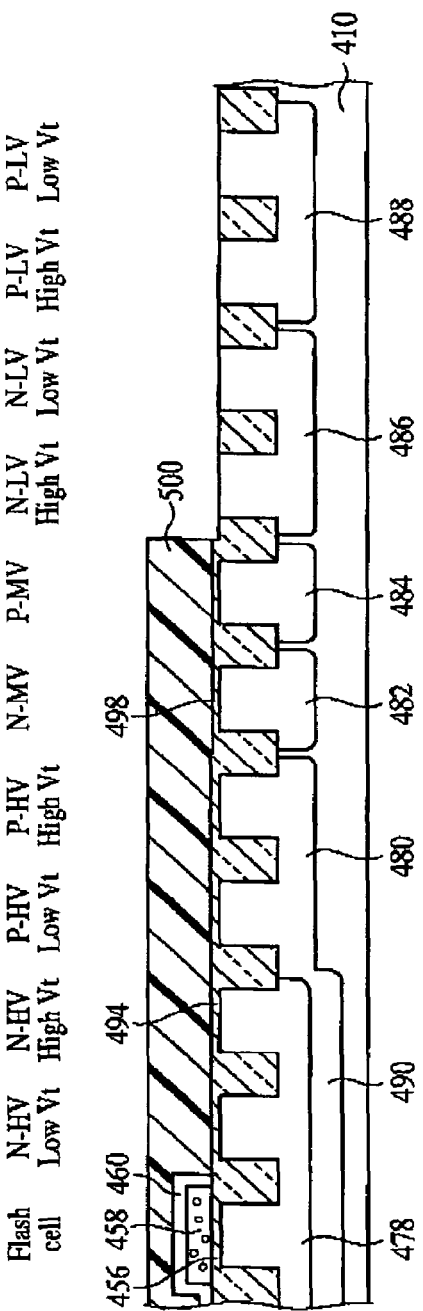
FIG. 37A
FIG. 37B

SEMICONDUCTOR DEVICE GROUP AND METHOD FOR FABRICATING THE SAME, AND SEMICONDUCTOR DEVICE AND METHOD FOR FABRICATING THE SAME

CROSS-REFERENCE TO RELATED APPLICATIONS

This application is based upon and claims the benefit of priority from the prior Japanese Patent Application No. 2003-364358, filed on Oct. 24, 2003 and the prior Japanese Patent Application No. 2003-377265, filed on Nov. 6, 2003, the entire contents of which are incorporated herein by reference.

BACKGROUND OF THE INVENTION

The present invention relates to a logic semiconductor device combined with a nonvolatile semiconductor memory and a method for fabricating the same; a semiconductor device group including a semiconductor device with no nonvolatile semiconductor memory and a semiconductor device combined with a nonvolatile semiconductor memory and a method for fabricating the same; and the semiconductor devices included by the semiconductor device group.

The logic semiconductor device combined with a nonvolatile semiconductor memory forms product fields, as of CPLD (Complex Programmable Logic Device) and FPGA (Field Programmable Gate Array), and because of their characteristic of programmability, so far have formed large markets because of their characteristic, programmability.

FPGA is basically formed of reconfigurable interconnections based on SRAM, etc. laid on a chip. Specific reconfigurable program data are stored in a flash memory (Flash EPROM), etc. which are formed on other chips, etc. Every time the source power is turned on, the data stored in the flash memory are transmitted to the FPGA chip for programming. This structure causes problems that the startup is slow upon the turn-on of the source power and that the program data can be read at the outside unpreferably for the security, and other problems.

In order to solve these problems, the FPGA chip combined with a flash memory, which can store program data is being developed. The steps of fabricating the FPGA chip combined with a flash memory are increased by a number of the steps of forming the flash memory in comparison with the steps of fabricating the usual FPGA chip. This causes a new problem of the fabrication cost increase.

In such background, the FPGA which requires high security will use a chip combined with a flash memory, and for the price of the chips rather than the security, the FPGA will use a chip of the logic circuits alone. Both FPGAs are different from each other in the chip structure but are basically the same in the function. Both are designed by using the same design macro. Efforts are made to make the characteristics of the transistors fabricated by the fabrication process combined with a flash memory and the characteristics of the transistors fabricated by the fabrication process combined with no flash memory as close as possible.

Reference 1 (Japanese published unexamined patent application No. 2001-196470) discloses a fabrication process in which wells, etc. for the transistors forming the main logic circuit are formed after the wells for forming the flash memory cells, the wells for the high-voltage transistors, the floating gates of the flash memory cells, etc. have been formed. The specific fabrication process of the flash memory is thus performed before the process for fabricating the transistors forming the logic circuit is performed, whereby the channel impurity distribution of the transistors forming the logic circuit can be made substantially the same as that of the logic circuit combined with no flash memory.

In the logic semiconductor device combined with a nonvolatile memory, in addition to a flash memory, high-voltage transistors for controlling the flash memory and low-voltage transistors of the high-performance logic circuit are integrated on one semiconductor chip. To this end, a plurality of kinds of gate insulating films having different thicknesses must be formed. A method for forming a plurality of kinds of gate insulating films of different thicknesses is described in, Reference 1, Reference 2 (Japanese published unexamined patent application No. Hei 11-317458), Reference 3 (Japanese published unexamined patent application No. Hei 10-199994), Reference 4 (Japanese published unexamined patent application No. 2002-368145), Reference 5 (Japanese published unexamined patent application No. 2000-315733), and Reference 6 (Japanese published unexamined patent application No. 2003-007863).

In the method described in Reference 2, a thick gate insulating film is grown on the entire surface, the thick insulating film in a region where a thin gate insulating film is to be formed is removed by photolithography, and the thin gate insulating film is grown.

The methods described in References 1, 3 and 4 each use the method described in Reference 2, and the step of removing the part of the thick gate insulating film and the step of forming wells are performed by using one mask, whereby the fabrication step number is decreased.

SUMMARY OF THE INVENTION

As described in Reference 7 ("130 nm Generation High Density ETOX Flash Memory Technology", IEDM 2001), for example, in combining a flash memory, a rounding amount of the upper ends of the active regions is preferably larger than a certain amount so as to ensure the reliability of the tunnel gate insulating film. In combining no flash memory, however, this is not necessary. With the roundness of the upper ends of the active regions varied, characteristics of especially transistors having a small channel width are varied.

In combining a flash memory, high-voltage transistors for controlling the flash memory cells are necessary. The high-voltage transistors, to which high voltages are applied, preferably have the gate insulating film which is thicker than the gate insulating film of the main logic transistors. Thus, in combining the flash memory, a larger number of gate insulating films must be formed.

The general method of forming a plurality of gate insulating films is described in, e.g., Reference 2. In the method of Reference 2, first, a thick gate insulating film is grown, the thick gate insulating film in the region for the thin gate insulating film to be formed in is removed, and then the thin gate insulating film is grown. Accordingly in combining the flash memory, the recess amount of the device isolation film in the region for the main logic transistor to be formed in is increased by a removed amount of the thick gate insulating film for the high-voltage transistors. When the recess amount of the device isolation film is larger, the side surfaces of the device isolation film, occupying in the narrow transistors are more influential, and the channel width dependency of the threshold voltage of the transistors changes.

As described above, characteristics required of the device isolation film largely differ between with a flash memory combined and with no flash memory combined, and it is very difficult to make the transistor characteristics of both, especially the narrow channel effect the same.

One method for solving such problem will be to establish a fabrication method in consideration of all characteristics to be satisfied for the process with combining a flash memory and the process with combining no flash memory. However, this method causes the following new problems.

Firstly, the process technology with combining a flash memory and the process technology with combining no flash memory must be concurrently developed. For example, the rounding amount of the upper edges of the active regions is optimized in view of characteristics of the flash memory cells and the main logic transistors. The process technology with combining the flash memory must be optimized in other points, which hinders the development of the process technology with combining no flash memory.

Secondly, in order to make the STI recess amount in the process with combining no flash memory the same as that in the process with combining a flash memory, the processing for removing the insulating film before the gate insulating film of the main logic transistors is formed must be excessively made. Then, the surface of the semiconductor substrate in the region of the main logic transistors, where the gate insulating film is to be formed is excessively exposed to the insulating film removing chemical liquid. The surface of the semiconductor substrate excessively exposed to the insulating film removing chemical liquid is made coarse and is more contaminated by the chemical liquid. The excessive exposure to the chemical liquid can be prevented by a thick insulating film formed in advance in the region of the main logic transistors, where the gate insulating film is to be formed. However, the steps which are unnecessary for the fabrication of the semiconductor device with no flash memory combined are added, and the fabrication cost of the semiconductor device with no flash memory combined is increased. It will be also considered to improve the purity, etc. of the chemical liquid. However, to improve the purity of the chemical liquid increases the cost, and resultantly, the fabrication cost of the semiconductor device with no flash memory combined is increased.

In another method for solving the problems, as described in, e.g., Reference 8 (Japanese published unexamined patent application No. 2000-269450), Reference 9 (Japanese published unexamined patent application No. 2000-315738), Reference 10 (Japanese published unexamined patent application No. 2001-015618), and Reference 10 (Japanese published unexamined patent application No. 2001-068652), the device isolation structure is changed between the flash memory unit and the main logic unit suitably to agree with the respective characteristics, and furthermore, as described in, e.g., Reference 6, the sink of the device isolation film could be suppressed. However, this method increases the fabrication step number of the semiconductor device with the flash memory combined.

In References 1, 3 and 4, the gate insulating film removing steps and the well forming steps are rationalized, and resultantly, steps are formed on the surface of the device isolation film in parts corresponding to the respective bordering edges of n-wells and p-wells neighboring each other. When the method described in References 1, 3 and 4 is applied, the steps formed in the surface of the device isolation film cause the following new problem.

It is supposed that the p-well is firstly formed and then the n-well is formed.

When a photoresist film 706 covering a region where an n-well is to be formed in is formed over a silicon substrate 700 with a device isolation film 702 and a silicon oxide film 704 formed on, the p-well 708 is formed, and the silicon oxide film 704 in the region where the p-well 708 is formed in is removed, the device isolation film 702 in the region where the photoresist film 706 is absent is etched by an etched amount of the silicon oxide film 704. Thus, the step 710 is formed on the device isolation film 702 (FIG. 48A).

Then, a photoresist film 712 covering the region where the p-well 708 is formed in is formed, the n-well 714 is formed, and the silicon oxide film 704 in the region where the n-well 714 is formed in is removed, the device isolation film 702 in the region where the photoresist film 712 is absent is etched by an etched amount of the silicon oxide film 704.

The step on the device isolation film 702 formed by the twice etching is changed due to a misalignment between the photoresist film 706 and the photoresist film 712. That is, when a misalignment takes place between the photoresist film 706 and the photoresist film 712, in the part which has been covered by both the photoresist film 706 and the photoresist film 712, a convexity 716 is formed (see FIG. 48B), and a concavity 718 is formed in the part which has been covered by neither of the photoresist film 706 and the photoresist film 712 (see FIG. 48C). When the convexity 716 is formed on the device isolation film 702, the planarity of the elements to be formed thereon is affected. On the other hand, when the concavity 718 is formed on the device isolation film 702, the polycrystalline silicon film for the gate electrodes is buried in the concavity, remaining as a residue, and short-circuit takes place between the gate electrodes.

To prevent the generation of the concavity it is effective to make the distance between both masks large. Otherwise, the distance between the polycrystalline silicon interconnections is made large, or the polycrystalline silicon interconnections are not arranged near the concavities and the convexities, whereby the short-circuit due to the residue can be prevented.

However, the downsizing of elements makes the distance between the n-well and the p-well for the low-voltage transistors very small. The polycrystalline silicon film forming the gate electrodes is co-used, in very many cases, by NMOS and PMOS, and their polycrystalline silicon interconnections are formed by closest packing. Accordingly, when the distance between both masks is made large, resultantly the gap between the n-well and the p-well is made large, which is unsuitable to the downsizing and similarly unsuitable to contrive the polycrystalline silicon interconnections.

In forming gate insulating films having different film thicknesses as well as in using the method described in Reference 3, the same concavity or convexity is formed on the device isolation film, and the same problem of the residue as described above takes place.

As described above, the patterns of the masks used in growing a plurality of kinds of gate insulating films much influences the device characteristics and yields. However, specific patterns of such masks have not been sufficiently studied by anyone including References 1 to 6 described above.

An object of the present invention is to provide a semiconductor device group which allows the process technology with combining no nonvolatile memory to be developed with priority, permits a design macro which is common between a semiconductor device with no nonvolatile memory combined and a semiconductor device with a nonvolatile memory combined to be used, has high reliability of the tunnel gate insulating film of the semiconductor device with the nonvolatile memory combined, and permits high-voltage transistors having a thick gate insulating film to be easily added, and a method for fabricating the semiconductor device group.

Another object of the present invention is to provide a semiconductor device included in the semiconductor group described above.

Further another object of the present invention is to provide a semiconductor device and a method for fabricating the semiconductor device which can solve by simple methods various problems, as of generating the residue due to steps formed on the surface of the device isolation film, which are involved in etching the device isolation film for forming a plurality of kinds of gate insulating films.

According to one aspect of the present invention, there is provided a semiconductor device group comprising: a first semiconductor device including a first design macro and a nonvolatile memory, and a second semiconductor device including a second design macro having the identity with the first design macro and including no nonvolatile memory, the first design macro including a first active region and a first device isolation region formed on a first semiconductor substrate, the second design macro including a second active region and a second device isolation region formed on a second semiconductor substrate, a curvature radius of an upper end of the first active region in a cross section being larger than a curvature radius of an upper end of the second active region in a cross section, and a difference in height between a surface of the first active region and a surface of the first device isolation region being larger than a difference in height between a surface of the second active region and a surface of the second device isolation region.

According to another aspect of the present invention, there is provided a semiconductor device comprising: a first design macro including a first active region and a first device isolation region formed on a semiconductor substrate; and a nonvolatile memory, the semiconductor device constituting a semiconductor device group together with another semiconductor device which comprises a second design macro including a second active region and a second device isolation region formed on another semiconductor substrate and having identity with the first design macro and comprises no nonvolatile memory, a curvature radius of an upper end of the first active region in a cross section being larger than a curvature radius of an upper end of the second active region in a cross section, and a difference in height between a surface of the first active region and a surface of the first device isolation region being larger than a difference in height between a surface of the second active region and a surface of the second device isolation region.

According to further another aspect of the present invention, there is provided a semiconductor device comprising: a first design macro including a first active region and a first device isolation region formed on a semiconductor substrate; and including no nonvolatile memory, the semiconductor device constituting a semiconductor device group together with another semiconductor device which comprises a second design macro including a second active region and a second device isolation region formed on another semiconductor substrate and having identity with the first design macro and comprises a nonvolatile memory, a curvature radius of an upper end of the first active region in a cross section being smaller than a curvature radius of an upper end of the second active region in a cross section, and a difference in height between a surface of the first active region and a surface of the first device isolation region being smaller than a difference in height between a surface of the second active region and a surface of the second device isolation region.

According to further another aspect of the present invention, there is provided a method for fabricating a semiconductor device group comprising: a first semiconductor device including a first design macro and a nonvolatile memory; and a second semiconductor device including a second design macro having identity with the first design macro and including no nonvolatile memory, the first semiconductor device being fabricated by a semiconductor fabricating method comprising the steps of: forming a first trench in a first semiconductor substrate; oxidizing the first semiconductor substrate to round an upper edge of the first trench: burying a first insulating material in the first trench; and removing a part of the first insulating material buried in the first trench to from a first recessed region on a surface thereof, the second semiconductor device being fabricated by a semiconductor fabricating method comprising the steps of: forming a second trench in the second semiconductor substrate; oxidizing the second semiconductor substrate to round an upper edge of the second trench; burying a second insulating material in the second trench; and removing a part of the second insulating material buried in the second trench to form a second recessed region on a surface thereof, in the step of rounding the upper edge of the first trench and the step of rounding the upper edge of the second trench, a curvature radius of the upper edge of the first trench being larger than a curvature radius of the upper edge of the second trench, and in the step of forming the first recessed region and the step of forming the second recessed region, a recess amount of the first recessed region being larger than a recess amount of the second recessed region.

According to further another aspect of the present invention, there is provided a semiconductor device comprising: a first well formed in a first region of a semiconductor substrate; a second well formed in a second region of the semiconductor substrate; a device isolation film for defining an active region in the first region and an active region in the second region, the device isolation film having a first step formed on a part corresponding to a bordering edge of the first well; a first gate insulating film formed on the active region in the first region; and a second gate insulating film formed on the active region in the second region and being thicker than the first gate insulating film.

According to further another aspect of the present invention, there is provided a semiconductor device comprising: a first well formed in a first region of a semiconductor substrate; a second well formed in a second region of the semiconductor substrate; a device isolation film for defining an active region in the first region and an active region in the second region, the device isolation film having a first step formed on a part corresponding to a bordering edge of the second well; a first gate insulating film formed in the active region in the first region; and a second gate insulating film formed in the active region in the second region and being thicker than the first gate insulating film.

According to further another aspect of the present invention, there is provided a method for fabricating a semiconductor device comprising the steps of: forming a first well in a first region of a semiconductor substrate by using a first mask based on a first mask data; forming a second well in a second region of the semiconductor substrate by using a second mask based on a second mask data; growing a first insulating film on the semiconductor substrate; removing the first insulating film formed in the first region by using a third mask based on the first mask data; and growing a second insulating film on the semiconductor substrate and on the first insulating film to thereby form a first gate insulating film in the first region and a second gate insulating film thicker than the first gate insulating film in the second region.

According to further another aspect of the present invention, there is provided a method for fabricating a semiconductor device comprising the steps of: forming a first well in a first region of a semiconductor substrate by using a first mask based on a first mask data; forming a second well in a second region of the semiconductor substrate by using a second mask based on a second mask data; forming a third well in a third region of the semiconductor substrate by using a third mask based on a third mask data; growing a first insulating film on the semiconductor substrate; removing the first insulating film formed in the first region and the second region by using a fourth mask based on the first mask data and the second mask data; growing a second insulating film on the semiconductor substrate and the first insulating film; removing the second insulating film formed in the first region by using a fifth mask based on the first mask data; and growing a third insulating film on the semiconductor substrate and the second insulating film to thereby form a first gate insulating film in the first region, a second gate insulating film thicker than the first gate insulating film in the second region and a third gate insulating film thicker than the second insulating film in the third region.

According to further another aspect of the present invention, there is provided a method for fabricating a semiconductor device comprising the steps of: forming a first well in a first region of a semiconductor substrate by using a first mask based on a first mask data; forming a second well in a second region of the semiconductor substrate by using a second mask based on a second mask data; growing a first insulating film on the semiconductor substrate; removing the first insulating film formed in a region other than the second region by using a third mask based on a third mask data prepared by reversing the second mask data; growing a second insulating film on the semiconductor substrate and the first insulating film to thereby form a first gate insulating film on the first region and a second gate insulating film thicker than the first gate insulating film in the second region.

According to further another aspect of the present invention, there is provided a method for fabricating a semiconductor device comprising the steps of: forming a first well in a first region of a semiconductor substrate by using a first mask based on a first mask data; forming a second well in a second region of the semiconductor substrate by using a second mask based on a second mask data; forming a third well in a third region of the semiconductor substrate by using a third mask based on a third mask data; growing a first insulating film on the semiconductor substrate; removing the first insulating film formed in a region other than the third region by using a fourth mask based on a fourth mask data prepared by reversing the third mask data; growing a second insulating film on the semiconductor substrate and the first insulating film; removing the second insulating film formed in a region other than the second region and the third region by using a fifth mask based on the fourth mask data and a fifth mask data prepared by reversing the second mask data; and growing a third insulating film on the semiconductor substrate and the second insulating film to thereby form a first gate insulating film in the first region, a second gate insulating film thicker than the first gate insulating film in the second region, and a third gate insulating film thicker than the second insulating film in the third region.

According to the present invention, the difference of the STI recess amount between the semiconductor device with no volatile memory combined and the semiconductor device with a nonvolatile memory combined is taken-into consideration, and based on the difference, the curvature radiuses of the upper ends of the active regions of the semiconductor device with no nonvolatile memory combined and the semiconductor device with the nonvolatile memory combined are respectively controlled, whereby device characteristic difference variations due to the STI recess amount increase is compensated by increasing the curvature radius of the upper end of the active region, and accordingly one common design macro is applicable to the semiconductor device with no nonvolatile memory combined and the semiconductor device with the nonvolatile memory combined.

This permits the process technology with combining no nonvolatile memory to be developed with priority. Increasing the curvature radius of the upper edge of the active region can improve the reliability of the tunnel gate insulating film of the nonvolatile memory. Allowing the increase of the recess amount facilitates additionally forming tunnel gate insulating films and gate insulating films for high-voltage transistors.

The etching masks used in forming gate insulating films of different film thicknesses are formed based on the mask data of wells, whereby the active region and the device isolation film in the region where the thick gate insulating film is formed can be protected by the mask without failure. Accordingly, even when the width of the device isolation region is wide, the problem that the device isolation film in the region where high voltage is to be applied is thinned does not take place. Thus, even when the device isolation film is formed concurrently in the high-voltage region and in the low-voltage region, the device isolation film in the high-voltage region is retained thick, and the threshold voltage of the field parasitic transistors can be retained high. The device isolation film is concurrently formed, which never adds to the fabrication cost.

The step formed on the device isolation film in forming the gate insulating films of different film thicknesses are formed in parts corresponding to the well bordering edges, sufficiently spaced form the edges of the active regions. Accordingly, no fine cavities are formed between the device isolation film and the active region, and accordingly, the generation of residues in the cavities on the device isolation film can be prevented.

The etching masks used in forming the gate insulating films of different film thicknesses are formed based on mask data of the wells, and it is not necessary to prepare new data for forming the masks.

BRIEF DESCRIPTION OF THE DRAWINGS

FIGS. 5A-5D, 6A-6D, 7A-7B, 8A-8B, 9A-9B, 10A-10B, 11A-11B, 12A-12B, 13A-13B, 14A-14B, 15A-15B, 16A-16B, 17A-17B, 18A-18B, 19A-19B, 20A-20B, and 21 are sectional views of the semiconductor device in the steps of the method for fabricating the semiconductor device group according to the first embodiment of the present invention, which show the method.

FIGS. 22A-22B, 23A-23B, and 24A-24B are sectional views of the semiconductor device in the steps of the first semiconductor fabrication method, which show the method.

FIGS. 25A-25B are sectional views of the semiconductor device in the steps of the second semiconductor fabrication method, which show the method.

FIGS. 28 and 29A-29C are diagrammatic sectional views of the semiconductor device according to the second embodiment of the present invention, which show the structure thereof.

FIGS. 30A-30B, 31A-31B, 32A-32B, 33A-33B, 34A-34B, 35A-35B, 36A-36B, 37A-37B, 38A-38B, 39A-39B, 40A-40B, 41A-41B, 42A-42B, 43A-43B, 44, and 45A-45C are sectional views of the semiconductor device according to the second embodiment of the present invention in the steps of the method for fabricating the same, which show the method.

DETAILED DESCRIPTION OF THE INVENTION

A FIRST EMBODIMENT

The semiconductor device group according to a first embodiment of the present invention and the method for fabricating the same will be explained with reference to FIGS. 1A to 21.

Figure 1A:
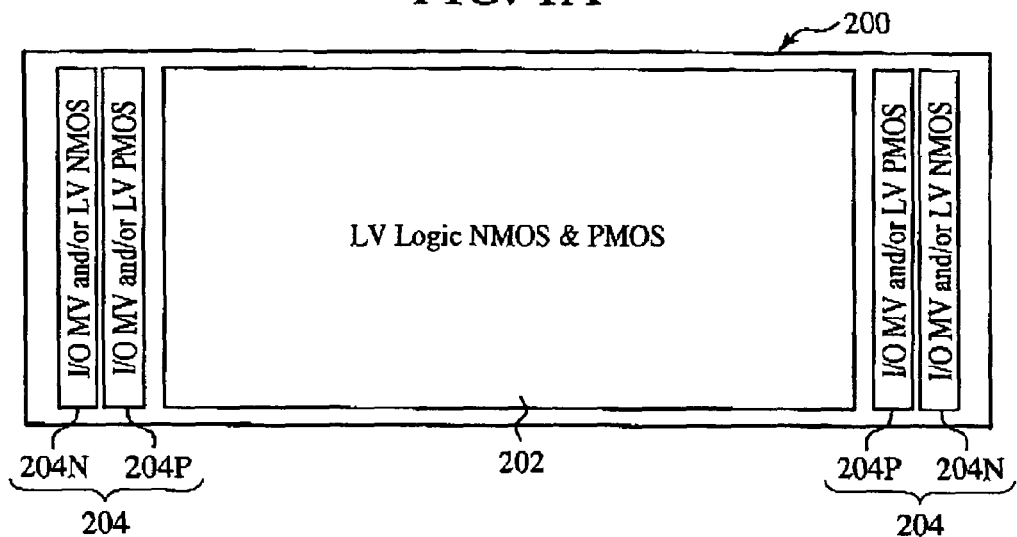
FIGS. 1A and 1B are plan views of the semiconductor device group according to a first embodiment of the present invention, which show a structure thereof.
Figure 1B:
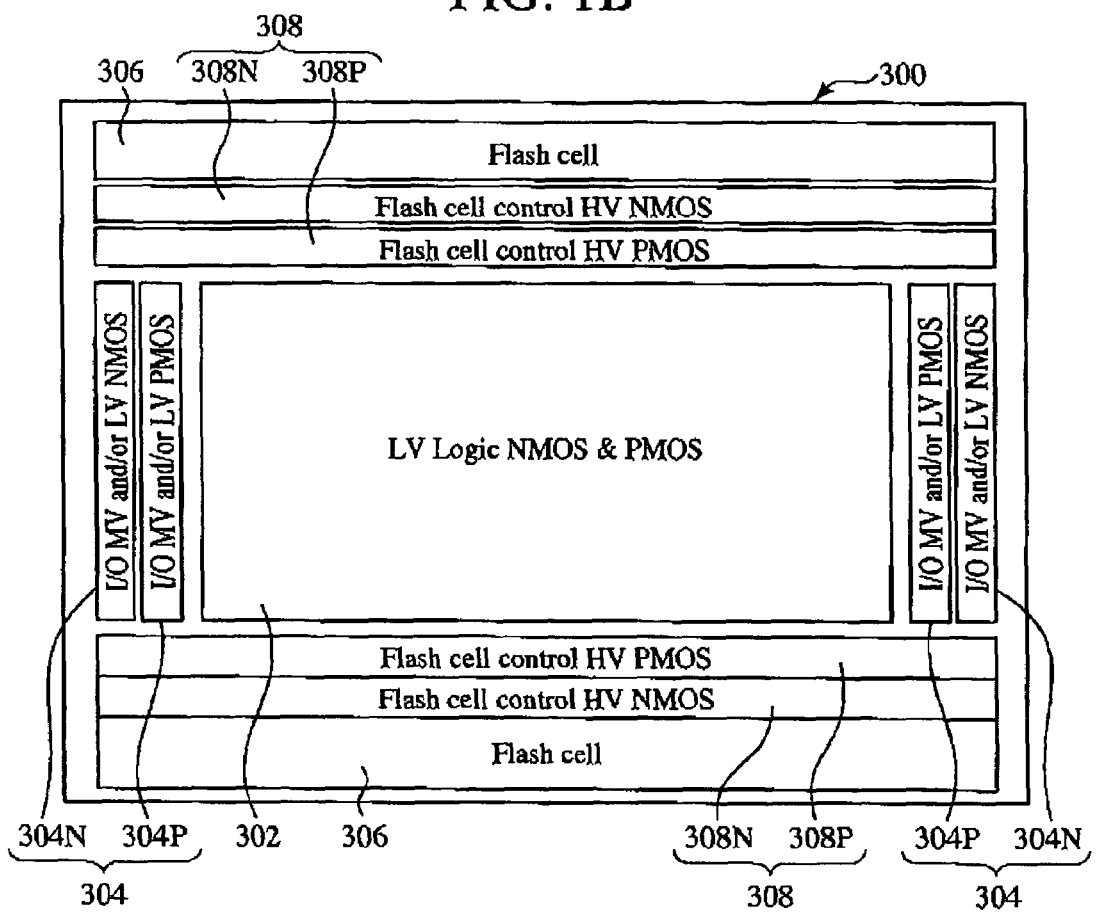

FIGS. 1A and 1B are plan views of the semiconductor device group according to the present embodiment, which show a structure thereof. FIGS. 2A-3B are diagrammatic sectional views of the semiconductor device group according to the present embodiment, which show the structure thereof. FIG. 4 is a graph of the threshold voltage dependency of the logic transistors on the curvature radius of the upper edge of the active region and the STI recess amount. FIGS. 5A to 21 are sectional views of the semiconductor device in the steps of the method for fabricating the semiconductor device group according to the present embodiment, which show the method.

Figure 2A:
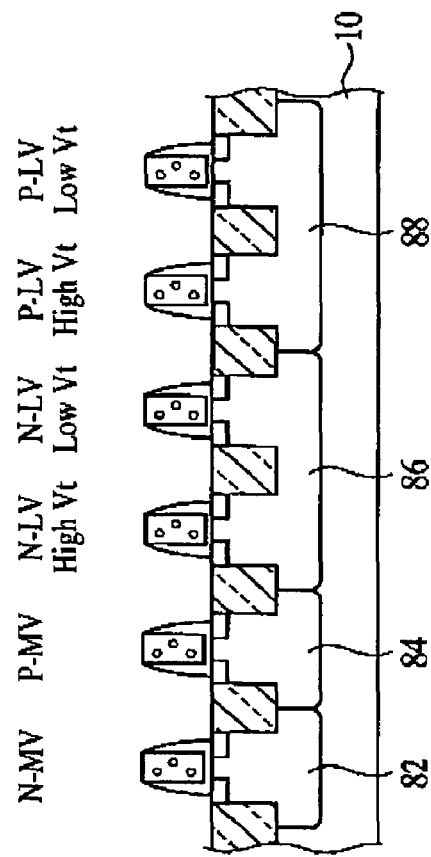
FIGS. 2A-2B and 3A-3B are diagrammatic sectional views of the semiconductor device group according to the first embodiment of the present invention, which show the structure thereof.
Figure 2B:
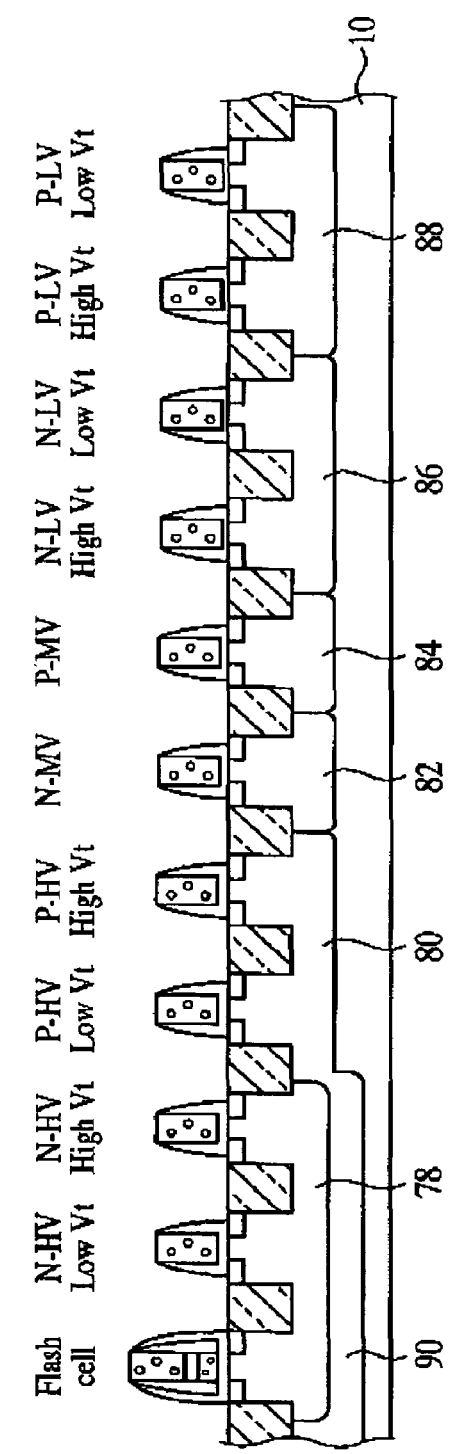

First, the semiconductor device group according to the present embodiment will be explained with reference to FIGS. 1A to 4B. FIG. 1A is a conceptual view of a chip of the semiconductor device with no flash memory cells combined. FIG. 1B is a conceptual view of a chip of the semiconductor device with flash memory cells combined. FIG. 2A is a diagrammatic sectional view of 6 kinds of transistors used in the semiconductor device with no flash memory cells combined. FIG. 2B is a diagrammatic sectional view of 11 kinds of transistors used in the semiconductor device with the flash memory cells combined.

The semiconductor device group according to the present embodiment includes a semiconductor device with no flash memory cells combined, and a semiconductor device with flash memory cells combined, and is characterized mainly in that the main logic circuit unit of the semiconductor device with no flash memory cells combined, and the main logic circuit unit of the semiconductor device with flash memory cells combined are formed by common design macros.

The design macro is a functional block for making specific processing, which contains information of a prescribed circuit, a pattern layout, etc. and is called also IP (Intellectual Property) macro. Design macros are combined to make a circuit design to thereby lower the design cost. Design macros which even contain the same circuit and layout often do not make prescribed operations if the characteristics of the transistors contained, the resistance, etc. are different from each other. Accordingly, when one design macro is used for different semiconductor devices, the characteristics of the transistors contained in the design macro must be made as close as possible.

As shown in FIG. 1A, the semiconductor device 200 with no flash memory combined includes a main logic circuit unit 202 and input/output circuit units 204. The input/output circuit units 204 each include a PMOS unit 204P and an NMOS unit 204N.

As shown in FIG. 2A, the semiconductor device with no flash memory combined includes an n-channel middle-voltage transistor (N-MV) formed in a p-well 82, a p-channel middle-voltage transistor (P-MV) formed in an n-well 84, an n-channel low-voltage/high-threshold voltage transistor (N-LV High Vt) and an n-channel low-voltage/low-threshold voltage transistor (N-LV Low Vt) formed in a p-well 86, and a p-channel low-voltage/high-threshold voltage transistor (P-LV High Vt) and a p-channel low-voltage/low-threshold voltage transistor (P-LV Low Vt) formed in an n-well 88.

The n-channel middle-voltage transistor (N-MV) and the p-channel middle-voltage transistor (P-MV) are transistors forming the input/output circuit units 204 and 2.5 V operative transistors, 3.3 V operative transistors or others. Although the 2.5 V operative transistor and the 3.3 operative transistor are different from each other in the gate insulating film thickness, threshold voltage control conditions, and LDD conditions, it is not necessary to mount both in the units, and only either of them is mounted.

The n-channel low-voltage/high-threshold voltage transistor (N-LV High Vt), the n-channel low-voltage/low-threshold voltage transistor (N-LV Low Vt), the p-channel low-voltage/high-threshold voltage transistor (P-LV High Vt), the p-channel low-voltage/low-threshold voltage transistor (P-LV Low Vt) form the main logic circuit unit 202. These transistors use ultra thin gate insulating film for the higher performance of the main logic circuit unit 202.

As shown in FIG. 1B, the semiconductor device 300 with a flash memory combined includes, in addition to a main logic circuit unit 302 and input/output circuit units 304, as does the semiconductor device with no flash memory combined, flash memory cell units 306 and flash memory cell control circuit units 308. The flash memory cell control circuit units 308 each include a PMOS unit 308P and an NMOS unit 308N.

The semiconductor device with the flash memory combined includes, in addition to the 6 kinds of transistors of the semiconductor device with no flash memory combined, a flash memory cell (Flash cell), an n-channel high-voltage/low-threshold voltage transistor (N-HV Low Vt) and an n-channel high-voltage/high-threshold voltage transistor (N-HV High Vt) formed in a p-well 78 in an n-well 90, a p-channel high-voltage/low-threshold voltage transistor (P-HV Low. Vt) and a p-channel high-voltage/low-threshold voltage transistor (P-HV High Vt) formed in an n-well 80.

The flash memory cell (Flash cell) is a flash EPROM having the stack gate structure and stores prescribed information in the floating gate as charges. The film thickness of the tunnel gate insulating film is independently decided corresponding to the charge retention characteristics, lifetime of the tunnel gate insulating film, etc.

The n-channel high-voltage/low-threshold voltage transistor (N-HV Low Vt), the n-channel high-voltage/high-threshold voltage transistor (N-HV High Vt), the p-channel high-voltage/low-threshold voltage transistor (P-HV Low Vt) and the p-channel high-voltage/high-threshold voltage transistor (P-HV High Vt) are the transistors forming the flash memory cell control circuit units 308. They are high-voltage transistors to which a 5 V-voltage is applied upon reading from the flash memory cells, and to which a 10 V to a little lower than 10 V-voltage is applied upon writing in or erasing from the flash memory. The flash memory cell control circuit units 308, which require such high voltages, have the gate insulating film thickened.

As described above, the semiconductor device with no flash memory combined and the semiconductor device with the flash memory combined are largely different in the kinds of the transistors. Accordingly, the main logic circuit unit of the semiconductor device with the flash memory combined and the main logic circuit of the semiconductor device with no flash memory combined cannot be designed on common design macros simply by adding the specific process of the semiconductor device with the flash memory combined to the fabrication process of the semiconductor device with no flash memory combined.

Then, in the semiconductor device group according to the present embodiment, conditions for forming the device isolation film are suitable controlled so that the difference between the characteristics of the transistors forming the main logic circuit unit 202 of the semiconductor device with no flash memory combined and the characteristics of the transistors forming the main logic circuit unit 302 of the semiconductor device with the flash memory combined is minimized, whereby common design macros can be used.

Figure 3A:
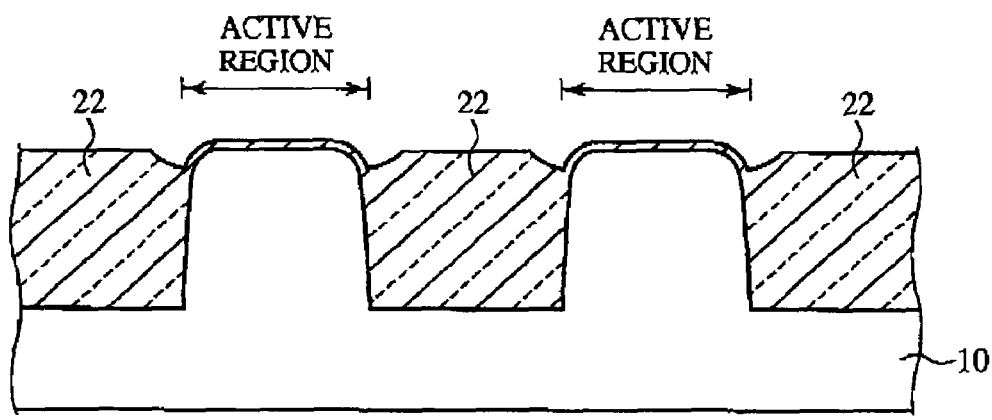
Figure 3B:
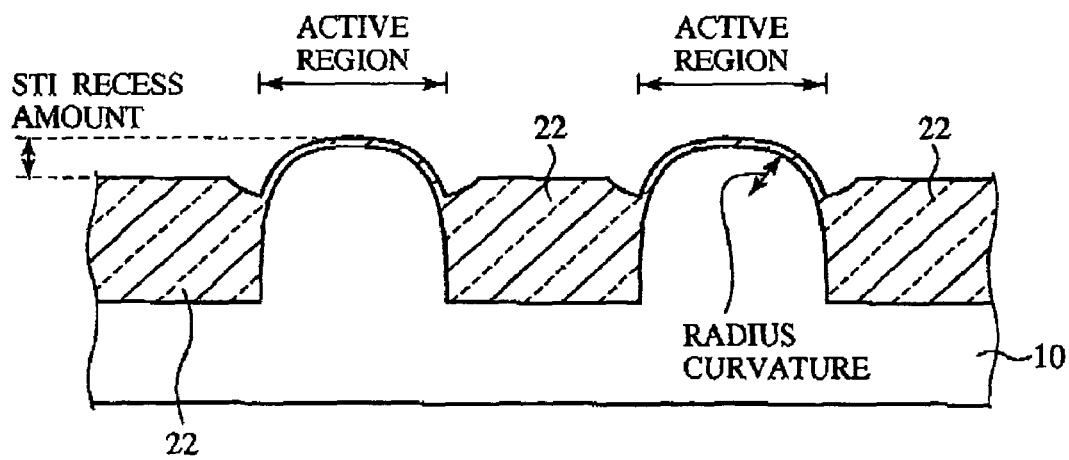
Figure 4:
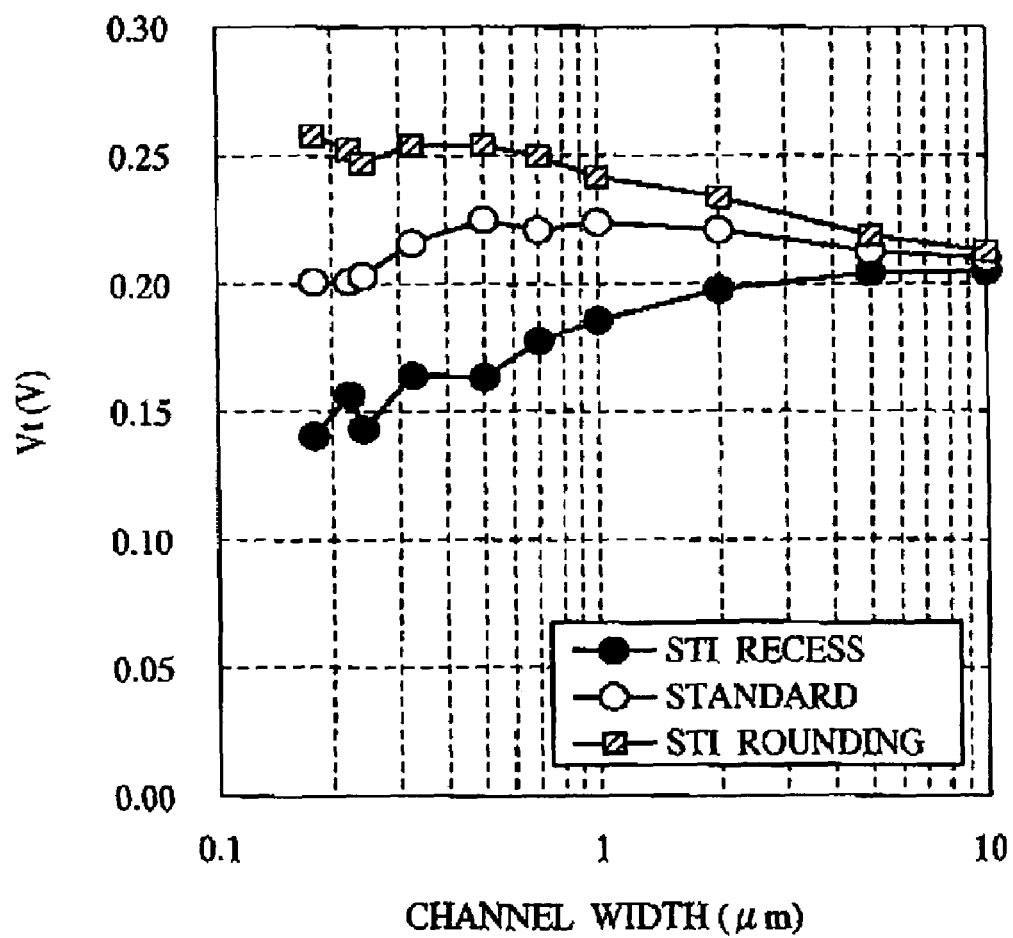
FIG. 4 is a graph of dependency of the threshold voltage of the logic transistor on the curvature radius of the upper end of the active-region and the STI recess amount.

To be specific, a device isolation film 22 formed in a silicon substrate 10 by STI method has an about 10-20 nm curvature radius at the upper end of an active region and has a 10-40 nm STI recess amount in the semiconductor device with no flash memory combined (see FIG. 3A) and, in the semiconductor device with the flash memory combined, has an about 30-60 nm curvature radius and a 40-80 nm STI recess amount, whose values are set larger than the values of the semiconductor device with no flash memory cell combined (see FIG. 3B). Here, the curvature radius of the upper end of the active region is a curvature radius of the surface edge of the active region as viewed in section, and the STI recess amount (or a sink amount) is a physical amount of a difference between the surface of the active region and the surface of the device isolation region (see FIG. 3B).

In FIG. 4, the threshold voltage dependency of the logic transistor on the channel width is plotted for the case that the usual STI forming condition for the logic semiconductor device with no flash memory combined that are the standard condition (indicated by the ○ marks), the case that the recess (sink) amount of the STI buried oxide film is increased (indicated by the ● marks) and the case that the curvature radius of the upper end of the active region is increased (indicated by the ■ marks).

As shown, when the STI recess amount is increased, the threshold voltage is much decreased as the channel width is decreased; the so-called reverse narrow channel effect is conspicuous. In contrast to this, when the curvature radius of the upper end of the active region is increased, the threshold voltage is increased as the channel width is decreased; the so-called narrow channel effect is conspicuous. Accordingly, the curvature radius of the upper end of the active region is increased, and the STI recess amount is increased, whereby both nullify each other, and the channel width dependency which is approximate to that given under the standard condition can be obtained.

That is, the curvature radius and the recess amount of the upper end of the active region of the semiconductor device with the flash memory combined are set larger than those of the semiconductor device with no flash memory combined, whereby the transistor characteristics of both semiconductor devices can be made very close to each other.

Furthermore, as described in, e.g., Reference 7, larger curvature radius of the upper edge of the active region produces the effect of improving the reliability of the tunnel gate insulating film of the flash memory cells. If the recess amount is permitted to increase, then a tunnel gate insulating film and the gate insulating film of the high-voltage transistors can be easily additionally formed.

Thus, the curvature radius of the upper end of the active region and the recess amount are suitably controlled, whereby the coincidence of the transistor characteristics, the reliability of the tunnel gate insulating film, the addition of a thick gate insulating film, and the priority to the development of the process technology without combining the flash memory can be achieved.

Next, the method for fabricating the semiconductor device group according to the present embodiment will be explained with reference to FIGS. 5A to 21.

FIGS. 5A-5D are sectional views of the semiconductor device in the steps of the method for forming the device isolation film of the semiconductor device with no flash memory combined, which show the method. FIGS. 6A-6D are sectional views of the semiconductor device in the steps of the method for forming the device isolation film of the semiconductor device with the flash memory combined, which show the method. FIGS. 7A to 21 are sectional views of the semiconductor device in the steps of the method for fabricating both the semiconductor devices, which collectively show the method.

In the following description, the wording, "the n-channel transistors" includes the n-channel high-voltage/high-threshold voltage transistor (N-HV High Vt), the n-channel high-voltage/low-threshold voltage transistor (N-HV Low Vt), the n-channel middle-voltage transistor (N-MV), the n-channel low-voltage/high-threshold voltage transistor (N-LV High Vt) and the n-channel low-voltage/low-threshold voltage transistor (N-LV Low Vt). The wording, "the p-channel transistors" includes the p-channel high-voltage/high-threshold voltage transistor (P-HV High Vt), the p-channel high-voltage/low-threshold voltage (P-HV Low Vt), the p-channel middle-voltage transistor (P-MV), the p-channel low-voltage/high-threshold voltage transistor (P-LV High Vt) and the p-channel low-voltage/low-threshold voltage transistor (P-LV Low Vt). The wording, "the n-channel transistors" includes the flash memory cell (Flash cell) in some cases.

The wording, "the high-voltage transistors" includes the n-channel high-voltage/low-threshold voltage transistor (N-HV Low Vt), the n-channel high-voltage/high-threshold voltage transistor (N-HV High Vt), the p-channel high-voltage/low-threshold voltage transistor (P-HV Low Vt) and the p-channel high-voltage/high-threshold voltage transistor (P-HV High Vt). The wording, "the middle-voltage transistors" includes the n-channel middle-voltage transistor (N-MV) and the p-channel middle-voltage transistor (P-Mv). The wording, "the low-voltage transistors" includes the n-channel low-voltage/high-threshold voltage transistor (N-LV High Vt), the n-channel low-voltage/low-threshold voltage transistor (N-LV Low Vt), the p-channel low-voltage/high-threshold voltage transistor (P-LV High Vt) and the p-channel low-voltage/low-threshold voltage transistor (P-LV Low Vt). The wording, "the high-voltage transistors" includes the flash memory cell (Flash cell) in some cases.

The wording, "the n-channel high-voltage transistors" includes the n-channel high-voltage/low-threshold voltage transistor (N-HV Low Vt) and the n-channel high-voltage/high-threshold voltage transistor (N-HV High Vt). The wording, "the p-channel high-voltage transistors" includes the p-channel high-voltage/low-threshold voltage transistor (P-HV Low Vt) and the p-channel high-voltage/high-threshold voltage transistor (P-HV High Vt). The wording, "then-channel low-voltage transistors" includes the n-channel low-voltage/high-threshold voltage transistor (N-LV High Vt) and the n-channel low-voltage/low-threshold voltage transistor (N-LV Low Vt). The wording, "the p-channel low-voltage transistors" includes the p-channel low-voltage/high-threshold voltage transistor (P-LV High Vt) and the p-channel low-voltage/low-threshold voltage transistor (P-LV Low Vt).

First, the silicon substrate 10 is thermally oxidized to grow, e.g., a 10 nm-thick silicon oxide film 12.

Next, a 100 nm-thick silicon nitride film 14, for example, is grown on the silicon oxide film 12 by, e.g., CVD method.

Figure 5A:
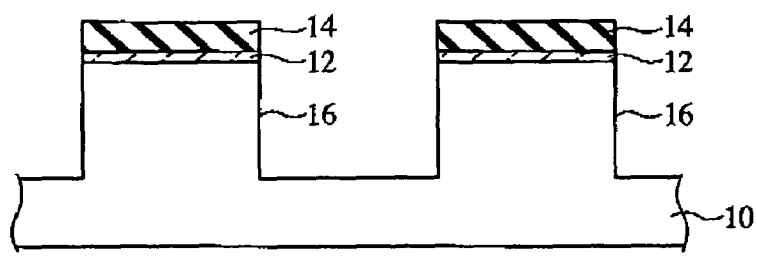
Figure 6A:
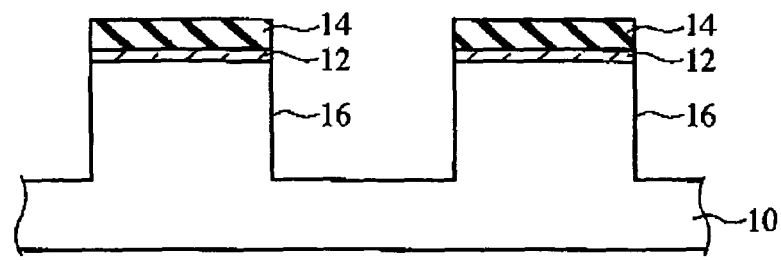

Next, the silicon nitride film 14, the silicon oxide film 12 and the silicon substrate 10 are sequentially etched by lithography and dry etching to form trenches 16 of, e.g., a 300 nm-depth in the silicon substrate 10 (FIGS. 5A and 6A).

Then, the silicon substrate 10 is thermally oxidized to form a silicon oxide film 18 on the inside surfaces of the trenches 16. The thermal oxidation is performed under the following conditions which are different between the semiconductor device with no flash memory combined and the semiconductor device with the flash memory combined.

Figure 5B:
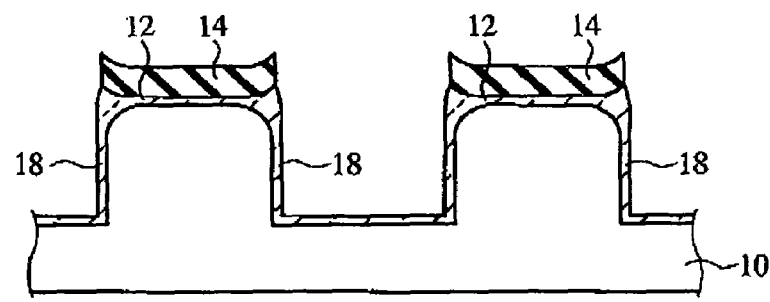

In the semiconductor device with no flash memory combined, the thermal oxidation is performed at, e.g., 850° C., and the silicon oxide film 18 is grown in, e.g., an about 10 nm-thick. When thermally oxidized under this condition, the curvature radius of the upper end of the finished active region is about 10-30 nm (FIG. 5B).

Figure 6B:
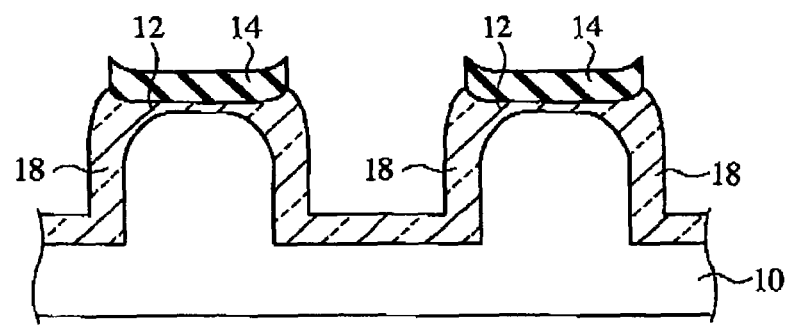

In the semiconductor device with the flash memory combined, the thermal oxidation is performed at, e.g., 1100° C., and the silicon oxide film 18 is grown in, e.g., an about 40 nm-thick. As the film thickness of the silicon oxide film 18 is larger and the oxidation temperature is higher, the round of the upper end of the active region is more increased. When thermally oxidized under this condition, the curvature radius of the upper end of the finished active region is about 40-60 nm (FIG. 6B).

Then, a 550 nm-thick silicon oxide film 20, for example, is grown by, e.g., high density plasma CVD method.

Figure 5C:
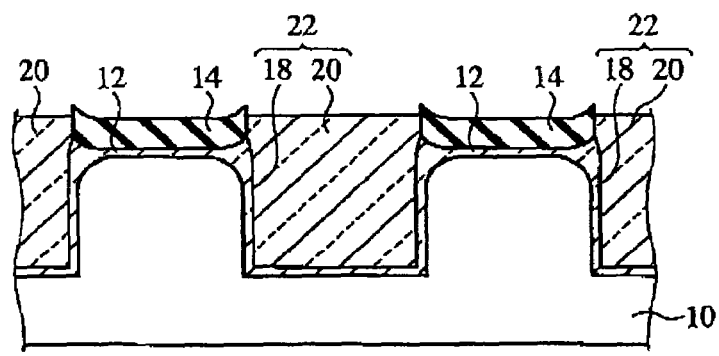
Figure 6C:
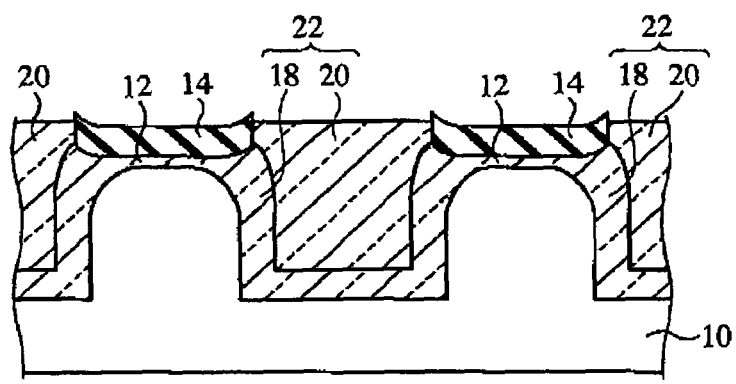

Next, the silicon oxide film 20 is planarized by CMP method until the silicon-nitride film 14 is exposed, and a device isolation film 22 buried in the trenches 16 and formed of the silicon oxide films 18, 20 is formed (FIGS. 5C and 6C).

After the device isolation film 22 has been formed, on the active region defined by the device isolation film 22, the 6 kinds transistors are formed in the semiconductor device with no flash memory combined, and in the semiconductor device with the flash memory combined, the 11 kinds of transistors are formed.

In the following description, the method for fabricating the semiconductor device group according to the present embodiment will be explained in accordance with the fabrication steps of the semiconductor device with the flash memory combined The fabrication steps of the semiconductor device with no flash memory combined correspond to the fabrication steps of the semiconductor device with the flash memory combined having the unnecessary fabrication steps for fabricating the semiconductor device with the flash memory combined omitted, and the fabrication steps of the semiconductor device with no flash memory combined will not be explained by using the figures.

Figure 7A:
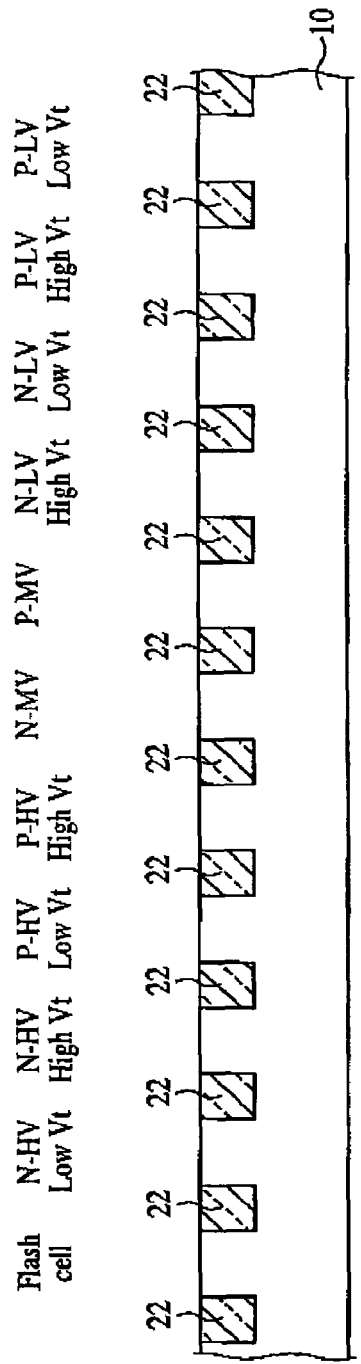

First, by the above-descried fabrication method, the active regions are formed on the silicon substrate 10, defined by the device isolation film 22 (FIG. 7A).

In the drawing, the active regions defined by the device isolation film 22 are, sequentially from the left, a region for the flash memory cell (Flash cell) to be formed in, a region for the n-channel high-voltage/low-threshold voltage transistor (N-HV Low Vt) to be formed in, a region for the n-channel high-voltage/high-threshold voltage transistor (N-HV High Vt) to be formed in, a region for the p-channel high-voltage/low-threshold voltage transistor (P-HV Low Vt) to be formed in, a region for the p-channel high-voltage/high-threshold voltage transistor (P-HV High Vt) to be formed in, a region for the n-channel middle-voltage transistor (N-MV) to be formed in, a region for the p-channel middle-voltage transistor (P-MV) to be formed in, a region for the n-channel low-voltage/high-threshold voltage transistor (N-LV High Vt) to be formed in, a region for the n-channel low-voltage/low-threshold voltage transistor (N-LV Low Vt) to be formed in, a region for the p-channel low-voltage/high-threshold voltage transistor (P-LV High Vt) to be formed in and a region for the p-channel low-voltage/low-threshold voltage transistor (P-LV Low Vt) to be formed in.

Then, the silicon nitride film 14 is removed by phosphoric acid, and the silicon oxide film 12 is removed by hydrofluoric acid aqueous solution, and then the silicon substrate 10 is thermally oxidized to grow a silicon oxide film 24 as a sacrificial oxidation film of, e.g., a 10 nm-thick.

Then, a photoresist film 26 covering the regions other than the region for the flash memory cell (Flash cell) to be formed in and the region for the n-channel high-voltage transistors (N-HV High Vt, N-HV Low Vt) to be formed in is formed by photolithography.

Figure 7B:
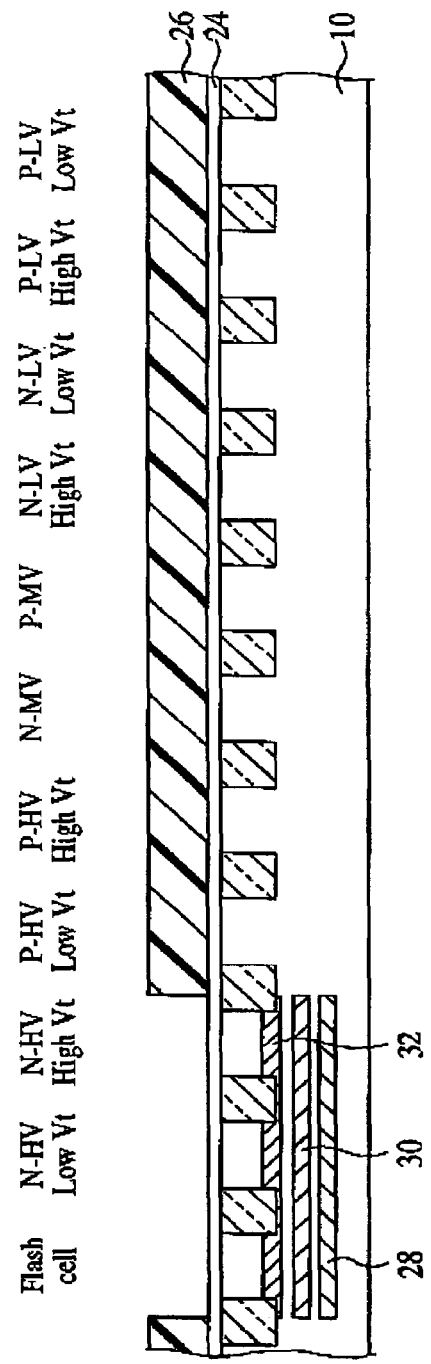

Then, ion implantation is performed with the photoresist film 26 as the mask to form an n-type buried impurity doped layer 28 and impurity-doped layers 30, 32 for p-well in the region for the flash memory cell (Flash cell) to be formed in and the region for the n-channel high-voltage transistors (N-HV High Vt, N-HV Low Vt) to be formed in (FIG. 7B). The n-type buried impurity doped layer 28 is formed by implanting, e.g., phosphorus ions ($P^+$) under conditions of a 2 MeV acceleration energy and a $2\times10^{13}$ $cm^{-2}$ dosage. The impurity doped layer 30 for p-well is formed by implanting, e.g., boron ions ($B^+$) under conditions of a 400 keV acceleration energy and a $5\times10^{13}$ $cm^{-2}$ dosage. The impurity doped layer 32 for p-well is formed by implanting, e.g., boron ions under conditions of a 100 keV acceleration energy and a $2\times10^{12}$ $cm^{-2}$ dose.

Then, the photoresist film 26 is removed by, e.g., ashing.

Then, a photoresist film 34 exposing the region for the flash memory cell (Flash cell) to be formed in and covering the rest region is formed by photolithography.

Next, with the photoresist film 34 as the mask, ion implantation is performed to form an impurity doped layer 36 for a threshold voltage control in the region for the flash memory cell (Flash cell) to be formed in (FIG. 8A). The impurity doped layer 36 for the threshold voltage control is formed by implanting, e.g., boron ions under conditions of a 40 keV acceleration energy and a $6\times10^{13}$ $cm^{-2}$ dosage.

Then, the photoresist film 34 is removed by, e.g., ashing.

Next, the silicon oxide film 24 as the sacrificial oxidation film is removed by hydrofluoric acid aqueous solution.

Next, thermal oxidation is performed at, e.g., 900-1050° C. to form a 10 nm-thick tunnel oxide film 38 on the active regions (FIG. 8B).

Then, a phosphorus doped polycrystalline silicon film of, e.g., a 90 nm-thick is grown on the tunnel oxide film 38 by, e.g., CVD method.

Then, the polycrystalline silicon film is patterned by photolithography and dry etching to form a floating gate 40 of the polycrystalline silicon film in the region for the flash memory cell (Flash cell) to be formed in.

Figure 9A:
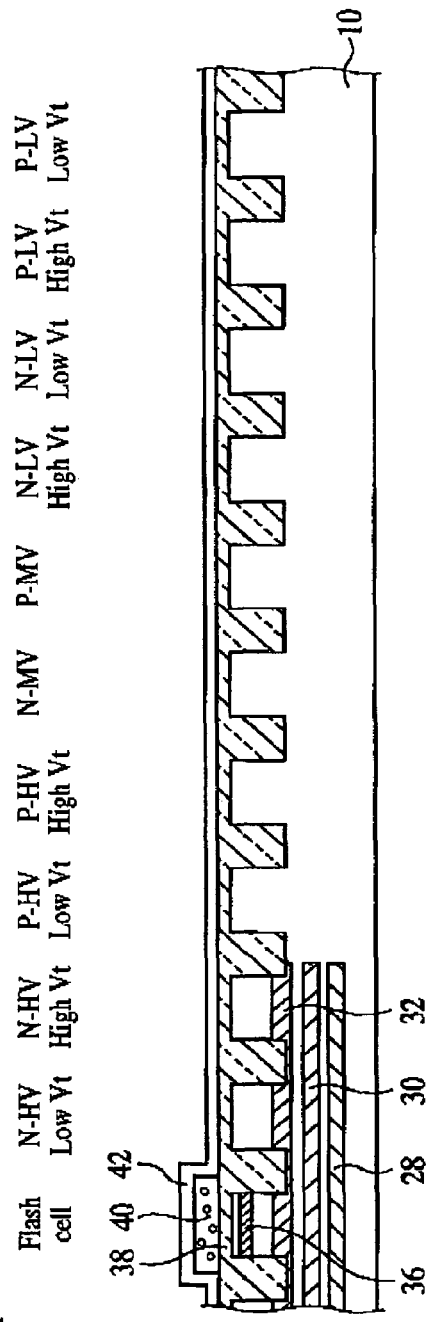

Then, a silicon oxide film of, e.g., a 5 nm-thick and a silicon nitride film of, e.g., a 10 nm-thick are formed on the tunnel oxide film 38 with the floating gate 40 formed on, and then the surface of the silicon nitride film is thermally oxidized at 950° C. for 90 minutes to grow an about 30 nm-thick silicon oxide film. Thus, an ONO film 42 of silicon oxide/silicon nitride/silicon oxide structure is formed (FIG. 9A). The thermal processing in the step of forming the ONO film 42 diffuses the well impurities in about 0.1-0.2 μm or more, and the impurity distributions become broad.

As described above, in the method for fabricating the semiconductor device group according to the present embodiment, the specific thermal processing steps of the flash memory cell for forming the tunnel oxide film 38, the floating gate 40 and the ONO film 42, etc. are performed before the p-wells 82, 86 and the n-wells 84, 88, in which the middle-voltage transistors and the low-voltage transistors are to be formed, are formed. Accordingly, the impurity profiles in the region for the middle-voltage transistors to be formed in and the region for the low-voltage transistors to be formed in are kept from being affected by the specific thermal processing steps of the semiconductor device with the flash memory combined.

The steps shown in FIGS. 7B to 9A described above are the specific steps of the semiconductor device with the flash memory combined and are omitted in the semiconductor device with no flash memory combined.

Then, a photoresist film 44 exposing the region for the n-channel high-voltage/high-threshold voltage transistor (N-HV High Vt) to be formed in, the region for the n-channel middle-voltage transistor (N-MV) and the region for the n-channel low-voltage transistors (N-LV High Vt, N-Lv Low Vt) to be formed in and covering the rest region is formed by photolithography.

Figure 9B:
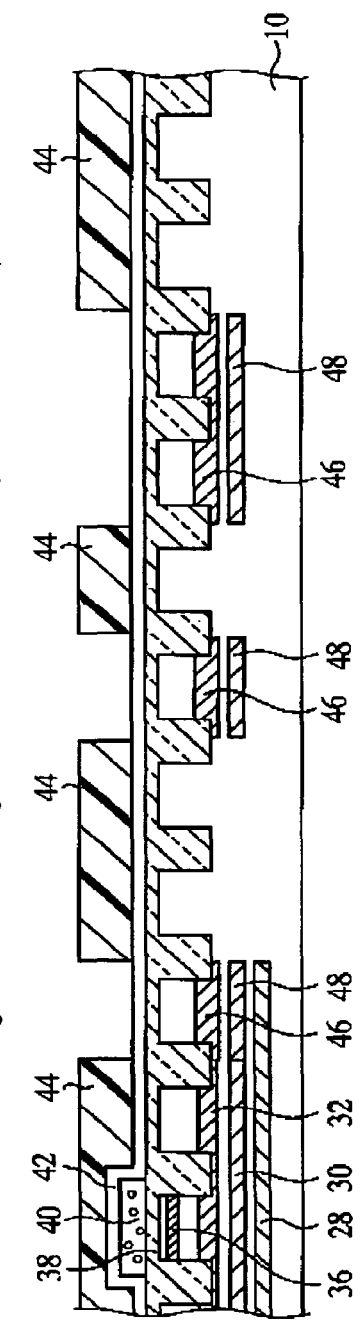

Then, ion implantation is performed with the photoresist film 44 as the mask to form impurity doped layers 46, 48 for p-well in the region for the n-channel high-voltage/high-threshold voltage transistor (N-HV High Vt) to be formed in, the region for the n-channel middle-voltage transistor (N-MV) to be formed in and the region for the n-channel low-voltage transistors (N-LV High Vt, N-LV Low Vt) to be formed in (FIG. 9B). The impurity doped layer 46 for p-well is formed by implanting, e.g., boron ions under conditions of a 100 keV acceleration energy and a $6\times10^{12}$ cm$^{-2}$ dosage. The impurity doped layer 48 for p-well is formed by implanting, e.g., boron ions under conditions of a 400 keV acceleration energy and a $1.4\times10^{13}$ cm$^{-2}$ dosage. The impurity doped layers 46, 48 for p-well have the effect of maintaining the steep distributions without being affected by the thermal processing in the ONO film forming step described above and suppressing the punch-through between the n-channel source/drain and the n-well 90.

Then, the photoresist film 44 is removed by, e.g., ashing.

Next, a photoresist film 50 exposing the region for the p-channel high-voltage transistors (P-HV Low Vt, P-HV High Vt) to be formed in, the region for the p-channel middle-voltage transistor (P-MV) and the region for the p-channel low-voltage transistors (P-LV High Vt, P-LV Low Vt) to be formed in and covering the rest region is formed by photolithography.

Figure 10A:
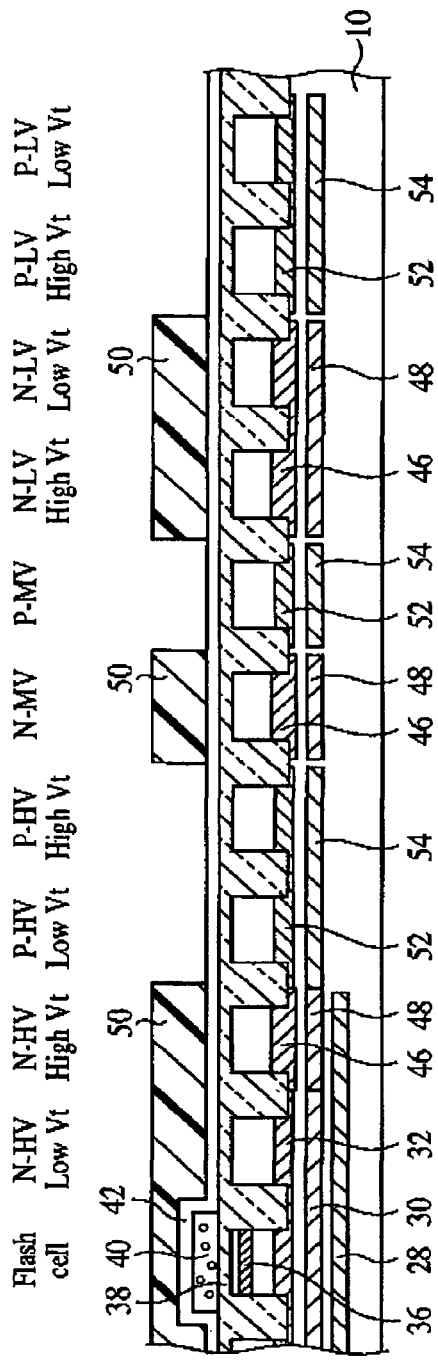

Then, ion implantation is performed with the photoresist film 50 as the mask to form impurity doped layers 52, 54 for n-well in the region for the p-channel high-voltage transistors (P-HV Low Vt, P-HV High Vt) to be formed in, the region for the p-channel middle-voltage transistor (P-MV) to be formed in and the region for the p-channel low-voltage transistors (P-LV High Vt, P-LV Low Vt) to be formed in (FIG. 10A). The impurity doped layer 62 for n-well is for controlling the threshold voltage of the p-channel high-voltage/low-threshold voltage transistor (P-HV Low Vt). The conditions for forming the impurity doped layer 52 form-well can be suitably adjusted. The impurity doped layer 52 for n-well is formed by implanting, e.g., phosphorus ions under conditions of a 240 kev acceleration energy and a $3\times10^{12}$ cm$^{-2}$ dosage, and an about −0.2 V threshold voltage is obtained. The impurity doped layer 54 for n-well is formed by implanting, e.g., phosphorus ions under conditions of a 600 keV acceleration energy and a $1.5\times10^{13}$ cm$^{-2}$ dosage.

Then, the photoresist film 50 is removed by, e.g., ashing.

Next, a photoresist film 56 exposing the region for the p-channel high-voltage/high-threshold voltage transistor (P-HV High Vt) to be formed in, the region for the p-channel middle-voltage transistor (P-MV) to be formed in and the region for the p-channel low-voltage transistors (P-LV High Vt, P-LV Low Vt) to be formed in and covering the rest region is formed by photolithography.

Figure 10B:
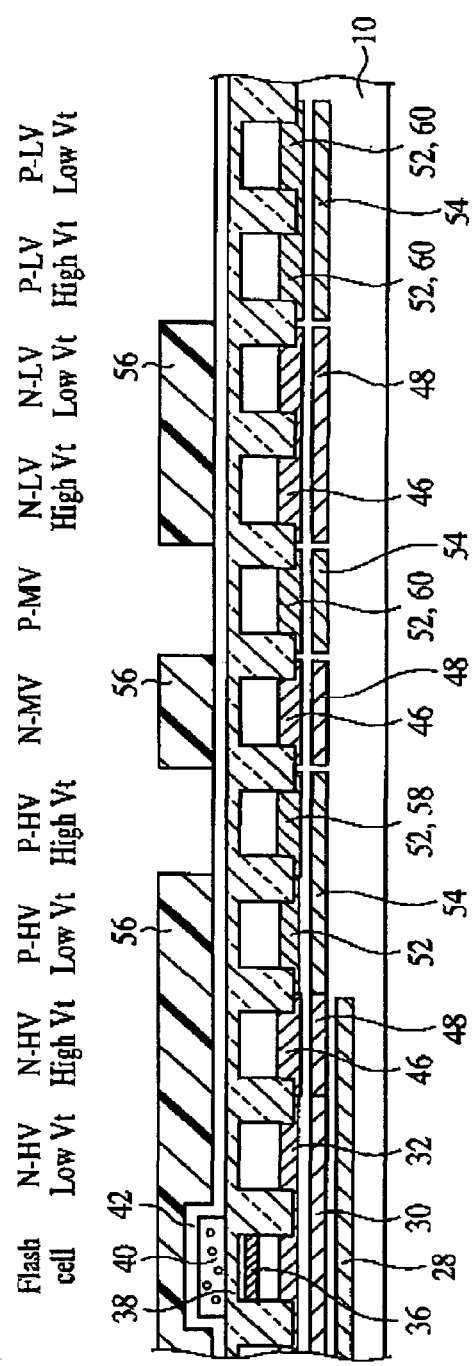

Next, ion implantation is performed with the photoresist film 56 as the mask to form an impurity doped layer 58 for a threshold voltage control in the region for the p-channel high-voltage/high-threshold voltage transistor (P-HV High Vt) to be formed in and channel stop layers 60 in the region for the p-channel middle-voltage transistor (P-MV) to be formed in and the region for the p-channel low-voltage transistors (P-LV High Vt, P-LV Low Vt) to be formed in (FIG. 10B). The impurity doped layer 58 for the threshold voltage control and the channel stop layer 60 are formed by implanting, e.g., phosphorus ions under conditions of a 240 keV acceleration energy and a $6.5\times10^{12}$ cm$^{-2}$ dosage, and an about −0.6 V threshold voltage is obtained. The n-wells have steep distributions having little horizontal diffusion and suppress the punch-through between the n-channel source/drains and the n-wells.

Next, the photoresist film 56 is removed by, e.g., ashing.

The step illustrated in FIG. 10B described above is characteristic of the semiconductor device with the flash memory combined and is omitted in the semiconductor device with no flash memory combined but channel stop dosage at FIG. 10A is modified so as to make the total dosage as same as flash combined one.

Next, a photoresist film 62 exposing the region for the n-channel middle-voltage transistor (N-MV) to be formed in and covering the rest region is formed by photolithography.

Figure 11A:
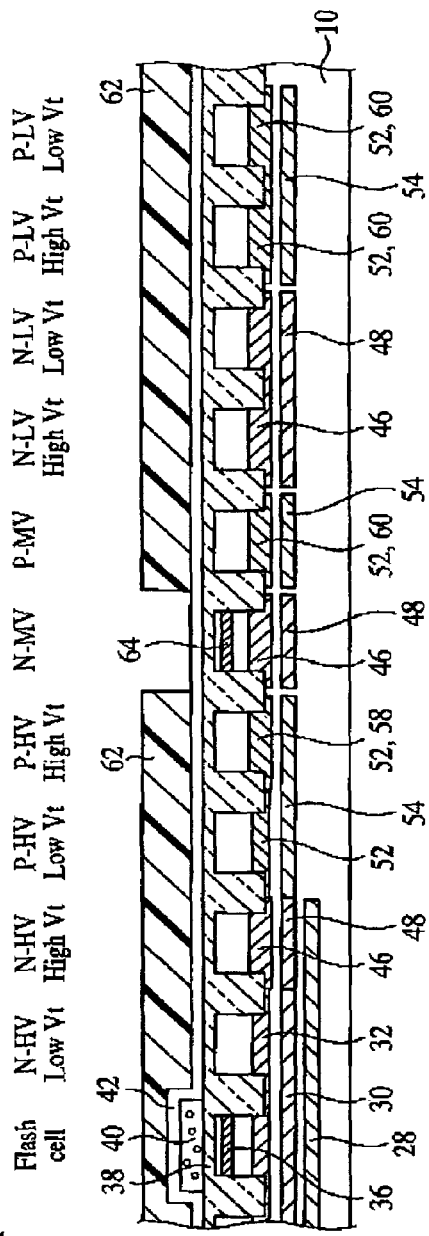

Then, with the photoresist film 62 as the mask, ion implantation is performed to form an impurity doped layer 64 for a threshold voltage control in the region for the n-channel middle-voltage transistor (N-MV) to be formed in (FIG. 11A). The impurity doped layer 64 for the threshold voltage control is formed by implanting, e.g., boron ions under conditions of a 30 keV acceleration energy and a $5\times10^{12}$ cm$^{-2}$ dosage, and an about +0.3~+0.4 V threshold voltage is obtained.

Then, the photoresist film 62 is removed by, e.g., ashing.

Then, a photoresist film 66 exposing the region for the p-channel middle-voltage transistor (P-MV) to be formed in and covering the rest region is formed by photolithography.

Figure 11B:
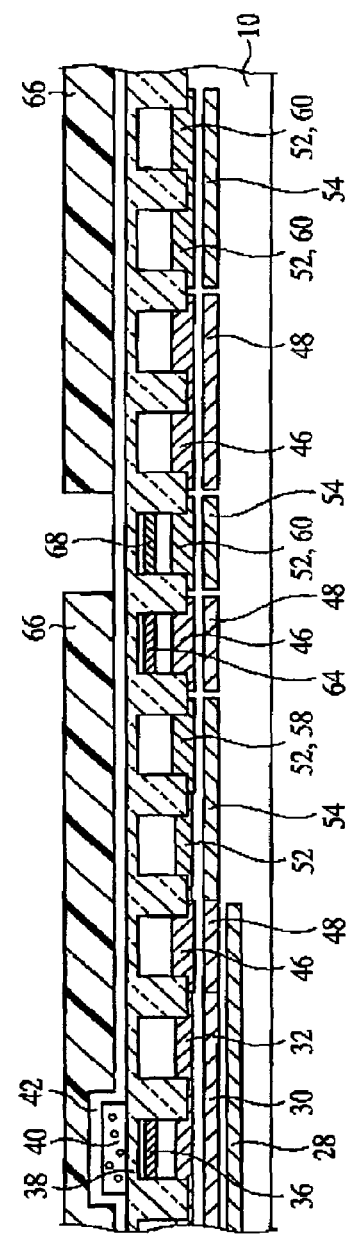

Next, with the photoresist film 66 as the mask, ion implantation is performed to form an impurity doped layer 68 for a threshold voltage control in the region for the p-channel middle-voltage transistor (P-MV) to be formed in (FIG. 11B). The impurity doped layer 68 for the threshold voltage control is formed by implanting, e.g., arsenic (As$^+$) ions under conditions of a 150 keV acceleration energy and a $3\times10^{12}$ cm$^{-2}$ dosage, and an about −0.3~−0.4V threshold voltage is obtained.

Then, the photoresist film 66 is removed by, e.g., ashing.

Then, a photoresist film 70 exposing the region for the n-channel low-voltage/high-threshold voltage transistor (N-LV High Vt) to be formed in and covering the rest region is formed by photolithography.

Figure 12A:
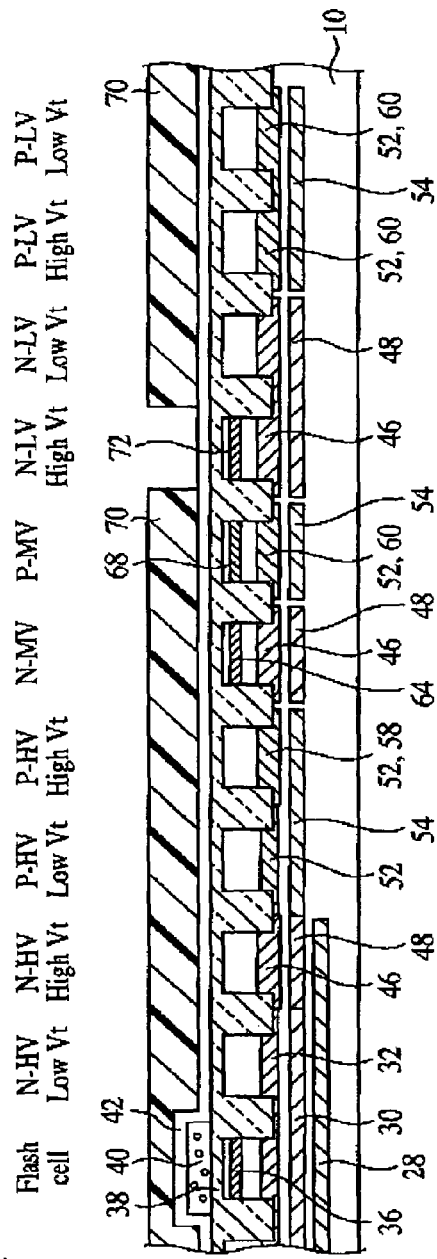

Then, with the photoresist film 70 as the mask, ion implantation is performed to form an impurity doped layer 72 for a threshold voltage control in the region for the n-channel low-voltage/high-threshold voltage transistor (N-LV High Vt) to be formed in (FIG. 12A). The impurity doped layer 72 for the threshold voltage control is formed by implanting, e.g., boron ions under conditions of a 10 keV acceleration energy and a $5\times10^{12}$ cm$^{-2}$ dosage, and an about +0.2 V threshold voltage is obtained.

Then, the photoresist film 70 is removed by, e.g., ashing.

Then, a photoresist film 74 exposing the region for the p-channel low-voltage/high-threshold voltage transistor (P-LV High Vt) to be formed in and covering the rest region is formed by photolithography.

Figure 12B:
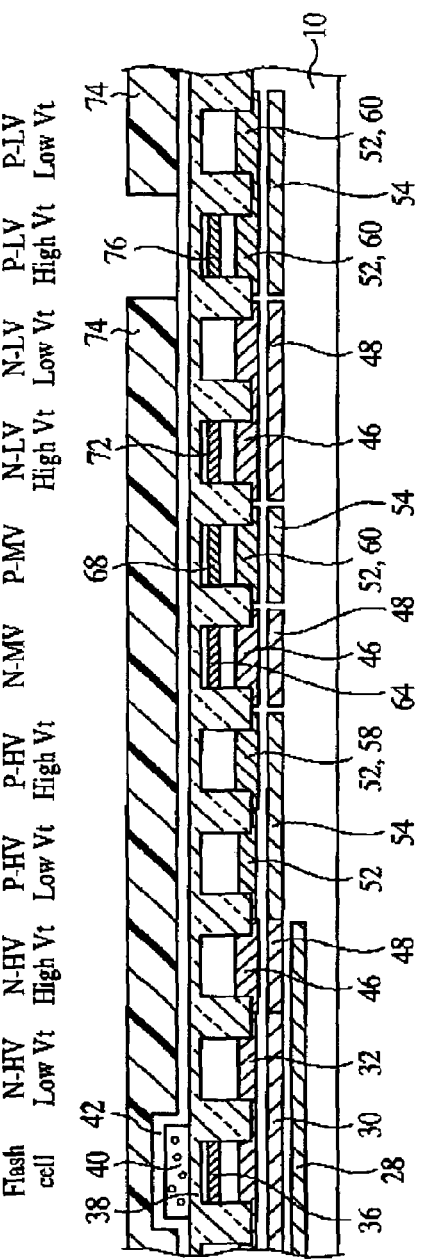

Then, with the photoresist film 74 as the mask, ion implantation is performed to form an impurity doped layer 76 for a threshold voltage control in the region for the p-channel low-voltage/high-threshold voltage transistor (P-LV High Vt) to be formed in (FIG. 12B). The impurity doped layer 76 for the threshold voltage control is formed by implanting, e.g., arsenic ions under conditions of a 100 keV acceleration energy and a $5\times10^{12}$ cm$^{-2}$, and an about −0.2 V threshold voltage is obtained.

Then, the photoresist film 74 is removed by, e.g., ashing.

Thus formed are the p-well 78 formed in the region for the flash memory cell (Flash cell) to be formed in, the region for the n-channel high-voltage transistors (N-HV Low Vt, N-Hv High Vt) to be formed in and including the impurity doped layers 30, 32, 46, 48 for p-well and the impurity doped layer 36 for the threshold voltage control, the n-well 80 formed in the region for the p-channel high-voltage transistors (P-HV Low Vt, P-HV High Vt) to be formed in and including the impurity doped layers 52, 54 for n-well and the impurity doped layer 58 for the threshold voltage control, the p-well 82 formed in the region for the n-channel middle-voltage transistor (N-MV) to be formed in and including the impurity doped layers 46, 48 for p-well and the impurity doped layer 64 for the threshold voltage control, the n-well 84 formed in the region for the p-channel middle-voltage transistor (P-MV) to be formed in and including the impurity doped layers 52, 54 for n-well, the channel stop layer 60 and the impurity doped layer 68 for the threshold voltage control, the p-well 86 formed in the region for the n-channel low-voltage transistors (N-LV High Vt, N-LV Low Vt) to be formed in and including the impurity doped layers 46, 48 for p-well and the impurity doped layer 72 for the threshold voltage control, the n-well 88 formed in the region for the p-channel low-voltage transistors (P-LV High Vt, P-LV Low Vt) to be formed in and including the impurity doped layers 52, 54 for n-well, the channel stop layer 60 and the impurity doped layer 76 for the threshold voltage control. The n-well 80 functions as the n-well 90 which surrounds the p-well 78 in cooperation with the n-type buried impurity doped layer 28. That is, p-well 78 is a double well formed in the n-well 90 (see FIG. 13A).

Then, a photoresist film 92 covering the region for the flash memory cell (Flash cell) to be formed in and exposing the rest region is formed by photolithography.

Then, the ONO film 42 is etched by, e.g., dry etching with the photoresist film 92 as the mask to remove the ONO film 42 in the region other than the region for the flash memory cell (Flash cell) to be formed in.

Figure 13A:
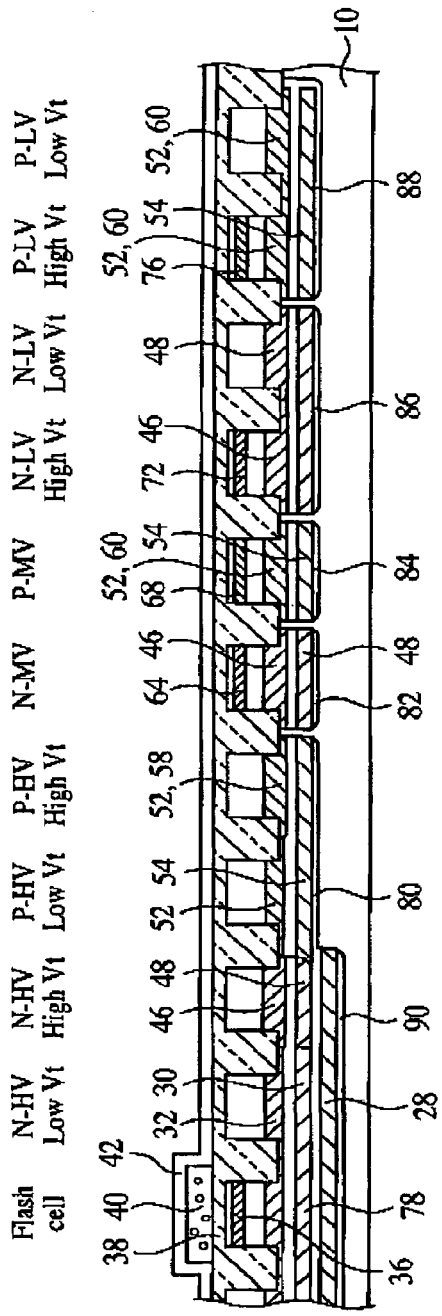
Figure 13B:
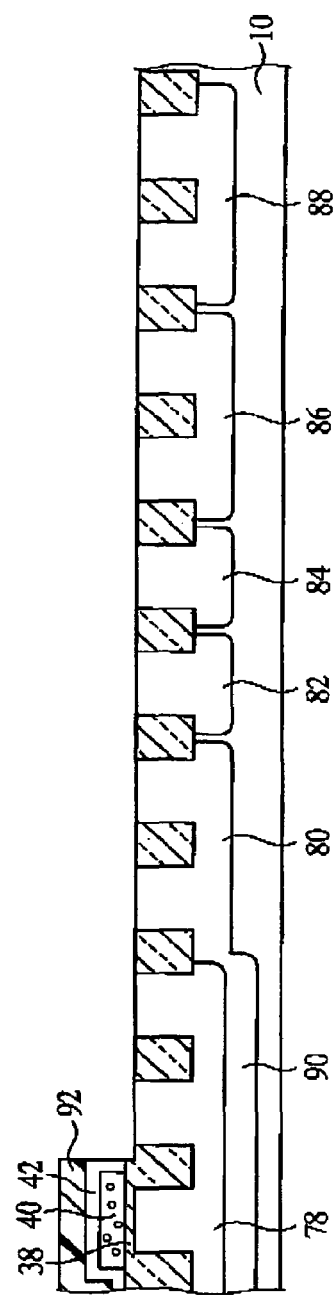

Then, the tunnel oxide film 38 is etched by wet etching using, e.g., hydrofluoric acid aqueous solution and with the photoresist film 92 as the mask to remove the tunnel oxide film 38 in the region other than the region for the flash memory cell (Flash cell) to be formed in (FIG. 13B).

Next, the photoresist film 92 is removed by, e.g., ashing.

Then, thermal oxidation is performed at, e.g., 850° C. to form a 13 nm-thick silicon oxide film 94 on the active regions.

Next, a photoresist film 96 covering the region for the flash memory cell (Flash cell) to be formed in and the region for the high-voltage transistors (N-HV Low Vt, N-HV High Vt, P-HV Low Vt, P-HV High Vt) to be formed in and exposing the rest region is formed by photolithography.

Next, the silicon oxide film 94 is etched by wet etching with, e.g., hydrofluoric acid aqueous solution and with the photoresist film 96 as the mask to remove the silicon oxide film 94 in the region for the middle-voltage transistors (N-MV, P-MV) to be formed in and the region for the low-voltage transistors (N-LV Low Vt, N-LV High Vt, P-LV Low Vt, P-LV High Vt) to be formed in (FIG. 14A).

Next, the photoresist film 96 is removed by, e.g., ashing.

In the step shown in FIG. 14A described above, in the semiconductor device with no flash memory combined, the silicon oxide film 24 formed of the 10 nm-thick sacrificial oxidation film formed after the device isolation film 12 has been formed is removed without using any masks.

Then, thermal oxidation is performed at, e.g., 850° C. to form a 4.5 nm-thick silicon oxide film 98 on the active regions in the region for the middle-voltage transistors (N-MV, P-MV) to be formed in and the region for the low-voltage transistors (N-LV Low Vt, N-LV High Vt, P-LV Low Vt, P-LV High Vt) to be formed in. In this thermal oxidation step, the silicon oxide film 94 is also thickened.

Then, a photoresist film 100 covering the region for the flash memory cell (Flash cell) to be formed in, the region for the high-voltage transistors (N-HV Low Vt, N-HV High Vt, P-HV Low Vt, P-HV High Vt) to be formed in and the region for the middle-voltage transistors (N-MV, P-MV) to be formed in and exposing the region for the low-voltage transistors (N-LV Low Vt, N-LV High Vt, P-LV Low Vt, P-LV High Vt) to be formed in is formed by photolithography.

Next, the silicon oxide film 98 is etched by wet etching with, e.g., hydrofluoric acid aqueous solution and with the photoresist film 100 as the mask to remove the silicon oxide film 98 in the region for the low-voltage transistors (N-LV Low Vt, N-LV High Vt, P-LV Low Vt, P-LV High Vt) to be formed in (FIG. 14B).

Next, the photoresist film 100 is removed by, e.g., ashing.

Figure 15A:
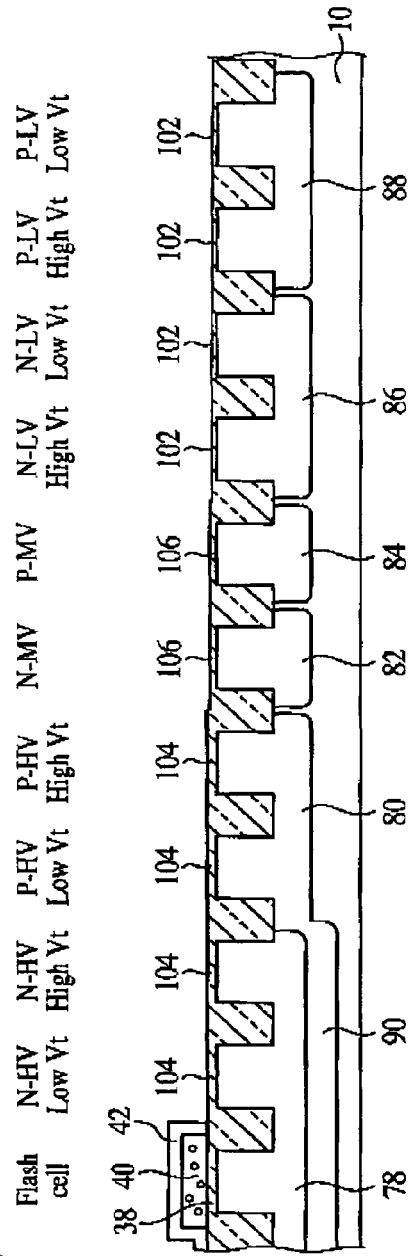

Then, thermal oxidation is performed at, e.g., 850° C. to form a gate insulating film 102 of a 2.2 nm-thick silicon oxide film on the active regions in the region for the low-voltage transistors (N-LV Low Vt, N-Lv High Vt, P-LV Low Vt, P-LV High Vt) to be formed in. In this thermal oxidation step, the silicon oxide films 94, 98 are also thickened, and a gate insulating film 104 of a 16 nm-total film thickness is formed in the region for the high-voltage transistors (N-HV Low Vt, N-HV High Vt, P-HV Low Vt, P-HV High Vt) to be formed in and a gate insulating film 106 of a 5.5 nm total film thickness in the region for the middle-voltage transistors (N-MV, P-MV) to be formed in (FIG. 15A).

In the steps shown in FIGS. 13A to 15A, in the semiconductor device with no flash memory combined, the device isolation film 12 is also etched when the silicon oxide film 24 is removed in the step of FIG. 14A and when the silicon oxide film 98 is removed in the step of FIG. 14B. The amount of the device isolation film etched off (STI recess amount) in removing the silicon oxide films 24, 98 is about 33 nm in consideration of the set etching amount which is 1.5 times the film thickness to be etched, and the etching rate of the silicon oxide film formed by the high density plasma CVD, which is 1.5 times the etching rate of the thermal oxidation film.

On the other hand, in the semiconductor device with the flash memory combined, the device isolation film 12 is etched when the silicon oxide film 24 is removed in the step of FIG. 8B, when the tunnel oxide film 38 is removed in the step of FIG. 13B, when the silicon oxide film 94 is removed in the step of FIG. 14A, when the silicon oxide film 98 is removed in the step of FIG. 14B. Accordingly, the amount of the device isolation film etched off (STI recess amount) when the silicon oxide films 24, 94, 98 and the tunnel oxide film 38 are removed is about 84 nm.

Figure 5D:
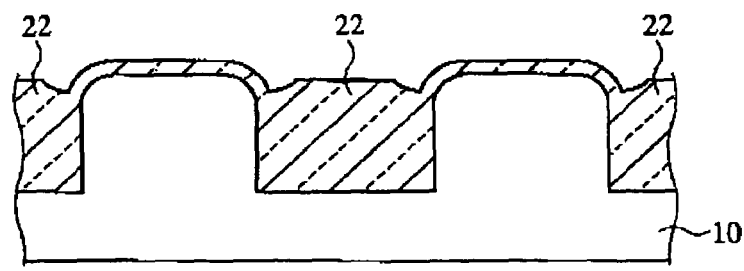
Figure 6D:
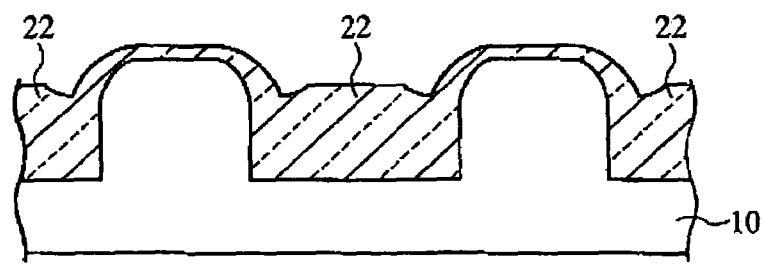

Thus, the device isolation film 22 of the semiconductor device with no flash memory combined has an about 30 nm STI recess amount and a 10-30 nm curvature radius of the upper ends of the active regions in the region for the low-voltage transistors (N-LV Low Vt, N-LV High Vt, P-LV Low Vt, P-LV High Vt) to be formed in. The device isolation film 22 of the semiconductor device with the flash memory combined has, and an about 80 nm STI recess amount and a 40-60 nm curvature radius of the upper ends of the active regions in the region for the low-voltage transistors (N-LV Low Vt, N-LV High Vt, P-LV Low Vt, P-LV High Vt) to be formed in. The curvature radius of the active region and the STI recess amount for the semiconductor device with the flash memory combined are larger than those for the semiconductor device with no flash memory combined (FIGS. 5D and 6D).

Next, an undoped polycrystalline silicon film 108 of, e.g., a 180 nm-thick is formed by CVD method.

Then, a silicon nitride film 110 of, e.g., a 30 nm-thick is formed on the polycrystalline silicon film 108 by plasma CVD method. The silicon nitride film 0.110 functions as the anti-reflection film and mask in patterning the lower polycrystalline silicon film 108 and also functions to protect the gate electrodes of the logic unit in oxidizing the side surface of the gate electrode of the flash memory cells which will be described later.

Figure 15B:
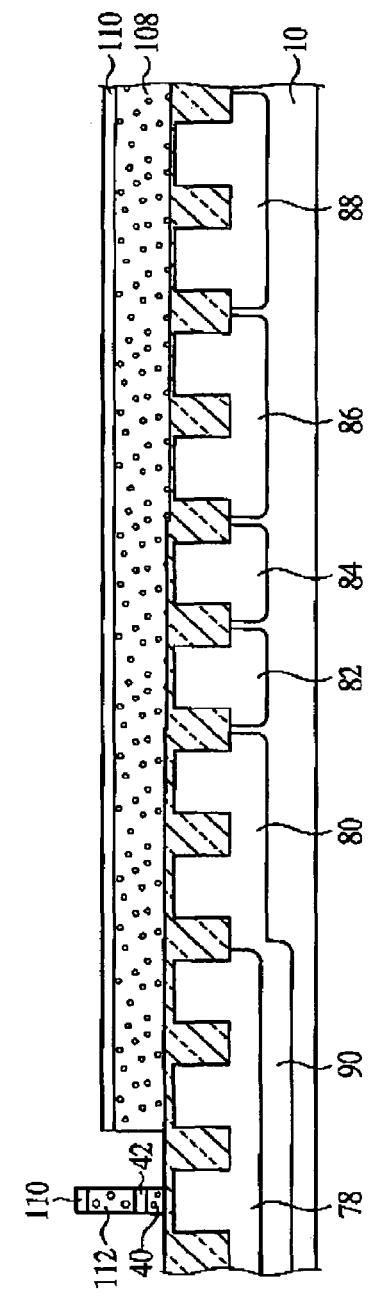

Next, the silicon nitride film 110, the polycrystalline silicon film 108, the ONO film 42 and the floating gate 40 in the region for the flash memory cell (Flash cell) to be formed in to form the gate electrode 112 of the polycrystalline silicon film 108, etc. of the flash memory cell (Flash cell) (FIG. 15B).

Then, the side wall of the gate electrode 112 of the flash memory cell (Flash cell) is thermally oxidized by about 10 nm, and ion implantation for the source-drain regions 114 is performed.

Next, the side wall of the gate electrode 112 is again thermally oxidized by about 10 nm.

Then, a silicon nitride film is deposited by, e.g., thermal CVD method, and then this silicon nitride film and the silicon nitride film 110 are etched back to form a sidewall insulating film 116 of the silicon nitride film on the side wall of the gate electrode 112.

Figure 16A:
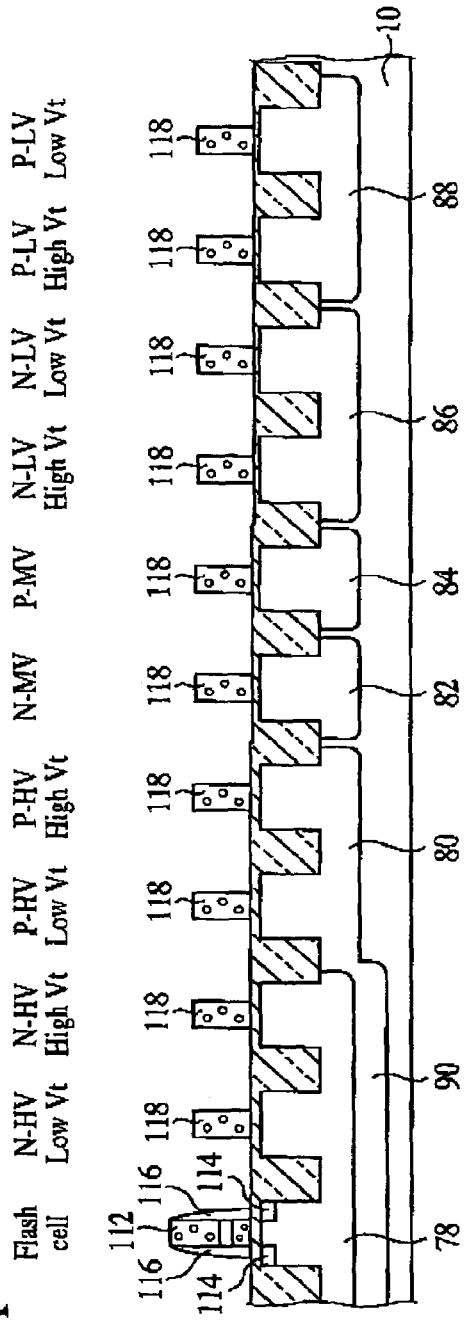

Next, the polycrystalline silicon film 108 in the region for the high-voltage transistors (N-HV Low Vt, N-HV High Vt, P-HV Low Vt, P-HV High Vt) to be formed in, the region for the middle-voltage transistors (N-MV, P-MV) to be formed in and the region for the low-voltage transistors (N-LV Low Vt, N-LV High Vt, P-LV Low Vt, P-LV High Vt) to be formed in is patterned by photolithography and dry etching to form the gate electrodes 118 of the polycrystalline silicon film 108 (FIG. 16A).

In the steps of FIGS. 15B and 16A described above, in the semiconductor device with no flash memory combined, the silicon nitride film 110, stacked gate formation and oxidation steps are skipped and the polycrystalline silicon film 108 only in the region for the middle-voltage transistors (N-MV, P-MV) to be-formed in and the region for the low-voltage transistors (N-LV Low Vt, N-LV High Vt, P-LV Low Vt, P-LV High Vt) to be formed in are patterned.

Next, a photoresist film 120 exposing the region for the p-channel low-voltage transistors (P-LV Low Vt, P-LV High Vt) to be formed in and covering the rest region is formed by photolithography.

Figure 16B:
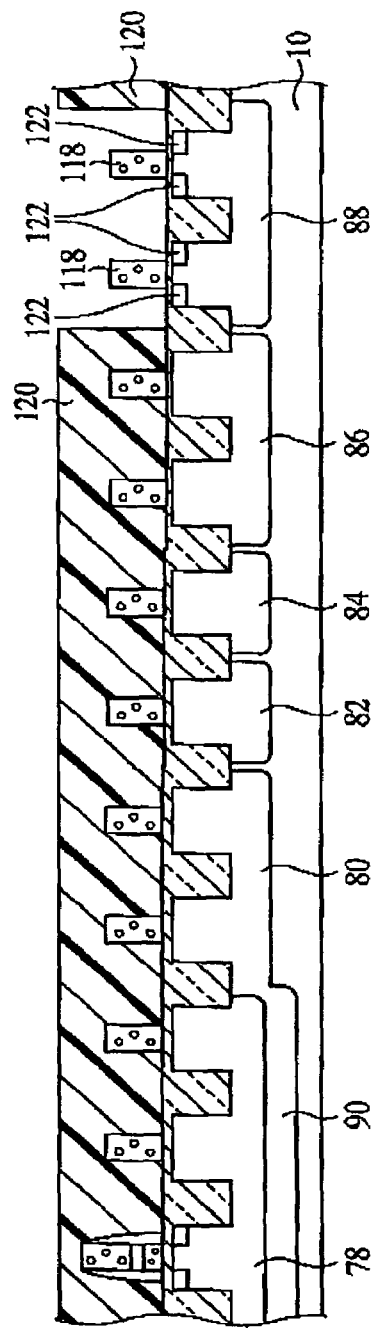

Then, ion implantation is performed with the photoresist film 120 as the mask to form the extensions 122 of the source/drain regions of the p-channel low-voltage/high-threshold voltage transistor (P-LV High Vt) and the p-channel low-voltage/low-threshold voltage transistor (P-LV Low Vt) (FIG. 16B). The extensions 122 having the pocket region are formed by implanting, e.g., boron ions at a 0.5 keV acceleration energy and a $3.6 \times 10^{14}$ cm$^{-2}$ dosage in 0° to the normal to the substrate, and arsenic ions at a 80 keV acceleration energy and a $6.5 \times 10^{12}$ cm$^2$ dosage in 4 directions tilted by 28° to the normal to the substrate.

Next, the photoresist film 120 is removed by, e.g., ashing.

Then, a photoresist film 124 exposing the region for the n-channel low-voltage transistors (N-LV Low Vt, N-LV High Vt) to be formed in and covering the rest region is formed by photolithography.

Figure 17A:
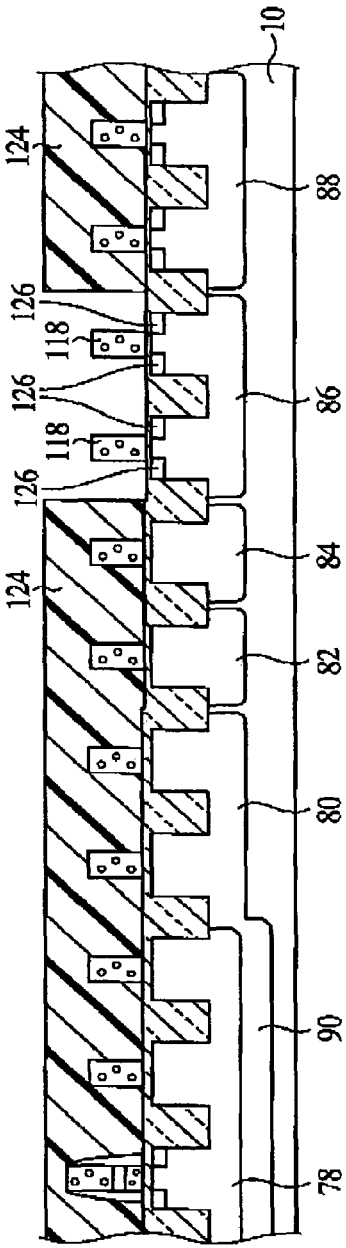

Then, ion implantation is performed with the photoresist film 124 as the mask to form the extensions 126 of the source/drain regions of the n-channel low-voltage/high-threshold voltage transistors (N-LV High Vt) and the n-channel low-voltage/low-threshold voltage transistor (N-LV Low Vt) (FIG. 17A). The extensions 126 having the pocket region are formed by implanting, e.g., arsenic ions at a 3 keV acceleration energy and a $1.1 \times 10^{15}$ cm$^{-2}$ dosage in 0° to the normal to the substrate, and boron fluoride (BF$_2{}^+$) ions at a 35 keV acceleration energy and a $9.5 \times 10^{12}$ cm$^{-2}$ dosage in 4 directions tilted by 28° to the normal to the substrate.

Next, the photoresist film 124 is removed by, e.g., ashing.

Then, a photoresist film 128 exposing the region for the p-channel middle-voltage transistor (P-Mv) to be formed in and covering the rest region is formed by photolithography.

Figure 17B:
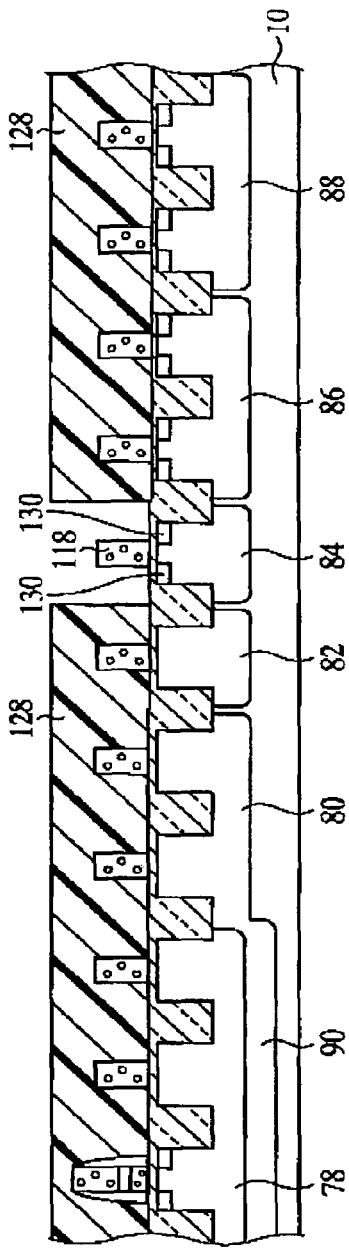

Next, ion implantation is performed with the photoresist film 128 as the mask to form the extensions 130 of the source/drain regions of the p-channel middle-voltage transistor (P-MV) (FIG. 17B). The extensions 130 are formed by implanting, e.g., boron fluoride ions under conditions of a 10 keV acceleration energy and a $7 \times 10^{13}$ cm$^{-2}$ dosage.

Next, the photoresist film 128 is removed by, e.g., ashing.

Then, a photoresist film 132 exposing the region for the n-channel middle-voltage transistor (N-MV) to be formed in and covering the rest region is formed by photolithography.

Next, ion implantation is performed with the photoresist film 132 as the mask to form extensions 134 of the source/drain regions of the n-channel middle-voltage transistor (N-MV) (FIG. 18A). The extensions 134 are formed by implanting, e.g., phosphorus ions under conditions of a 10 keV acceleration energy and a $3 \times 10^{13}$ cm$^{-2}$.

Then, the photoresist film 132 is removed by, e.g., ashing.

Then, a photoresist film 136 exposing the region for the p-channel high-voltage transistors (P-HV Low Vt, P-HV High Vt) to be formed in and covering the rest region is formed by photolithography.

Then, ion implantation is performed with the photoresist film 136 as the mask to form the extensions 138 of the source/drain regions of the p-channel high-voltage/low-threshold voltage transistor (P-HV Low Vt) to be formed in and the p-channel high-voltage/high-threshold voltage transistor (P-HV High Vt) to be formed in (FIG. 18B). The extensions 138 are formed by implanting, e.g., boron fluoride ions under conditions of a 80 keV acceleration energy and a $4.5 \times 10^{13}$ $cm^{-2}$ dosage.

Next, the photoresist film 136 is removed by, e.g., ashing.

Next, a photoresist film exposing the region for the n-channel high-voltage transistors (N-HV Low Vt, N-HV High Vt) to be formed in and covering the rest region is formed by photolithography.

Figure 19A:
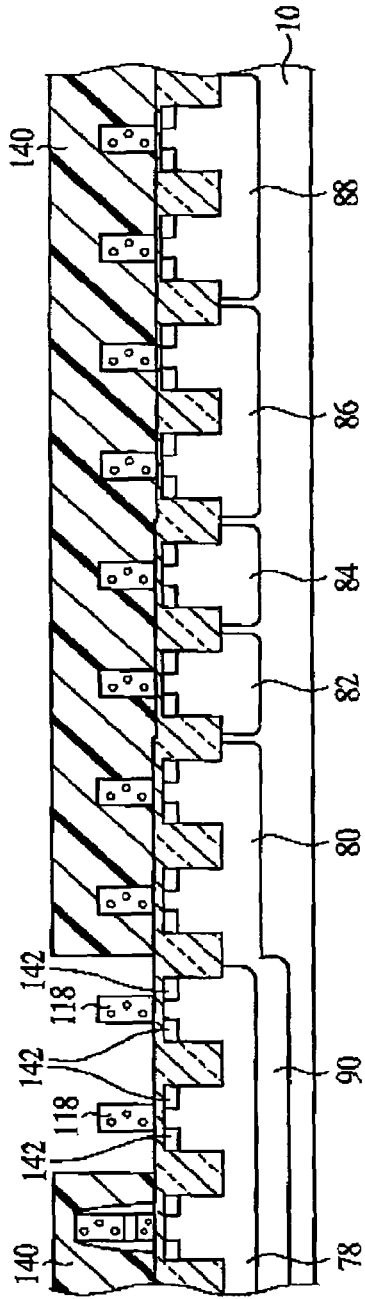

Then, ion implantation is performed with the photoresist film 140 as the mask to form the extensions 142 of the source/drain regions of the n-channel high-voltage/low-threshold voltage transistor (N-HV Low Vt) and the n-channel high-voltage/high-threshold voltage transistor (N-HV High Vt) (FIG. 19A). The extensions 142 are formed by implanting, e.g., phosphorus ions under conditions of a 35 keV acceleration energy and a $4 \times 10^{13}$ $cm^{-2}$ dosage.

Next, the photoresist film 140 is removed by, e.g., ashing.

The steps shown in FIGS. 18B and 19A described above are characteristic of the semiconductor device with the flash memory combined, and are omitted in the semiconductor device with no flash memory combined.

Next, a silicon oxide film is deposited by, e.g., thermal CVD method and then etched back to form a sidewall insulating film 144 of the silicon oxide film on the side wall of the gate electrodes 112, 118.

Then, a photoresist film 146 exposing the region for the flash memory cell (Flash cell) to be formed in and the region for the n-channel transistors (N-HV Low Vt, N-HV High Vt, N-MV, N-LV High Vt, N-LV Low Vt) to be formed in and covering the rest region is formed by photolithography.

Figure 19B:
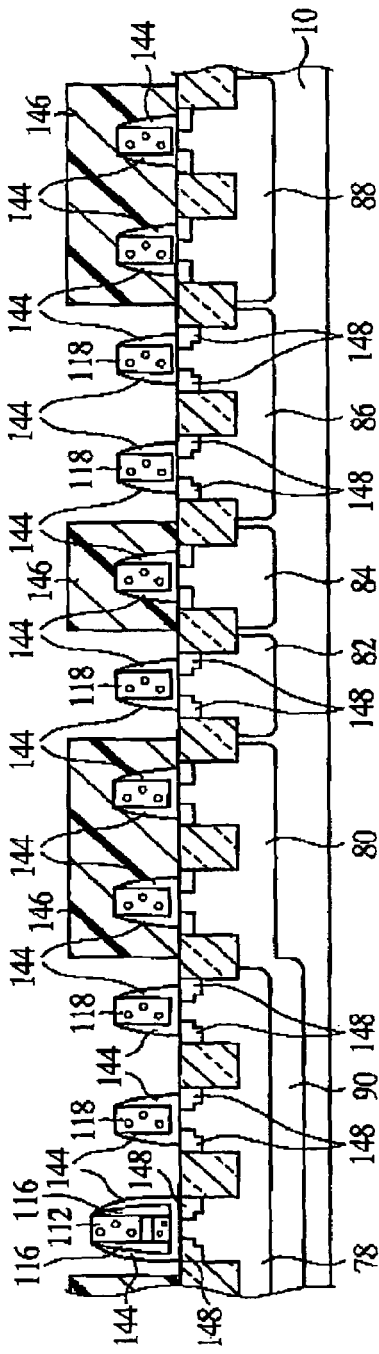

Then, ion implantation is performed with the photoresist mask 146 as the mask to form the source/drain regions 148 of the flash memory cell (Flash cell) and then channel transistors (N-HV Low Vt, N-HV High Vt, N-MV, N-LV High Vt, N-LV Low Vt) (FIG. 19B). By this ion implantation, concurrently the gate electrode 112 of the flash memory cell (Flash cell) and the gate electrodes 118 of the n-channel transistors (N-HV Low Vt, N-HV High Vt, N-MV, N-LV High Vt, N-LV Low Vt) are doped to be n-type. The source/drain regions 148 are formed by implanting, e.g., phosphorus ions under conditions of a 10 keV acceleration energy and a $6 \times 10^{15}$ $cm^{-2}$ dosage.

Next, the photoresist film 146 is removed by, e.g., ashing.

Then, a photoresist film 150 exposing the region for the p-channel transistors (P-HV Low Vt, P-HV High Vt, P-MV, P-LV High Vt, P-LV Low Vt) and covering the rest region is formed by photolithography.

Figure 20A:
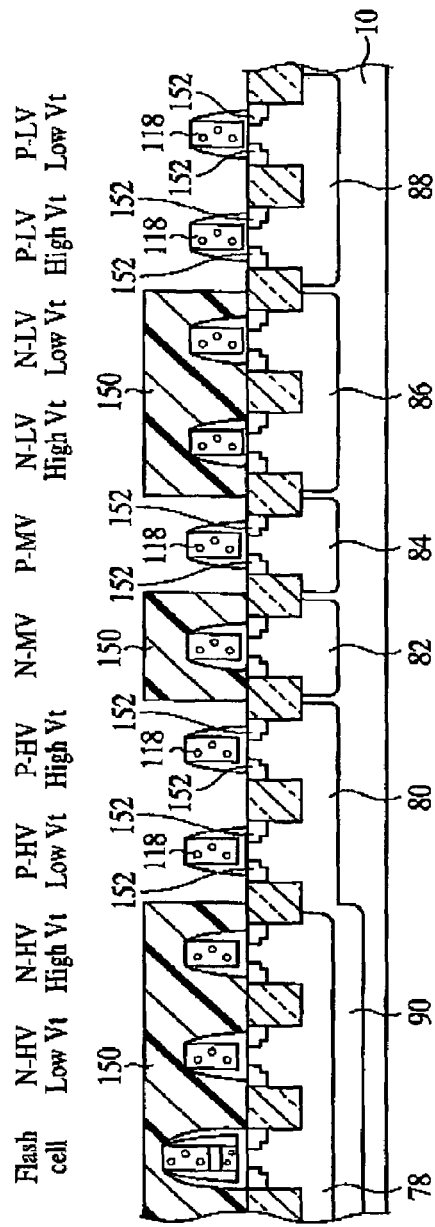

Then, ion implantation is performed with the photoresist film 150 as the mask to form the source/drain regions 152 of the p-channel transistors (P-HV Low Vt, P-HV High Vt, P-MV, P-LV High Vt, P-LV Low Vt) (FIG. 20A). Concurrently, by the ion implantation, the gate electrodes 118 of the p-channel transistors (P-HV Low Vt, P-HV High Vt, P-MV, P-LV High Vt, P-LV Low Vt) are doped to be p-type. The source/drain regions 152 are formed by implanting, e.g., boron ions under conditions of a 5 kev acceleration energy and a $4 \times 10^{15}$ $cm^{-2}$ dosage.

Nest, the photoresist film 150 is removed by, e.g., ashing.

Then, the upper parts of the gate electrodes 112, 118 and the source/drain regions 148, 152 are silicided by the known salicide process.

Thus, on the silicon substrate 10, the 11 kinds of the transistors are completed in the semiconductor device with the flash memory combined, and in the semiconductor device with no flash memory combined the 6 kinds of transistors are completed.

Figure 20B:
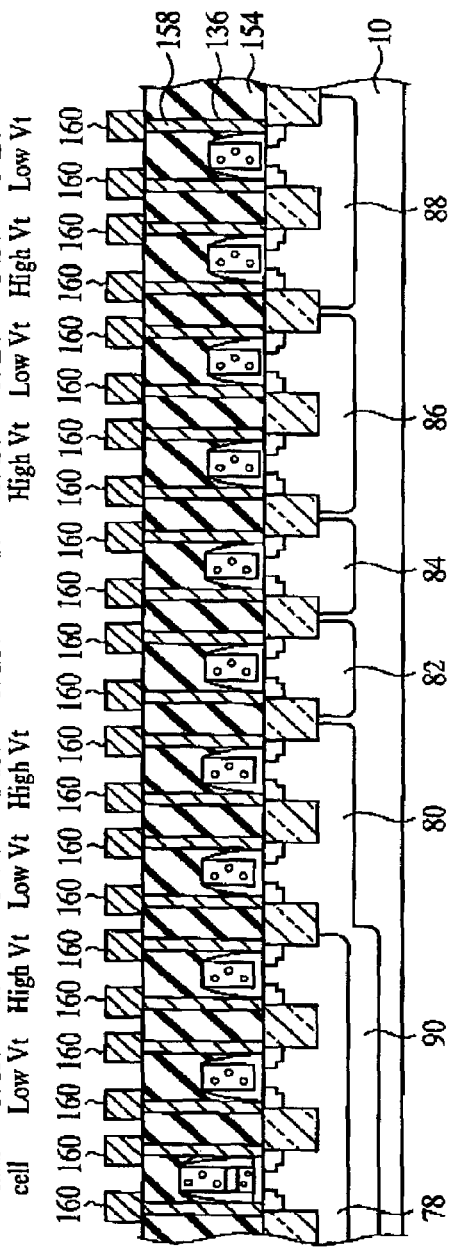

Then, on the silicon substrate 10 with the transistors, etc. formed on, an insulating film 154 is grown, and then contact holes 156, electrode plugs 158, interconnections 160, etc. are formed. Thus, the structure up to the first level-metal interconnection is completed (FIG. 20B).

Then, the growth of the insulating film and the formation of the interconnections, etc. are repeated to thereby form a multi-level interconnection layer 162 of a required number of layers on the insulating film 154.

Next, an insulating film 164 is grown on the multi-level interconnection layer 162, and contact holes 166, electrode plugs 168, interconnections 170, a pad electrode 172, etc. are formed. Thus, the structure up to the upper most-level metal interconnection is completed.

Figure 21:
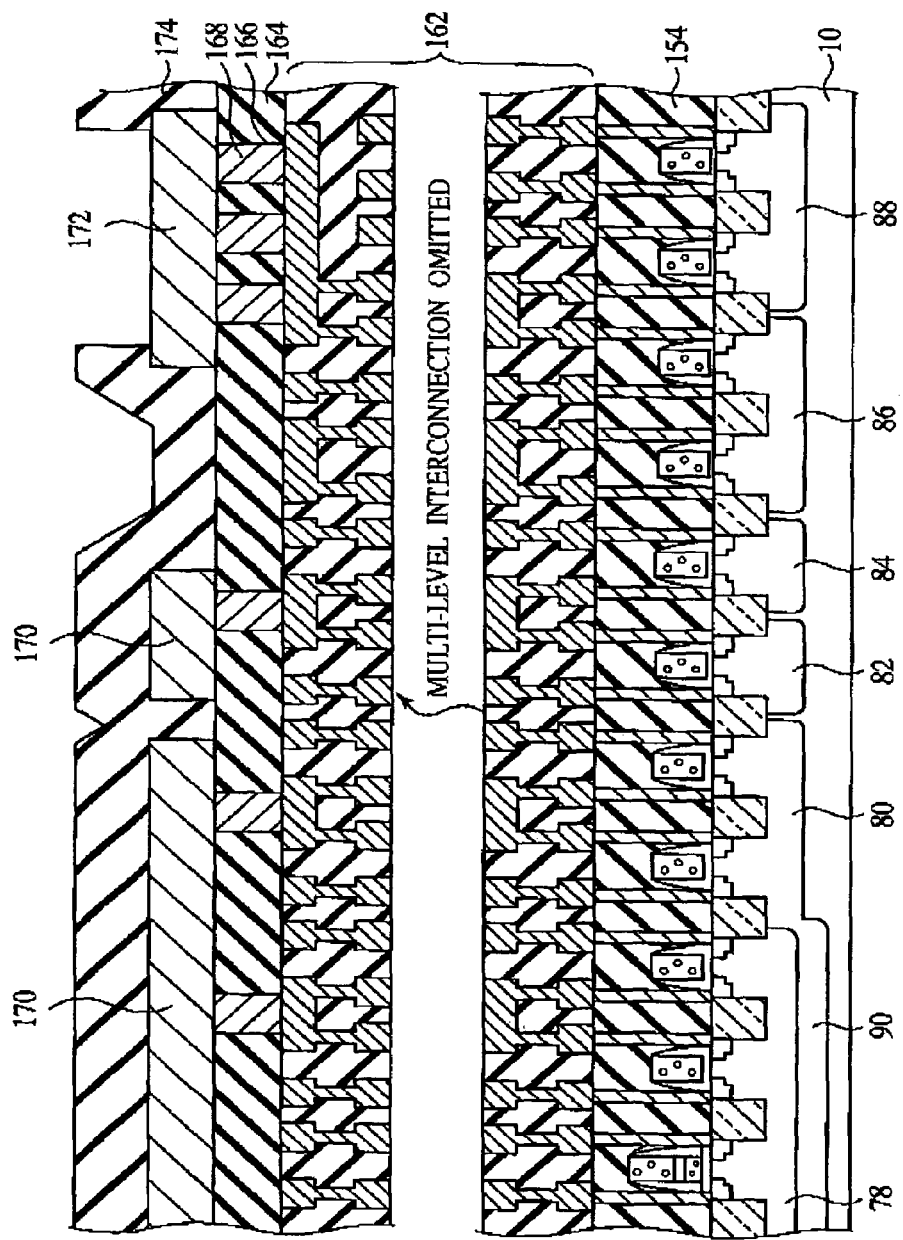

Next, on the insulating film 164 with the interconnection layer 170, the pad electrode 172, etc. formed on, a passivation film 174 is formed, and the semiconductor device is completed (FIG. 21).

As described above, according to the present embodiment, a difference in the STI recess amount between the semiconductor device with no flash memory combined and the semiconductor device with the flash memory combined is considered, and based on the difference, the curvature radius of the upper end of the active region of the semiconductor device with no flash memory combined and the curvature radius of the upper end of the active region of the semiconductor device with the flash memory combined are respectively controlled, whereby the reverse narrow channel effect due to the STI recess amount increased is compensated with the narrow channel effect due to the curvature radius increased of the upper end of the active layer, which permits the same common design macros to be applied to the logic transistors included in the semiconductor device with no flash memory combined and to the logic transistors included in the semiconductor device with the flash memory combined.

This allows the process technology without combining a flash memory to be developed with priority. The curvature radius of the upper end of the active region is increased, whereby the reliability of the tunnel gate insulating film of the flash memory can be improved. The recess amount increase is allowed, which facilitates the additional formation of tunnel oxide film and the gate insulating films of the high-voltage transistors.

A SECOND EMBODIMENT

Before a second and a third embodiments of the present invention are explained, 2 general methods the inventors of the present application know, which are for fabricating a semiconductor device combining 1.2 V operative low-voltage transistors forming a main logic circuit, 2.5 V operative middle-voltage transistors forming an input/output circuit, and 5 V operative high-voltage transistors forming non-volatile memory control circuit will be explained.

First, a first method for fabricating the semiconductor device will be explained with reference to FIGS. 22A to 24B. FIGS. 22A to 24B are sectional views of the semiconductor device in the steps of the first method for fabricating the semiconductor device, which show the method.

Figure 22A:
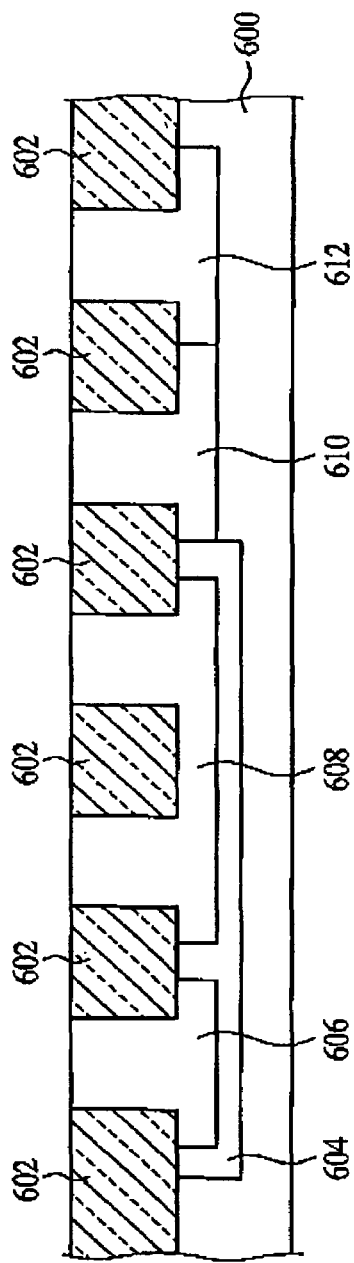

First, by the usual method, in a silicon substrate 600, a device isolation film 602, an n-well 604 formed in a region for a flash memory cell to be formed in and in a region for n-channel high-voltage transistors to be formed in, a p-well 606 formed in the region for the flash memory cell to be formed in, which is in the n-well 604, a p-well 608 formed in the region for the n-channel high-voltage transistors to be formed in, which is in the n-well 604, a p-well 610 formed in the region for the n-channel middle-voltage transistor to be formed in, an n-well 612 formed in the region for the p-channel low-voltage transistors to be formed in, etc. are formed (FIG. 22A).

Figure 22B:
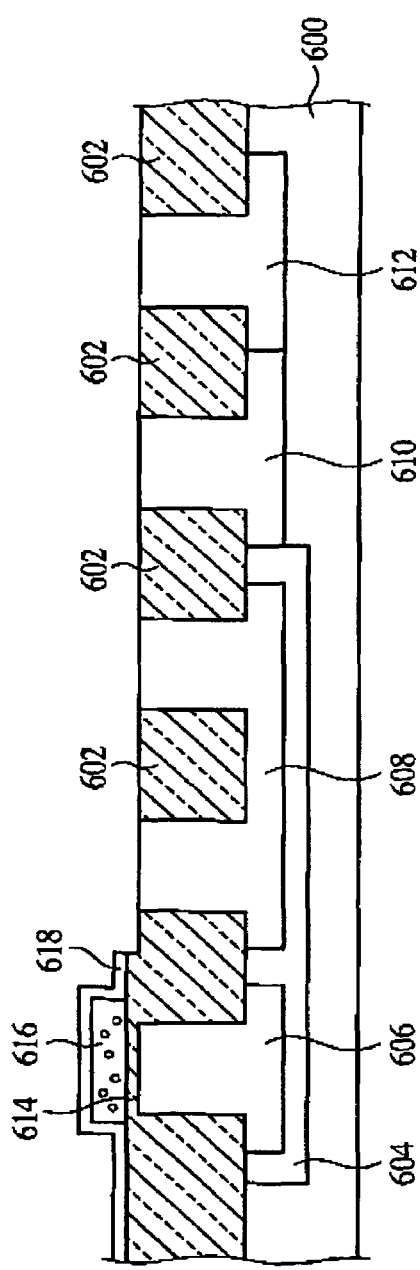

Next, by the usual method, a tunnel gate insulating film 614, a floating gate 616 and a dielectric film 618 of ONO are respectively formed, and then the silicon substrate 600 in the region for the high-voltage transistors to be formed in, the region for the middle-voltage transistors to be formed in and the region for the low-voltage transistors to be formed in are exposed (FIG. 22B).

Then, a silicon oxide film 620 of, e.g., a 13 nm-thick is grown by thermal oxidation.

Figure 23A:
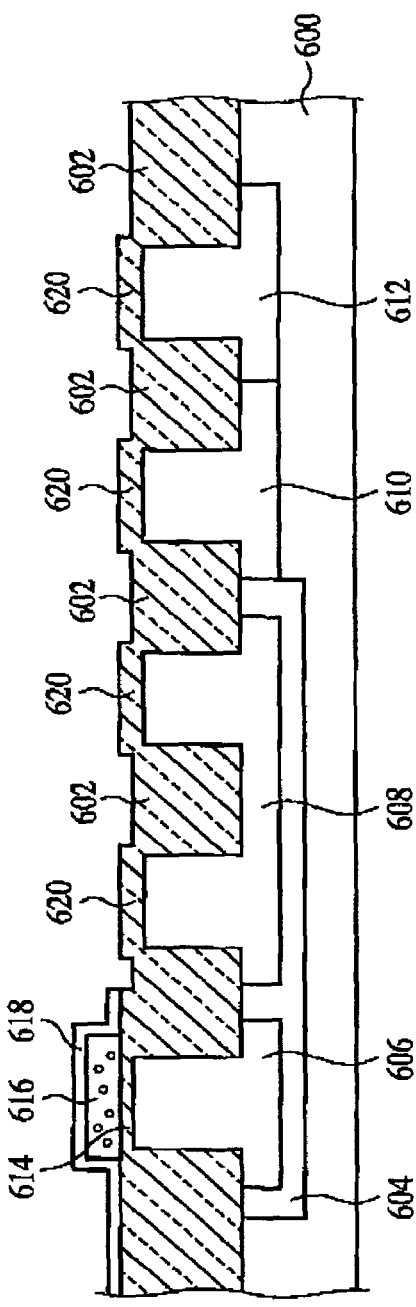
Figure 23B:
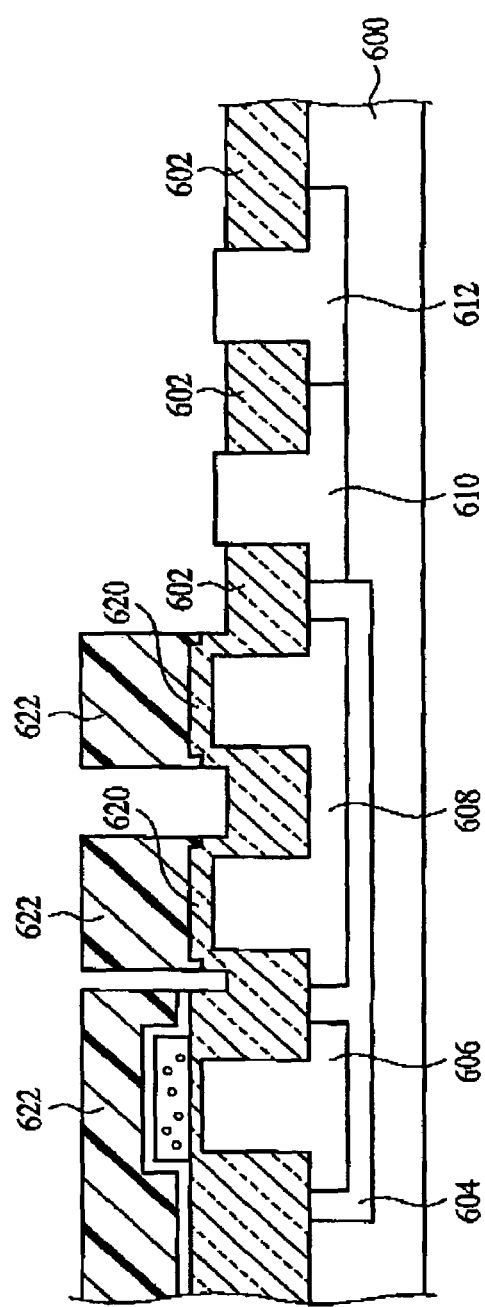

Then, the silicon oxide film 620 is patterned by photolithography and etching to expose the silicon substrate 600 in the region for the middle-voltage transistors to be formed in and the region for the low-voltage transistors to be formed in (FIG. 23B). At this time, the mask data of the photoresist film 622 used in etching the silicon oxide film 624 is prepared by shifting the respective data of the region for the flash memory cell to be formed in and the active regions of the region for the high-voltage transistors to be formed in, which are to be protected.

Then, a silicon oxide film 624 of, e.g., a 4.5 nm-thick is grown by thermal oxidation.

Next, the silicon oxide film 624 is patterned by photolithography and etching to expose the silicon substrate 600 in the region for the low-voltage transistors to be formed in (FIG. 24A). At this time, the mask data of the photoresist film 626 used in etching the silicon oxide film 624 is prepared by shifting the respective date of the region for the flash memory cell to be formed and the active regions of the region for the high-voltage transistors to be formed in and the active regions of the region for the middle-voltage transistors to be formed in, which are to be protected.

Then, a silicon oxide film of, e.g., a 2 nm-thick is grown by thermal oxidation. Thus, a gate insulating film 628 of the silicon oxide film of a 16.5 nm-thick is formed in the region for the high-voltage transistors to be formed in, a gate insulating film 630 of the silicon oxide film of a 5.5 nm-thick in the region for the middle-voltage transistors to be formed in, and a gate insulating film 632 of the silicon oxide film of a 2 nm-thick is formed in the region for the low-voltage transistor to be formed in.

Then, a polycrystalline silicon film is deposited and patterned to form gate electrodes 634, etc. of the polycrystalline silicon film (FIG. 24B).

In the first fabrication method described above, the mask opening the regions for the gate insulating film to be formed in is formed based data of the active regions to be protected but can be formed based on data of the active regions to be exposed.

Then, a second method for fabricating the semiconductor device in which the mask for opening the regions for the gate insulating film to be formed in is prepared based on the data of the active regions to be exposed will be explained with reference to FIGS. 25A-25B. FIGS. 25A and 25B are sectional views of the semiconductor device in the steps of the second method for fabricating the semiconductor device, which show the method.

First, in the same way as in the first fabrication method shown in FIGS. 22A to 23B, a silicon oxide film 620 is formed in the region for the high-voltage transistors to be formed in, and then the silicon substrate 600 in the region for the middle-voltage transistors to be formed in and the region for the low-voltage transistors to be formed in is exposed (FIG. 25A). The mask data of the photoresist film 622 to be used in etching the silicon oxide film 620 is prepared by shifting the respective data of the active regions of the region for the middle-voltage transistors to be formed in and the active regions of the region for the low-voltage transistors to be formed in, which are to be exposed.

Next, a silicon oxide film 624 of, e.g., a 4.5 nm-thick is grown by thermal oxidation.

Then, the silicon oxide film 624 is patterned by photolithography and etching to expose the silicon substrate in the region for the low-voltage transistors to be formed in (FIG. 25B). At this time, the mask data of the photoresist film 626 to be used in etching the silicon oxide film 624 is prepared by shifting the data of the active regions of the region for the low-voltage transistors to be formed in, which are to be exposed.

Then, in the same way as in the first fabrication method, e.g., a 2 nm-thick silicon oxide film is grown by thermal oxidation to form a 16.5 nm-thick gate insulating film 628, a 5.5 nm-thick gate insulating film 630 and a 2 nm-thick gate insulating film 632.

In the first fabrication method described above, the mask data of the photoresist film 62 is prepared based on the data of the active regions to be protected, and parts of the device isolation regions of the high-voltage region are accordingly exposed, riot covered by the photoresist film 622. The device isolation film 602 is partially etched in these regions in etching the silicon oxide film 620. Similarly in etching the silicon oxide film 624, the device isolation film is partially etched in these regions.

Accordingly, the thickness of the device isolation film 602 in the region for the high-voltage transistors to be formed in is reduced by etching twice the silicon oxide film. Specifically, in etching the silicon oxide film 620, the etching is equivalent to the thermal oxidation film of a 22.5 (=15×1.5) nm-thick so that the thermal oxidation film of, e.g., a 15 nm-thick is completely etched, and in etching the silicon oxide film 624, the etching is equivalent to the thermal oxidation film of a 7.5~8 (=5×1.5) nm-thick so that the thermal oxidation film of a 5 nm-thick is completely etched. Considering the etching rate of the CVD oxide film forming the device isolation film 602 is higher by about 1.5 times that of the thermal oxidation film, the device isolation film 602 is etched by about 45 (=30×1.5) nm. The depth of the STI by 0.12 μm technology is about 300 nm, and the device isolation film is reduced by 10% or more. This makes the decrease of the threshold voltage of the field parasitic MOS transistor and the increase of leakage current in the high-voltage operational region is significant. Deepening the STI can solve this problem, but increases the STI aspect ratio of the main logic circuit unit and makes it difficult fill the insulating material. Shallow STI in the main logic circuit unit and deep STI in the high-voltage circuit unit can solve such problem but adds to the fabrication steps.

In the second fabrication method, in which the photoresist films 622, 626 are prepared based on the data of the active regions to be exposed, the problem of the device isolation film 602 being thinned does not take place, as does in the first fabrication method. However, a problem in this case is the concavities between the device isolation regions and the low-voltage active regions exposed especially to the twice etching.

Figure 26A:
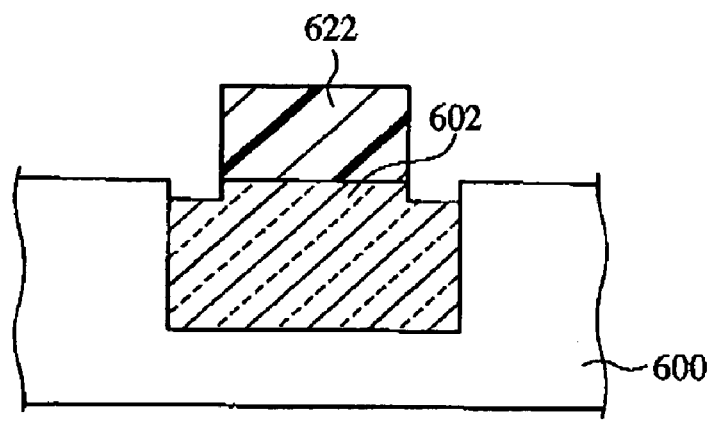
FIGS. 26A-26C are views explaining the problem of the second semiconductor fabrication method.
Figure 26B:
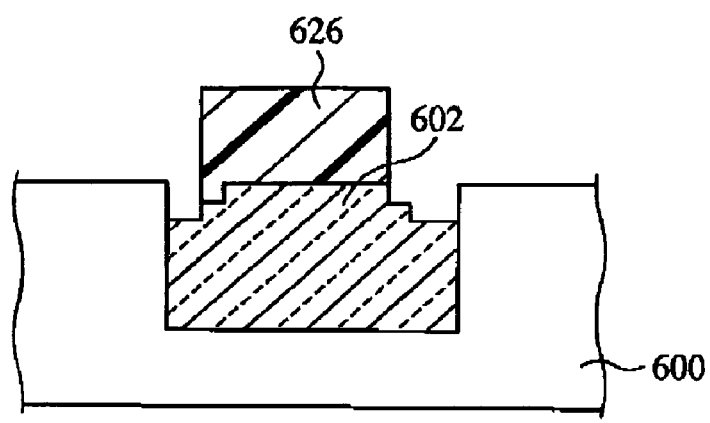
Figure 26C:
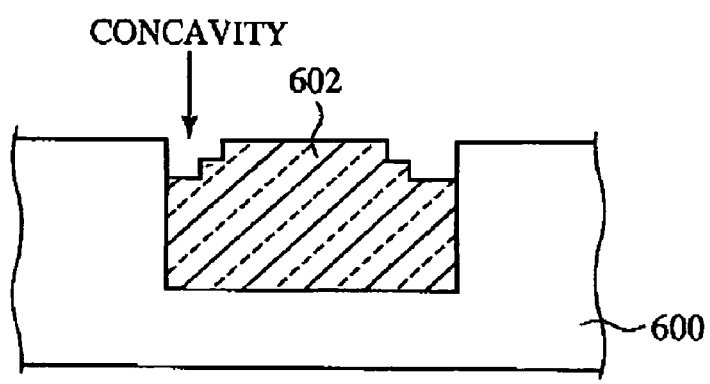

That is, in the step shown in FIG. 25A, a step is made between the active regions and the device isolation film 602 (see FIG. 26A). Furthermore, when misalignment takes place between the photoresist film 622 and the photoresist film 626, a step in the form of a flight of stairs is formed on the device isolation film 602 (see FIG. 26B). Accordingly, concavities having a complicated step are formed between the active regions and the device isolation film 602 (see FIG. 26C). In such concavities, etching residues of the gate polycrystalline silicon are often generated. In the low-voltage region, which requires the finest pattern, even slight residues lead to the short circuit between neighboring gate electrodes, which may cause the yield decrease.

In following two embodiments, the structure of the semiconductor device and the method for fabricating the same which can prevent the decrease of the device isolation film thickness in the high-voltage region and the generation of the residues by the steps on the device isolation region.

Next, the semiconductor device and the method for fabricating the same according to a second embodiment of the present invention will be explained with reference to FIGS. 27 to 45C.

Figure 27:
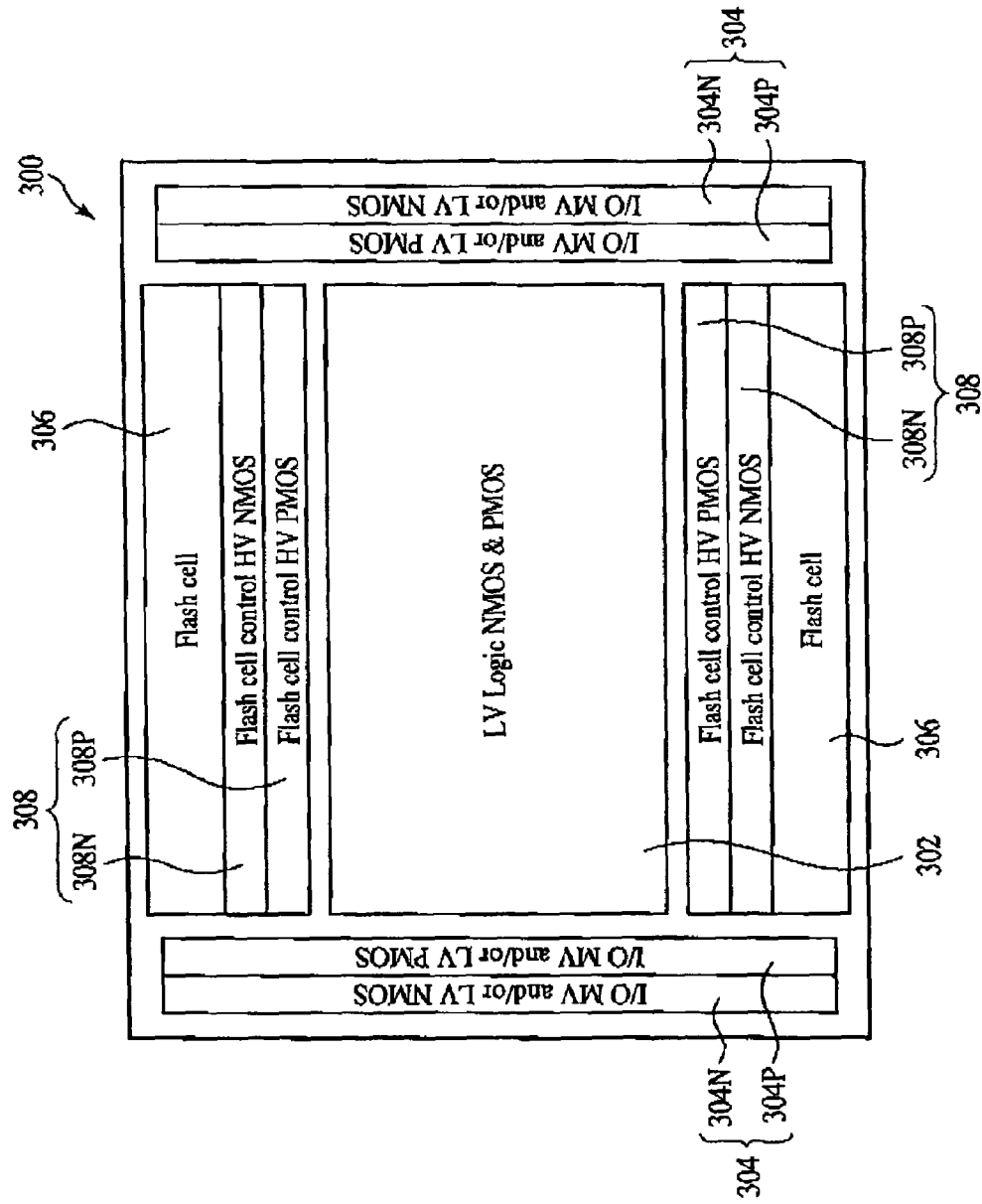
FIG. 27 is a plan view of the semiconductor device according to a second embodiment of the present invention, which shows a structure thereof.
Figure 28:
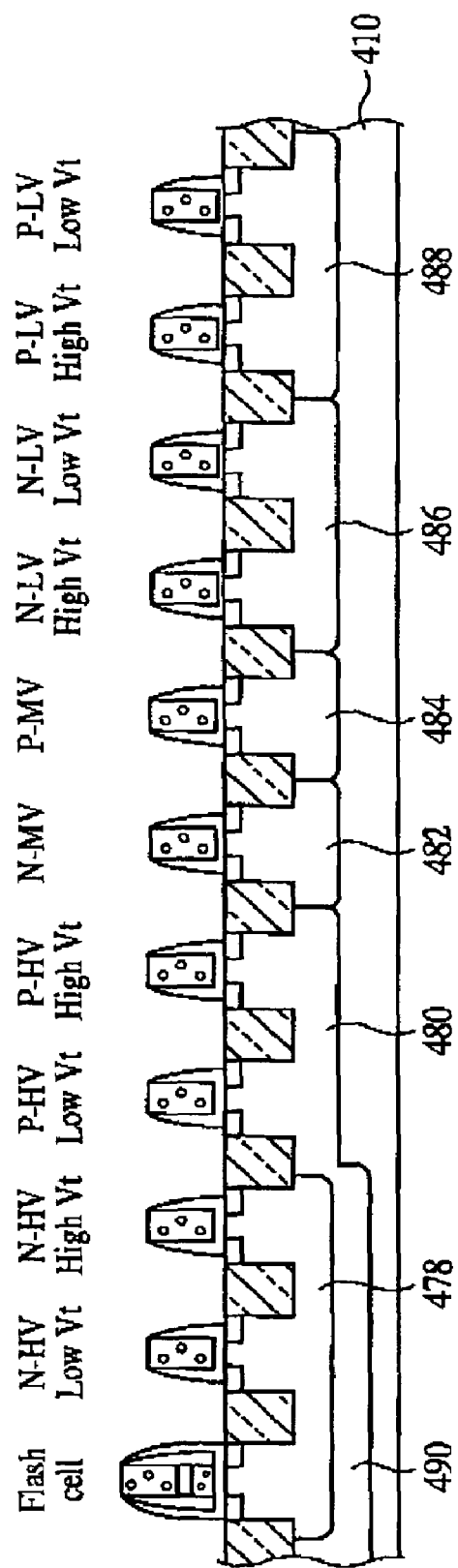

FIG. 27 is a chip conceptual view of the semiconductor device according to the present embodiment, which shows a structure thereof. FIG. 28 is a diagrammatic sectional view of the semiconductor device according to the present embodiment, which shows 11 kinds of transistors used in the semiconductor device. FIGS. 29A-29C are diagrammatic sectional views of the semiconductor device according to the present embodiment, which show the structure thereof. FIGS. 30A to 45C are sectional views of the semiconductor device according to the present embodiment in the steps of the method for fabricating the same, which show the method.

As shown in FIG. 27, the semiconductor device according to the present embodiment is a logic semiconductor device having a flash memory combined and includes a main logic circuit unit 302, input/output circuit units 304, flash memory cell units 306 and flash memory cell control circuit units 308. The input/output circuit units 304 each includes a PMOS unit 304P and an NMOS unit 304N, and the flash memory cell control circuit units 308 each include a PMOS unit 308P and an NMOS unit 308N.

As shown in FIG. 28, the semiconductor device according to the present embodiment includes a flash memory cell (Flash cell), an n-channel high-voltage/low-threshold voltage transistor (N-HV Low Vt) and an n-channel high-voltage/high-threshold voltage transistor (N-HV High Vt) formed in a p-well 478 formed in an n-well 490, a p-channel high-voltage/low-threshold voltage transistor (P-HV Low Vt) and p-channel high-voltage/high-threshold voltage transistor (P-HV High Vt) formed in an n-well 480, a n-channel middle-voltage transistor (N-MV) formed in a p-well 482, a p-channel middle-voltage transistor (P-MV) formed in an n-well 484, an n-channel low-voltage/high-threshold voltage transistor (N-LV High Vt) and an n-channel low-voltage/low-threshold voltage transistor. (N-LV Low Vt) formed in a p-well 486, and a p-channel low-voltage/high-threshold voltage transistor (P-LV High Vt) and a p-channel low-voltage/low-threshold voltage transistor (P-LV Low Vt) formed in an n-well 488.

The flash memory cell is a flash EPROM of a stack gate structure, and stores prescribed information in the floating gate in charges. The film thickness of the tunnel gate insulating film is independently decided in accordance with the charge retention characteristics, the lifetime of the oxide film, etc.

The n-channel high-voltage/low-threshold voltage transistor (N-HV Low Vt), the n-channel high-voltage/high-threshold voltage transistor (N-HV High Vt), the p-channel high-voltage/low-threshold voltage transistor (P-HV Low Vt) and the p-channel high-voltage/high-threshold voltage transistor (P-HV High Vt) are the transistors which form the flash memory cell control circuits 308 and to which 5 V-voltages are applied upon read and voltages up to 10 V or less are applied upon write and erase. The flash memory cell control circuits 308 require such high voltages, and the gate insulating film is thick.

The n-channel middle-voltage transistor (N-MV) and the p-channel middle-voltage transistor (P-MV) are the transistors which form the input/output circuit unit 304 and are 2.5 V operative or 3.3 V operative. The 2.5 V operative transistor and the 3.3 V operative transistor are different from each other in the gate insulating film thickness, the threshold voltage control conditions and the LDD conditions. However, both are not required to be concurrently mounted. Generally, only either of them is mounted.

The n-channel low-voltage/high-threshold voltage transistor (N-LV High Vt), the n-channel low-voltage/low-threshold voltage transistor (N-LV Low Vt), the p-channel low-voltage/high-threshold voltage transistor (P-LV High Vt) and the p-channel low-voltage/low-threshold voltage transistor (P-LV Low Vt) are the transistors which form the main logic circuit unit 302. These transistors use ultra-thin film gate insulating film for the improvement of the performance of the main logic circuit unit 302.

As described above, in the semiconductor device according to the present embodiment, in addition to the tunnel gate insulating film, 3 kinds of gate insulating films of different film thicknesses must be formed. To this end, the region for the low-voltage transistors to be formed in are exposed to 2 etching steps in the process of forming the gate insulating film, and the device isolation film is etched in these steps. The region for the middle-voltage transistors to be formed in are exposed to one etching step in the process of forming the gate insulating film, and the device isolation film is etched in this step.

The semiconductor device according to the present embodiment is characterized mainly in that the steps on the device isolation film, which is formed by these etching steps is formed in the region of the device isolation film corresponding to the edges of the low-voltage operative wells and the edges of the middle-voltage operative wells. This characteristic of the semiconductor device according to the present embodiment will be explained.

FIG. 29A is a diagrammatic sectional view of the case that the region for the high-voltage transistors including the flash memory cell to be formed in and the region for the middle-voltage transistors to be formed in are formed adjacent to the region for the low-voltage transistors to be formed in. As shown in FIG. 29A, the n-well 480 formed in the region for the high-voltage transistors to be formed in and the p-well 486 formed in the region for the low-voltage transistors to be formed in are spaced from each other, and the device isolation film 422 is formed in the silicon substrate 410 between the n-well 480 and the p-well 486. The n-well 488 formed in the region for the low-voltage transistors to be formed in and the p-well 482 formed in the region for the middle-voltage transistors to be formed in are spaced from each other, and the device isolation film 422 is formed in the silicon substrate 410 between the n-well 488 and the p-well 482.

FIG. 29B is an enlarged diagrammatic sectional view of the region between the n-well 480 and the p-well 486. As shown in FIG. 29B, in the region of the surface of the device isolation film 422, corresponding to the edge of the p-well 486, the step 412 in stairs is formed by the 2 etching steps of the process for forming the gate insulating films. The concavities 414 formed in the edge of the device isolation film 422 adjacent to the active regions are formed not in forming the gate insulating film but in forming the device isolation film 422 by STI.

FIG. 29C is an enlarged diagrammatic sectional view of the region between the n-well 488 and the p-well 482. As shown in FIG. 29C, in the region of the surface of the device isolation film 422, corresponding to the edge of the n-well 488, a step 412 in stairs is formed by the 2 etching steps of the process for forming the gate insulating films. In the region corresponding to the edge of the p-well 482, a step 416 is formed by the one etching step of the process for forming the gate insulating film. The concavities 414 formed in the edge of the device isolation film 422 adjacent to the active regions are formed not in forming the gate insulating films but in forming the device isolation film 422 by STI.

The step 412 is formed on the device isolation film 422 in parts corresponding to the edge (bordering edge) of the CMOS well (p-well 486, n-well 488) in the region for the low-voltage transistors to be formed in but is not formed in the rest region of the device isolation film 422. Similarly, a step 416 is formed on the device isolation film 422 in parts corresponding to the edge (bordering edge) of the CMOS well (p-well 482, n-well 484) in the region for the middle-voltage transistors to be formed in but is not formed in the rest regions of the device isolation film 422. The steps 412, 416 are not formed in the region for the flash memory cell to be formed in and the region for the high-voltage transistors to be formed in.

Such characteristic of the semiconductor device according to the present embodiment is produced by preparing the patterns of the etching masks used in the process for forming the gate insulating films, based on the data of the low-voltage operative wells (p-well 486, n-well 488) and the middle-voltage operative well (p-well 484, n-well 484). The patterns of the etching masks are produced based on the data of these wells, whereby the steps are not formed in the device isolation film in the region for the high-voltage transistors to be formed in, and the thickness of the device isolation film in larger anywhere in the high-voltage operative wells (p-well 478, n-wells 480, 490) than in the low-voltage operative wells and the middle-voltage operative wells. Thus, the threshold voltage of the all the field parasitic transistors in the high-voltage operative region can be retained high.

In the semiconductor device according to the present embodiment as well as in the second fabrication method described above, the steps 412, 416 are formed on the surface of the device isolation film 422. However, the regions where the steps 412, 416 are formed are regions of the device isolation film 422 corresponding to the well edges and are considered to be some spaced from the edges of the active regions, the width of the concavities is sufficient large. Thus, the polycrystalline silicon film formed above can be patterned without any residue.

However, unless the width of the concavities is narrow, the residues will take place, as in the second method described above. Accordingly, it is preferable that the data is checked so that the edges of the active regions and the edges of the wells are above a certain spacing and is corrected as required. It is preferable that the spacing between the edges of the active regions and the edges of the wells is set at 10 times or more. In the present embodiment, the spacing is set at about 400 nm or more.

As described above, the steps 412, 416 are formed on the device isolation film in parts corresponding to the edges (bordering edges) of the CMOS well (p-well 486, n-well 488) of the region for the low-voltage transistors to be formed in but are not formed in the rest region of the device isolation film 422. Accordingly, the steps involved in forming the gate insulating films are never formed in the main logic circuit unit 302, and the generation of residues of the polycrystalline silicon film can be prevented. Accordingly, the polycrystalline silicon interconnections can be arranged by closest packing of polycrystalline silicon interconnections, which can meet the downsizing of devices.

Then, the method for fabricating the semiconductor device according to the present embodiment will be explained with reference to FIGS. 30A to 45C. FIGS. 30A to 44 are sectional views of the semiconductor device in the steps of the method for fabricating the whole semiconductor device, which show the method. FIGS. 45A-45C are partial sectional views of the semiconductor device in the steps of the method for fabricating the same, which make clear the positional relationships among the masks, the active regions, the wells, etc.

Figure 30A:
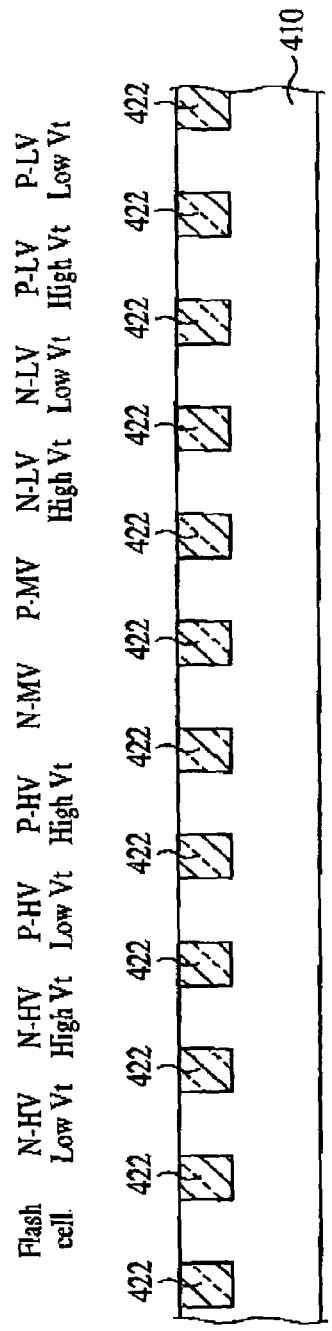

First, a device isolation film 422 for defining active regions is formed in a silicon substrate 410 by STI (Shallow Trench Isolation) method (FIG. 30A). A silicon oxide film of, e.g., a 10 nm-thick is grown by thermal oxidation. Next, a silicon nitride film of, e.g., a 100 nm-thick is grown by CVD method. Then, the silicon nitride film, the silicon oxide film and the silicon substrate 410 are sequentially etched by photolithography and dry etching to form trenches of, e.g., 300 nm-depth in the silicon substrate 410. Then, the silicon substrate 410 is thermally oxidized to form a silicon oxide film inside surfaces of the trenches. Then, a silicon oxide film of, e.g., a 550 nm-thick is grown by, e.g., high density plasma CVD method. Next, the silicon oxide film is planarized by CMP method until the silicon nitride film is exposed to form the device isolation film 422 of the silicon oxide film buried in the trenches.

In FIG. 30A, the active regions defined by the device isolation film 422 are, sequentially from the left, the region for a flash memory cell (Flash cell) to be formed in, the region for an n-channel high-voltage/low-threshold voltage transistor (N-HV Low Vt) to be formed in, the region for an n-channel high-voltage/high-threshold voltage transistor (N-HV High Vt), the region for a p-channel high-voltage/low-threshold voltage transistor (P-HV Low Vt) to be formed in, the region for a p-channel high-voltage/high-threshold voltage transistor (P-HV High Vt) the region for an n-channel middle-voltage transistor (N-MV) to be formed in, the region for a p-channel middle-voltage transistor (P-MV) to be formed in, the region for an n-channel low-voltage/high-threshold voltage transistor (N-LV High Vt) to be formed in, the region for an n-channel low-voltage/low-threshold voltage transistor (N-LV Low Vt) to be formed in, the region for a p-channel low-voltage/high-threshold voltage transistor (P-LV High Vt) to be formed in and the region for a p-channel low-voltage/low-threshold voltage transistor (P-LV Low Vt) to be formed in.

Then, the silicon nitride film and the silicon oxide film used in forming the device isolation film 422 are removed, and then the silicon substrate 410 is thermally oxidized to grow a silicon oxide film 424 of, e.g., a 10 nm-thick as a sacrificial oxidation film.

Then, a photoresist film 426 exposing the region for the flash memory cell (Flash cell) to be formed in and the region for the n-channel high-voltage transistors (N-HV High Vt, N-HV Low Vt) to be formed in, and covering the rest region is formed by photolithography.

Figure 30B:
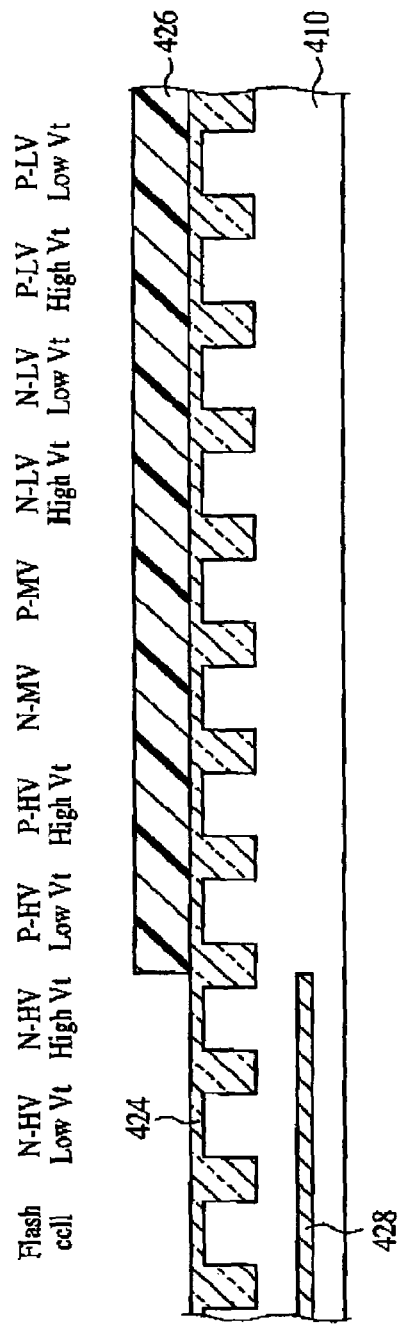

Then, with the photoresist film 426 as the mask, ion implantation is performed to form an n-type buried impurity doped layer 418 in the region for the flash memory cell (Flash cell) to be formed in and the region for the n-channel high-voltage transistors (N-HV High Vt, N-HV Low Vt) to be formed in (FIG. 30B). The n-type buried impurity doped layer 428 is formed by implanting, e.g., phosphorus ions under conditions of a 2 MeV acceleration energy and a $2\times10^{13}$ cm$^{-2}$ dosage.

Next, the photoresist film 426 is removed by, e.g., ashing.

Then, a photoresist film 430 exposing the region for the flash memory cell (Flash cell) to be formed in, the region for the n-channel middle-voltage transistor (N-MV) to be formed in and the region for the n-channel low-voltage transistors (N-LV High Vt, N-LV Low Vt) to be formed in, and covering the rest region is formed by photolithography.

Then, ion implantation is performed with the photoresist film 430 as the mask to form an impurity doped layers 432, 434 for p-well in the region for the flash memory cell (Flash cell) to be formed in, the region for the n-channel middle-voltage transistor (N-MV) to be formed in and the region for the n-channel low-voltage transistors (N-LV High Vt, N-LV Low Vt) to be formed in (FIG. 31A). The impurity doped layer 432 for p-well is formed by implanting, e.g., boron ions under conditions of a 400 keV acceleration energy and a $1.5\times10^{13}$ cm$^{-2}$ dosage. The impurity doped layer 434 for p-well is formed by implanting, e.g., boron ions under conditions of a 100 keV acceleration energy and a $2\times10^{12}$ cm$^{-2}$ dosage.

Next, the photoresist film 430 is removed by, e.g., ashing.

Then, a photoresist film 436 exposing the region for the n-channel high-voltage/high-threshold voltage transistor (N-HV High Vt) to be formed in, the region for the n-channel middle-voltage transistor (N-MV) to be formed in and the region for the n-channel low-voltage transistors (N-LV High Vt, N-LV Low Vt) to be formed in and covering the rest region is formed by photolithography.

Then, ion implantation is performed with the photoresist film 436 as the mask to form an impurity doped layers 438, 440 for p-well in the region for the n-channel high-voltage/high-threshold voltage transistor (N-HV High Vt) to be formed in, the region for the n-channel middle-voltage transistor (N-MV) to be formed in and the region for the n-channel low-voltage transistors (N-LV High Vt, N-Lv Low Vt) to be formed in (FIG. 31B). The impurity doped layer 438 for p-well is formed by implanting, e.g., boron ions under conditions of a 100 keV acceleration energy and a $6\times10^{12}$ cm$^{-2}$ dosage.

Then, the photoresist film 436 is removed by, e.g., ashing.

Then, a photoresist film 442 exposing the region for the p-channel high-voltage transistors (P-HV Low Vt, P-HV High Vt) to be formed in, the region for the p-channel middle-voltage transistor (P-MV) to be formed in and the region for the p-channel low-voltage transistors (P-LV High Vt, P-LV Low Vt) to be formed in and covering the rest region is formed by photolithography.

Figure 32A:
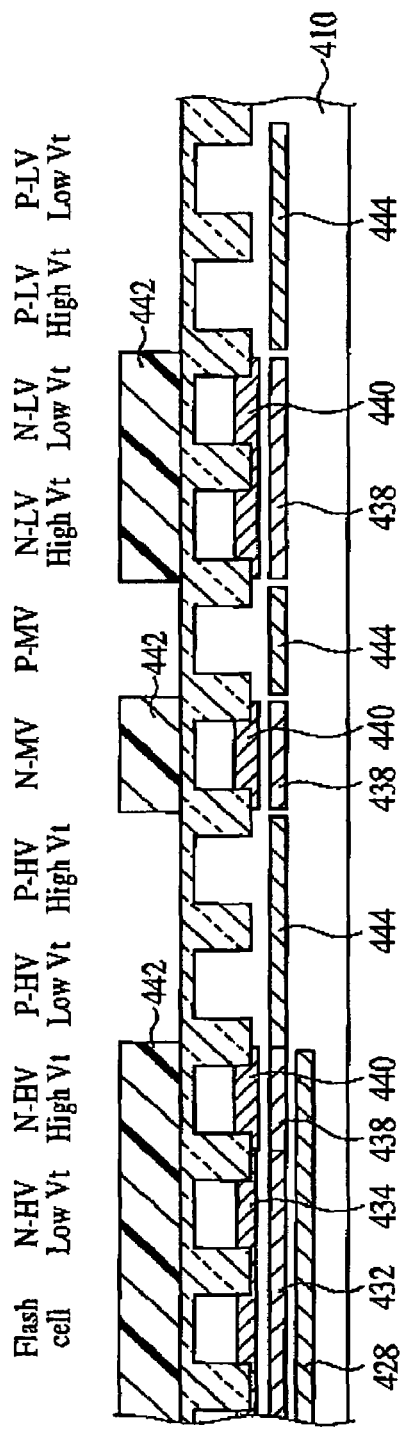

Next, with the photoresist film 442 as the mask, ion implantation is performed to form an impurity doped layer 444 for n-well in the region for the p-channel high-voltage transistors (P-HV Low Vt, P-HV High Vt) to be formed in, the region for the p-channel middle-voltage transistor (P-MV) to be formed in and the region for the p-channel low-voltage transistors (P-LV High Vt, P-LV Low Vt) to be formed in (FIG. 32A). The impurity doped layer 444 for n-well is formed by implanting, e.g., phosphorus ions under conditions of a 600 keV acceleration energy and a $1.5\times10^{13}$ cm$^{-2}$ dosage, and phosphorus ions under conditions of a 240 keV acceleration energy and a $3\times10^{12}$ cm$^{-2}$ dosage. Under these conditions, the p-channel high-voltage/low-threshold voltage transistor (P-HV Low Vt) of an about −0.2 V threshold voltage can be obtained.

Next, the photoresist film 442 is removed by, e.g., ashing.

Then, a photoresist film 446 exposing the region for the p-channel high-voltage/high-threshold voltage transistor (P-HV High Vt) to be formed in, the region for the p-channel middle-voltage transistor (P-MV) to be formed in and the region for the p-channel low-voltage transistors (P-LV High Vt, P-LV Low Vt) to be formed in and covering the rest region is formed by photolithography.

Figure 32B:
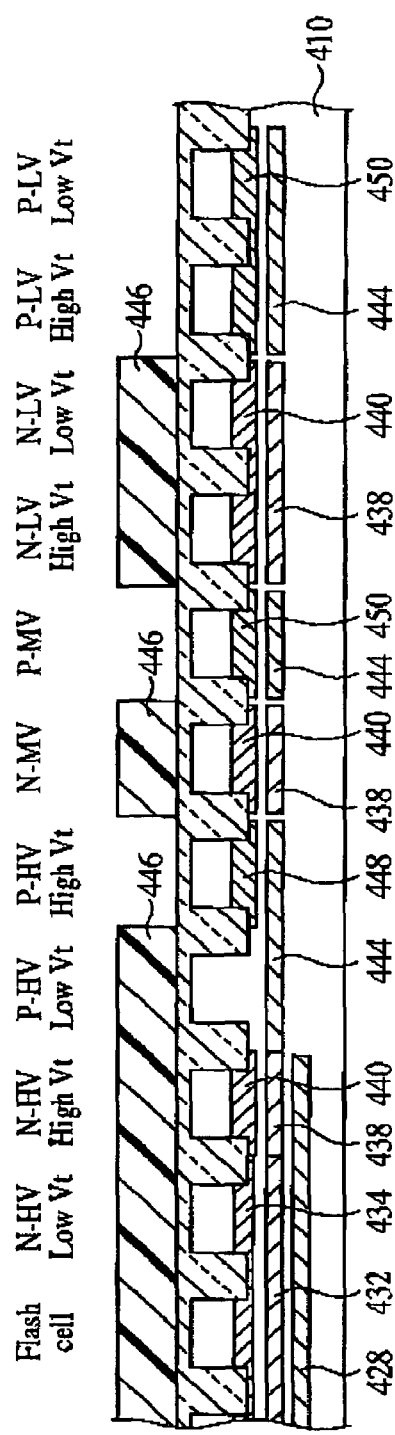

Next, with the photoresist film 446 as the mask, ion implantation is performed to form an impurity diffused layer 448 for a threshold voltage control in the region for the p-channel high-voltage/high-threshold voltage transistor (P-HV High Vt) to be formed in and the region for the p-channel middle-voltage transistor (P-MV) to be formed in, and to form a channel stop layer 450 in the region for the p-channel low-voltage transistors (P-LV High Vt, P-LV Low Vt) to be formed in (FIG. 32B). The impurity doped layer 448 for the threshold voltage control and the channel stop layer 450 are formed by implanting, e.g., phosphorus ions under conditions of a 240 keV acceleration energy and a $5\times10^{12}$ cm$^{-2}$ dosage, Under these conditions, the p-channel high-voltage/high-threshold voltage transistor (P-HV High Vt) of an about −0.6 V threshold voltage can be obtained.

Next, the photoresist film 446 is removed by, e.g., ashing.

Then, a photoresist film 452 exposing the flash memory cell (Flash cell) to be formed in and covering the reset region is formed by photolithography.

Figure 33A:
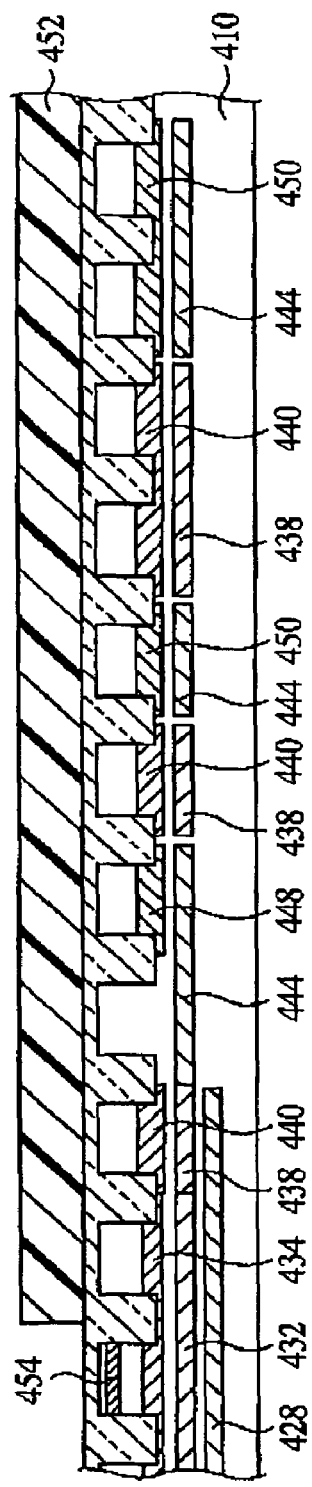

Next, with the photoresist film 452 as the mask, ion implantation is performed to form an impurity doped layer 454 for a threshold voltage control in the region for the flash memory (Flash cell) to be formed in (FIG. 33A). The impurity doped layer 454 for the threshold voltage control is formed by implanting, e.g., boron ions under conditions of a 40 keV acceleration energy and a $6\times10^{13}$ cm$^{-2}$ dosage.

Next, the photoresist film 452 is removed by, e.g., ashing.

Figure 33B:
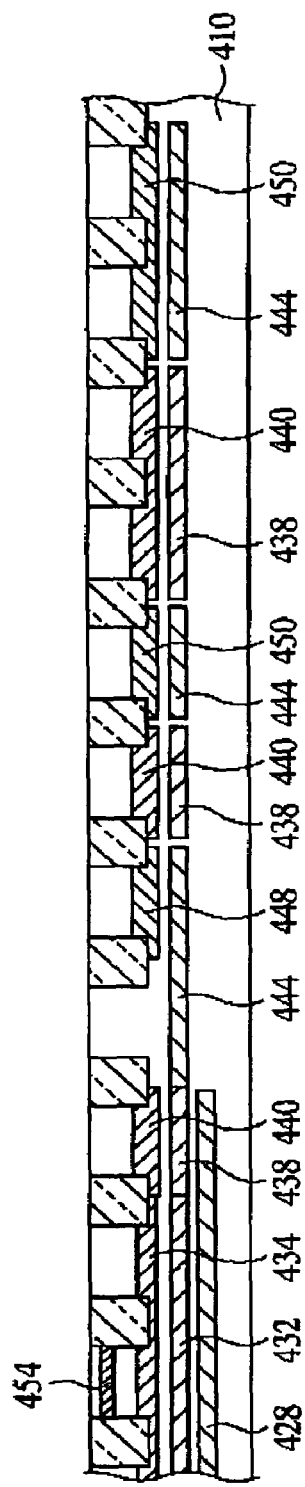

Then, the silicon oxide film 424 as the sacrificial oxidation film is removed by hydrofluoric acid aqueous solution (FIG. 33B).

Then, thermal oxidation is performed, e.g., at 900-1050° C. to form a 10 nm-thick tunnel oxide film 456 on the active regions.

Then, a phosphorus doped polycrystalline silicon film of, e.g., a 90 nm-thick is grown on the tunnel oxide film 456 by, e.g., CVD method.

Then, the polycrystalline silicon film is patterned by photolithography and dry etching to form a floating gate 458 of the polycrystalline silicon film in the region for the flash memory cell (Flash cell) to be formed in.

Figure 34A:
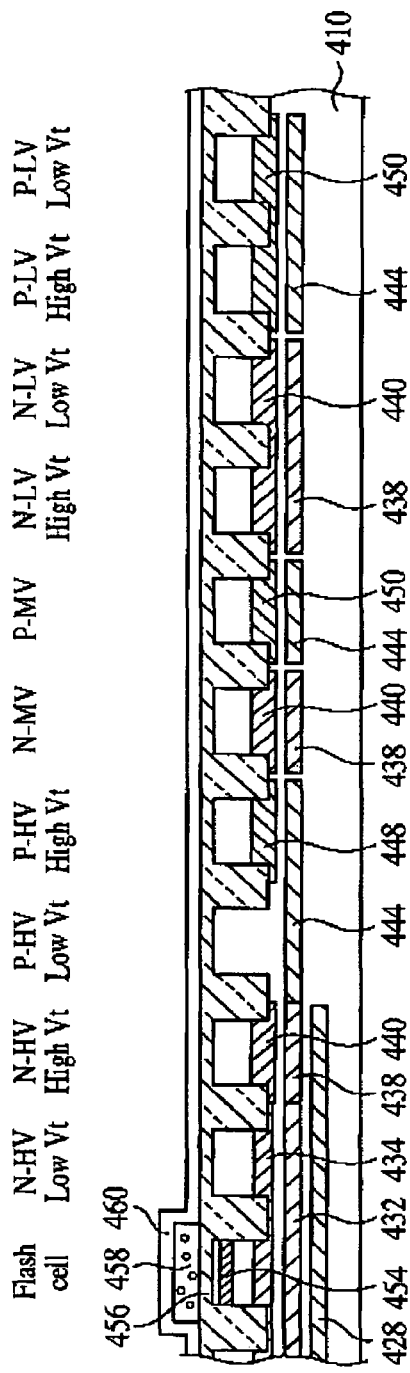

Next, on the tunnel oxide film 456 with the floating gate 458 formed on, a silicon oxide film of, e.g., a 5 nm-thick and a silicon nitride film of, e.g., a 10 nm-thick are formed by CVD method. Then, the surface of the silicon nitride film is thermally oxidized at 950° C. for 90 minutes to grow a silicon oxide film of an about 30 nm-thick. Thus, an ONO film 460 of silicon oxide/silicon nitride/silicon oxide structure (FIG. 34A).

Then, a photoresist film 462 exposing the region for the n-channel middle-voltage transistor (N-MV) to be formed in and covering the rest region is formed by photolithography.

Figure 34B:
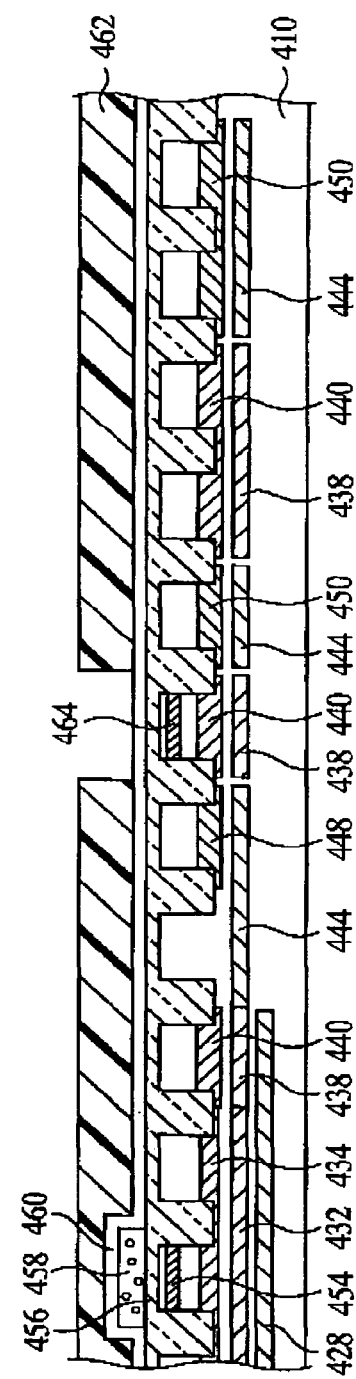

Then, with the photoresist film 462 as the mask, ion implantation is performed to form an impurity doped layer 464 for a threshold voltage control in the region for the n-channel middle-voltage transistor (N-MV) to be formed in (FIG. 34B). The impurity doped layer 464 for the threshold voltage control is formed by implanting, e.g., boron ions under conditions of a 30 keV acceleration energy and a $5 \times 10^{12}$ cm$^{-2}$ dosage.

Then, the photoresist film 462 is removed by, e.g., ashing.

Then, a photoresist-film 466 exposing the region for the p-channel middle-voltage transistor (P-MV) to be formed in and covering the reset region is formed by photolithography.

Then, with the photoresist film 466 as the mask, ion implantation is performed to form an impurity doped layer 468 for a threshold voltage control in the region for the p-channel middle-voltage transistor (P-MV) to be formed in (FIG. 35A). The impurity doped layer 468 for the threshold voltage control is formed by implanting, e.g., arsenic ions under conditions of a 150 keV acceleration energy and a $3 \times 10^{12}$ cm$^{-2}$ dosage, and an about $-0.3 \sim -0.4$ V threshold voltage is obtained.

Next, the photoresist film 466 is removed by, e.g., ashing.

Then, a photoresist film 470 exposing the region for the n-channel low-voltage/high-threshold voltage transistor (N-LV High Vt) to be formed in and covering the rest region is formed by photolithography.

Next, with the photoresist film 470 as the mask, ion implantation is performed to form an impurity doped layer 472 for a threshold voltage control in the region for the n-channel low-voltage/high-threshold voltage transistor (N-LV High Vt) to be formed in (FIG. 35B). The impurity doped layer 472 for the threshold voltage control is formed by implanting, e.g., boron ions under conditions of a 10 keV acceleration energy and a $5 \times 10^{12}$ cm$^{-2}$ dosage, and an about +0.2 V threshold voltage is obtained.

Next, the photoresist film 470 is removed by, e.g., ashing.

Next, a photoresist film 474 exposing the region for the p-channel low-voltage/high-threshold voltage transistor (P-LV High Vt) to be formed in and covering the rest region is formed by photolithography.

Figure 36A:
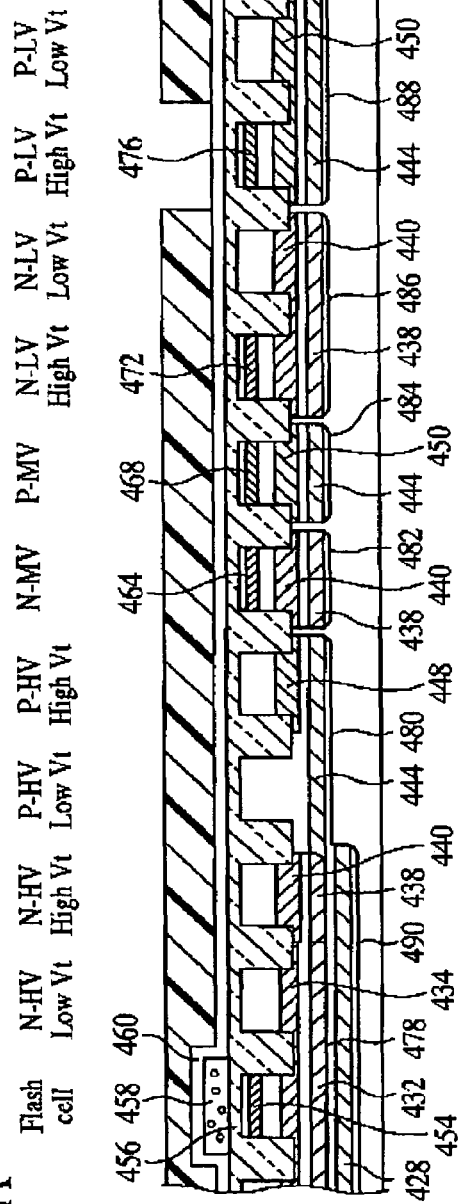

Next, with the photoresist film 474 as the mask, ion implantation is performed to form an impurity doped layer 476 for a threshold voltage control in the region for the p-channel low-voltage/high-threshold voltage transistor (P-LV High Vt) to be formed in (FIG. 36A). The impurity doped layer 476 for the threshold voltage control is formed by implanting, e.g., arsenic ions under conditions of a 100 keV acceleration energy and a $5 \times 10^{12}$ cm$^{-2}$ dosage, and an about $-0.2$ V threshold voltage is obtained.

Then, the photoresist film 474 is removed by, e.g., ashing.

Thus are formed a p-well 478 formed in the region for the flash memory cell (Flash cell) to be formed in and the region for the n-channel high-voltage transistors (N-HV Low Vt, N-HV High Vt) to be formed in and including the impurity doped layers 432, 434, 438, 440 for p-well and the impurity doped layer 454 for the threshold voltage control, an n-well 480 formed in the region for the p-channel high-voltage transistors (F-HV Low Vt, P-HV High Vt) to be formed in and including the impurity doped layers 444, 448 for n-well, a p-well 482 formed in the region for the n-channel middle-voltage transistor (N-MV) to be formed in and including the impurity doped layers 438, 440 for p-well, an n-well 484 formed in the region for the p-channel middle-voltage transistor (P-MV) to be formed in and including the impurity doped layer 444 for n-well, the channel stop layer 450 and the impurity doped layer 468 for the threshold voltage control, a p-well 486 formed in the region for n-channel low-voltage transistors (N-LV High Vt, N-LV Low Vt) to be formed in and including the impurity doped layers 432, 434, 438, 440 for p-well and the impurity doped layer 472 for the threshold voltage control, and an n-well 488 formed in the region for the p-channel low-voltage transistors (P-LV High Vt, P-LV tow Vt) to be formed in and including the impurity doped layer 444 for n-well, the channel stop layer 450 and the impurity doped layer 428 for the threshold voltage control. The n-well 480 functions as the n-well 490 surrounding the p-well 478 in cooperation with the n-type buried impurity doped layer 428. That is, the p-well 478 is the double well formed in the n-well 490 (see FIG. 36A).

Then, a photoresist film 492 covering the region for the flash memory cell (Flash cell) to be formed in and exposing the rest region is formed by photolithography.

Then, the ONO film 460 is etched by, e.g., dry etching with the photoresist film 492 as the mask to remove the ONO film 460 in the region other than the region for the flash memory cell (Flash cell) to be formed in.

Figure 36B:
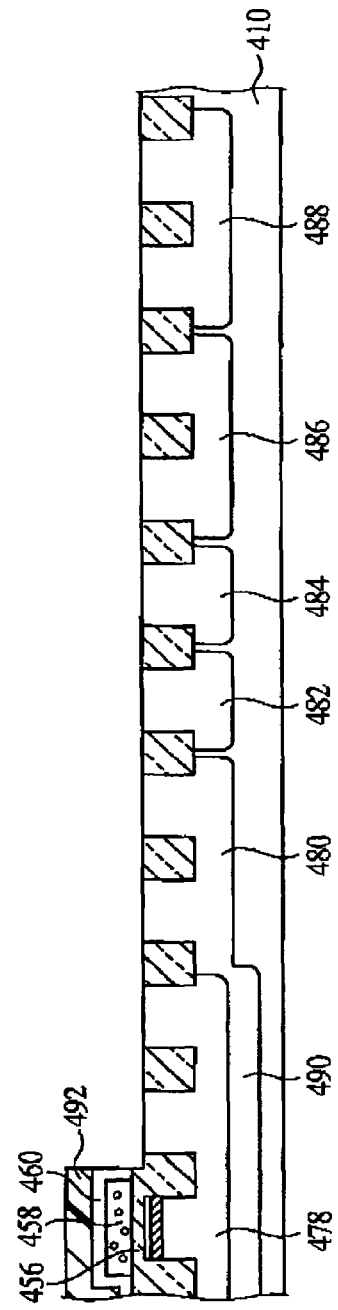

Then, the tunnel oxide film 456 is etched by wet etching using, e.g., hydrofluoric acid aqueous solution with the photoresist film 492 as the mask to remove the tunnel oxide film 456 in the region other than the region for the flash memory cell (Flash cell) to be formed in (FIG. 36B, FIG. 45A).

Then, the photoresist film 492 is removed by, e.g., ashing.

Next, thermal oxidation is performed at 850° C. to form a 13 nm-thick silicon oxide film 494 on the active regions.

Then, a photoresist film 496 covering the region for the flash cell (Flash Cell) to be formed in and the region for the high-voltage transistors (N-HV Low Vt, N-HV High Vt, P-HV Low Vt, P-HV High Vt) to be formed in and exposing the rest region is formed by photolithography.

The pattern of the photoresist film 496 is prepared based on the data of the low-voltage operative wells (p-well 486, n-well 488) and the middle-voltage operative wells (p-well 482, n-well 484) as shown in FIG. 45B. Them ask data for forming these wells are used as it is or are shifted to be larger on respective sides by a certain value, e.g., about 1 µm.

Then, the silicon oxide film 494 is etched off by wet etching using, e.g., hydrofluoric acid aqueous solution with the photoresist film 496 as the mask to remove the silicon oxide film 494 in the region for the middle-voltage transistors (N-MV, P-MV) to be formed in and the region for the low-voltage transistors (N-LV Low Vt, N-LV High Vt, P-LV Low Vt, P-LV High Vt) to be formed in (FIG. 37A).

In this etching step, the device isolation film 422 is also etched. However, the edges of the photoresist film 496 are located only on the device isolation film 422 corresponding to the edges of the low-voltage operative wells (p-well 486, n-well 488) and the middle-voltage operative wells (p-well 482, n-well 484), and the steps 412, 416 are formed only In these regions (see FIGS. 29B and 29C).

Then, the photoresist film 496 is removed by, e.g., ashing.

Then, thermal oxidation is performed at, e.g., 850° C. to form a 4.5 nm-thick silicon oxide film 498 in the active regions of the region for the middle-voltage transistors (N-MV, P-MV) to be formed in and the region for the low-voltage transistors (N-LV Low Vt, N-LV High Vt, P-LV Low Vt, P-HV High Vt) to be formed in. In this thermal oxidation step, the film thickness of the silicon oxide film 494 is increased.

Next, a photoresist film 500 covering the region for the flash memory cell (Flash cell) to be formed in, the region for the high-voltage transistors (N-HV Low Vt, N-HV High Vt, P-HV Low Vt, P-HV High Vt) to be formed in and the region for the middle-voltage transistors (N-MV, P-MV) to be formed in and exposing the region for the low-voltage transistors (N-LV Low Vt, N-LV High Vt, P-LV Low Vt, P-LV High Vt) to be formed in is formed by photolithography.

The pattern of the photoresist film 500 is prepared based on the data of the low-voltage operative wells (p-well 486, n-well 488) as shown in FIG. 45C. The mask data for forming these wells are used as it is or are shifted to be larger on respective sides by a certain value, e.g., about 1 μm.

Then, the silicon oxide film 498 is etched by wet etching using, hydrofluoric acid aqueous solution with the photoresist film 500 as the mask to remove the silicon oxide film 498 in the region for the low-voltage transistors (N-LV Low Vt, N-LV High Vt, P-LV Low Vt, P-LV High Vt) to be formed in (FIG. 37B).

In this etching step, the device isolation film 422 is etched. However, the edges of the photoresist film 500 are located only on the device isolation film 422 corresponding to the edges of the low-voltage operative wells (p-well 486, n-well 488), and the steps 412 are formed only in these regions (see FIGS. 29B and 29C).

Next, the photoresist film 500 is removed by, e.g., ashing.

Figure 38A:
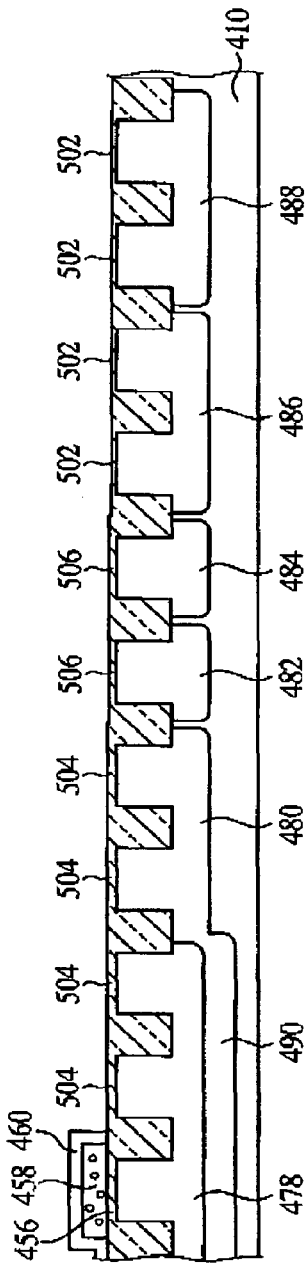

Then, thermal oxidation is performed at, e.g., 850° C. to form a gate insulating film 502 of a 2.2 nm-thick silicon oxide film in the active regions of the region for the low-voltage transistors (N-LV Low Vt, N-LV High Vt, P-LV Low Vt, P-LV High Vt) to be formed in. In this thermal oxidation step, the thicknesses of the silicon oxide film 494, 498 are increased, and a gate insulating film 504 of a 16 nm-total film thickness and a gate insulating film 506 of a 5.5 nm-total film thickness are formed respectively in the region for the high-voltage transistors (N-HV Low Vt, N-HV High Vt, P-HV Low Vt, P-HV High Vt) to be formed in and in the region for the middle-voltage transistors (N-MV, P-MV) to be formed in (FIG. 38A).

Then, an undoped polycrystalline silicon film 508 of, e.g., a 180 nm-thick is formed by CVD method.

Next, a silicon nitride film 520 of, e.g., a 30 nm-thick is formed on the polycrystalline silicon film 508 by plasma CVD method. The silicon nitride film 510 functions as an anti-reflection film and the etching mask in patterning the lower polycrystalline silicon film 508 and also functions to protect the gate electrode of the logic unit in oxidization of the side wall of the gate electrode of the flash cell, which will be described later.

Figure 38B:
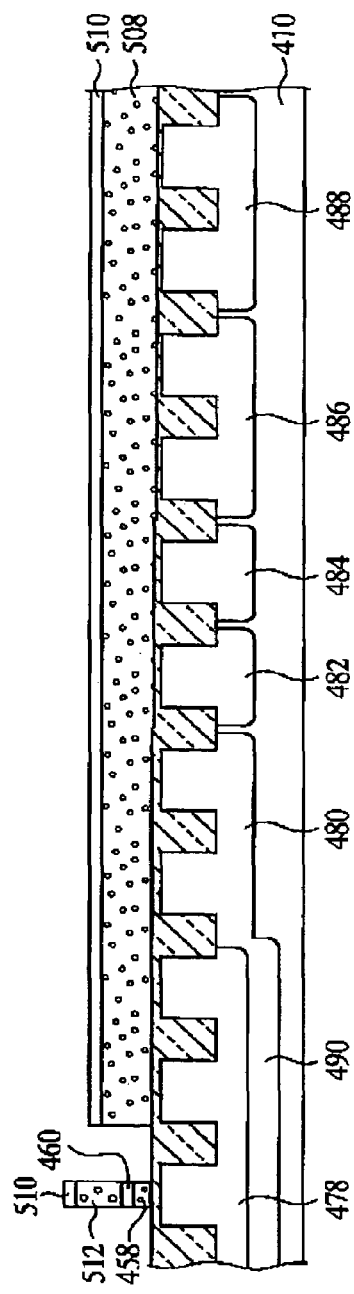

Then, by photolithography and dry etching, the silicon nitride film 510, the polycrystalline silicon film 508, the ONO film 460 and the floating gate 458 in the region for the flash memory cell (Flash cell) to be formed in are patterned to form the gate electrode 512 of the polycrystalline silicon film 508, etc. of the flash memory cell (Flash cell) (FIG. 38B).

Then, the side wall of the gate electrode 512 of the flash memory cell (Flash cell) is thermally oxidized by about 10 nm and the ion implantation is performed to form the source/drain region 514.

Then, the side wall of the gate electrode 512 is again thermally oxidized by about 10 nm.

Next, a silicon nitride film is deposited by, e.g., thermal CVD method, and then this silicon nitride film and the silicon nitride film 510 are etched back to form a sidewall insulating film 516 of the silicon nitride films on the side wall of the gate electrode 512.

Figure 39A:
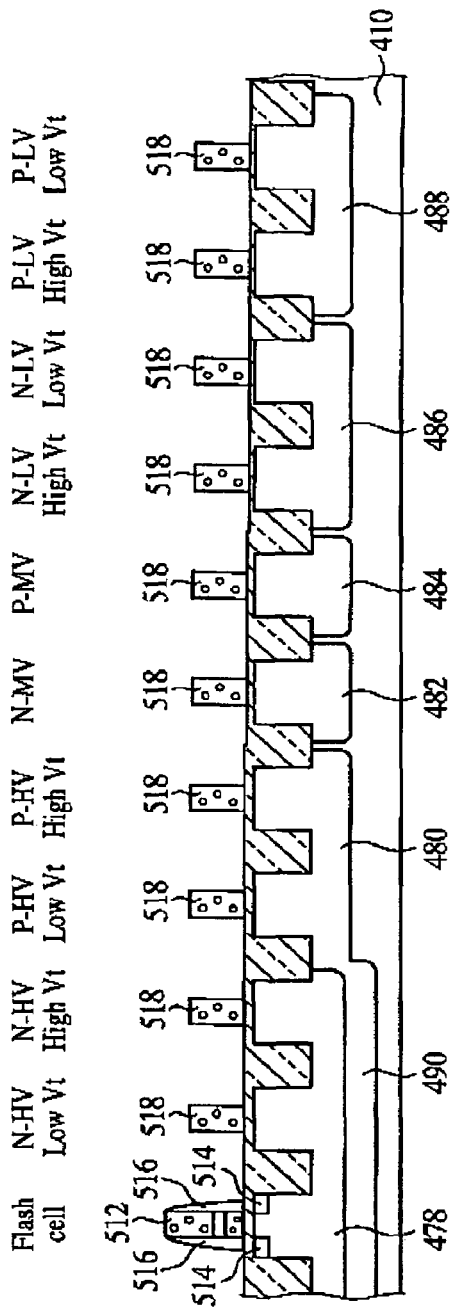

Then, by photolithography and dry etching, the polycrystalline silicon film 508 in the region for the high-voltage transistors (N-HV Low Vt, N-HV High Vt, P-HV Low Vt, P-HV High Vt) to be formed in, the region for the middle-voltage transistors (N-MV, P-MV) to be formed in and the region for the low-voltage transistors (N-LV Low Vt, N-LV High Vt, P-LV Low Vt, P-LV High Vt) to be formed in is patterned to form gate electrodes 518 of the polycrystalline silicon film 508 (FIG. 39A).

At this time, the steps 412, 416 formed in the process of forming the gate insulating films 502, 504, 506 are present on the device isolation film 422 in parts corresponding to the edges of the low-voltage operative wells (p-well 486, n-well 488) and the middle-voltage operative wells (p-well 482, mn-well 484) (see FIGS. 45B and 45C). However, the well edges and the active region edges are sufficiently spaced from each other, and the width of the concavities is sufficiently large. Thus, the polycrystalline silicon film 508 is prevented from remaining as residues in the concavities.

Then, a photoresist film 520 exposing the region for the p-channel low-voltage transistors (P-LV Low Vt, P-LV High Vt) to be formed in and covering the rest region is formed by photolithography.

Figure 39B:
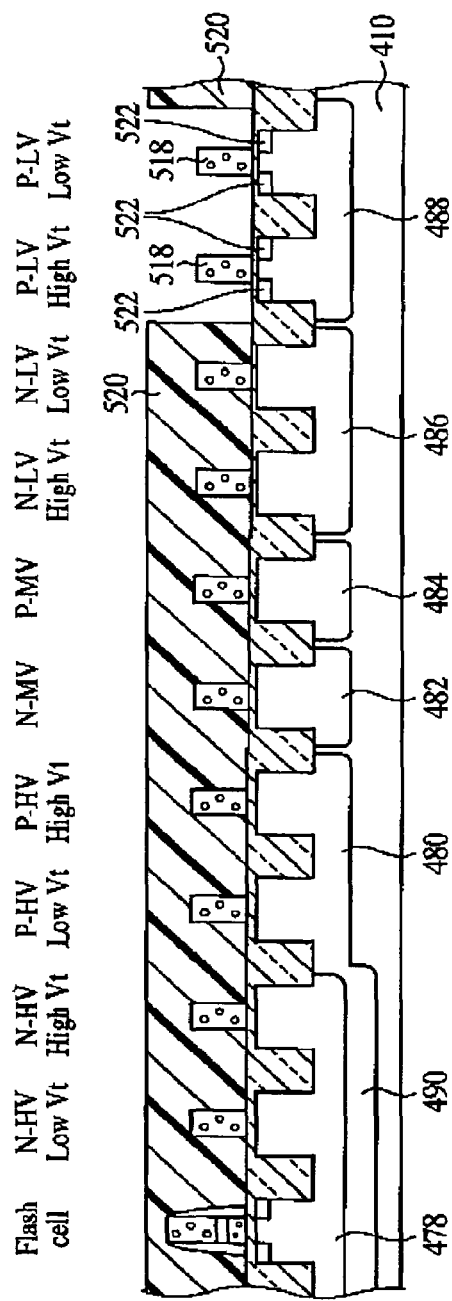

Then, ion implantation is performed with the photoresist film 520 as the mask to form the extensions 522 of the source/drain regions of the p-channel low-voltage/high-threshold voltage transistors (P-LV High Vt) and the p-channel low-voltage/low-threshold voltage transistor (P-LV Low Vt) (FIG. 39B). The extensions 522 having the pocket regions are formed by implanting, e.g., boron ions at a 0.5 keV acceleration energy and a $3.6\times10^{14}$ cm$^{-2}$ dosage in 0° to the substrate normal, and arsenic ions at a 80 keV acceleration energy and a $6.5\times10^{12}$ cm$^{-2}$ dosage in 4 directions tilted by 28° to the substrate normal.

Next, the photoresist film 520 is removed by, e.g., ashing.

Then, a photoresist film 524 exposing the region for the n-channel low-voltage transistors (N-LV Low Vt, N-LV High Vt) to be formed in and covering the rest region is formed by photolithography.

Figure 40A:
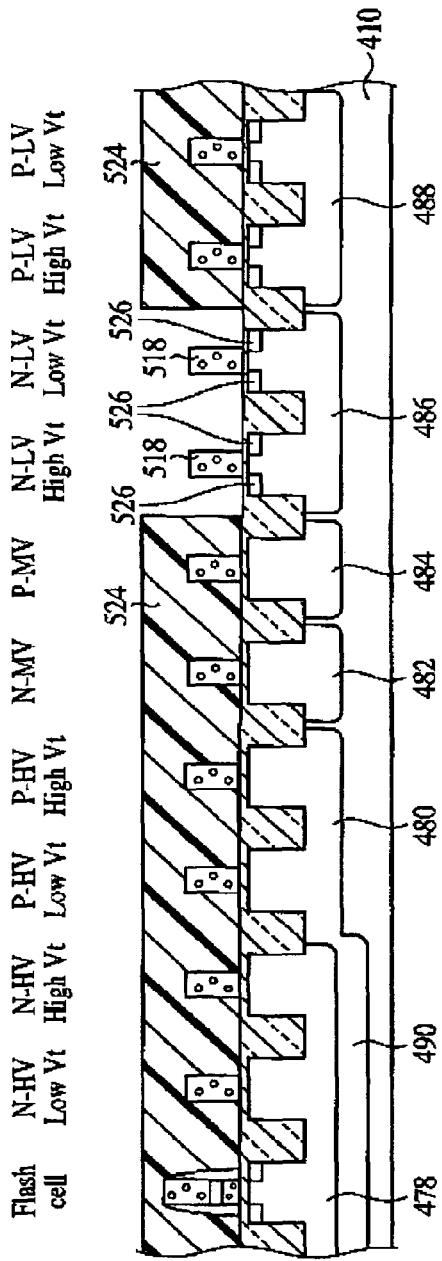

Then, ion implantation is performed with the photoresist film 524 as the mask to form the extensions 526 of the source/drain regions of the n-channel low-voltage/high-threshold voltage transistor (N-LV High Vt) and the n-channel low-voltage/low-threshold voltage transistor (N-LV Low Vt) (FIG. 40A). The extensions 526 having the pocket regions are formed by implanting, e.g., arsenic ions at a 3 keV acceleration energy and a $1.1\times10^{15}$ cm$^{-2}$ dosage in 0° to the substrate normal, and boron fluoride ions (BF$^+$) at a 35 kev acceleration energy and a $9.5\times10^{12}$ cm$^{-2}$ dosage in 4 direction tilted by 28° to the substrate normal.

Next, the photoresist film 524 is removed by, e.g., ashing.

Next, a photoresist film 528 exposing the region for the p-channel middle-voltage transistor (P-MV) to be formed in, and covering the rest region is formed by photolithography.

Figure 40B:
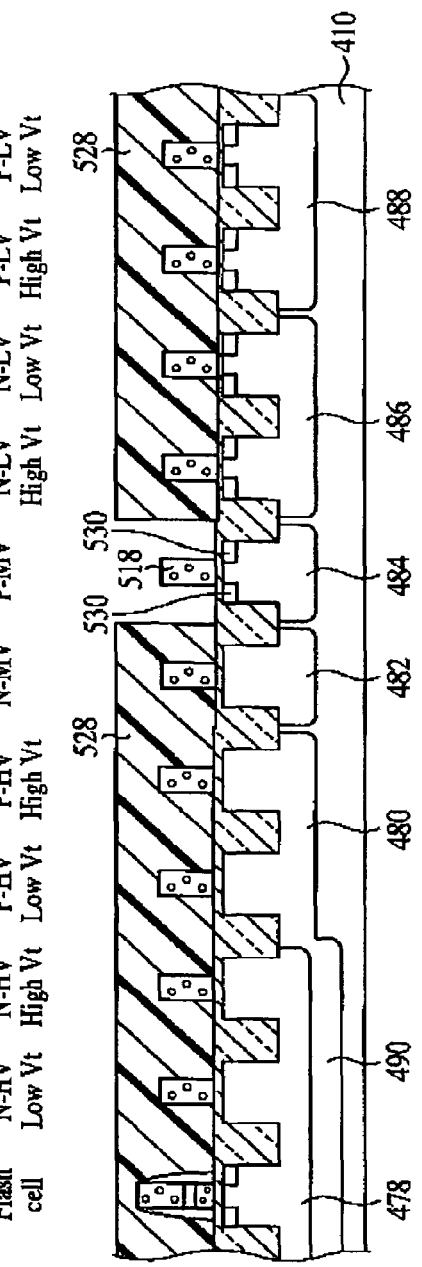

Then, ion implantation is performed with the photoresist film 528 as the mask to form the extensions 530 of the source/drain region of the p-channel middle-voltage transistor (P-MV) (FIG. 40B). The extensions 520 are formed by implanting, e.g., boron fluoride ions under conditions of a 10 keV acceleration energy and a $7\times10^{13}$ cm$^{-2}$ dosage.

Then, the photoresist film 528 is removed by, e.g., ashing.

Then, a photoresist film 532 exposing the region for the n-channel middle-voltage transistor (N-MV) to be formed in and covering the rest region is formed by photolithography.

Figure 41A:
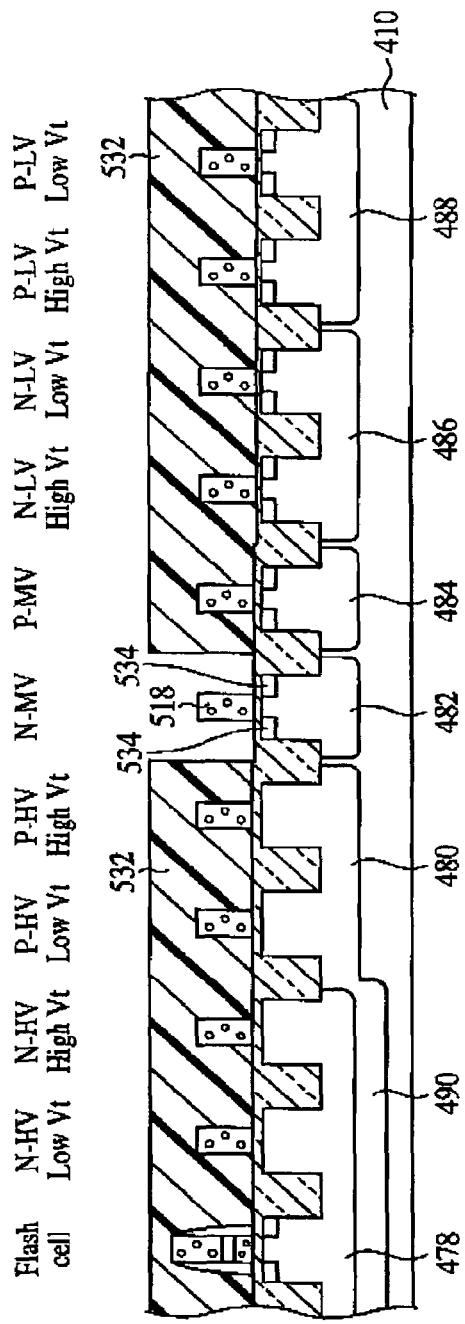

Then, ion implantation is performed with the photoresist film 532 as the mask to form the extensions 534 of the source/drain region of the n-channel middle-voltage transistor (N-MV) (FIG. 41A). The extensions 534 are formed by implanting, e.g., arsenic ions under conditions of a 10 keV acceleration energy and a $2\times10^{13}$ cm$^{-2}$ dosage and, e.g., phosphorus ions under conditions of a 10 keV acceleration energy and a $3\times10^{13}$ cm$^{-2}$ dosage.

Next, the photoresist film 532 is removed by, e.g., ashing.

Then, a photoresist film 536 exposing the region for the p-channel high-voltage transistors (P-HV Low Vt, P-HV High Vt) to be formed in and covering the rest region is formed by photolithography.

Figure 41B:
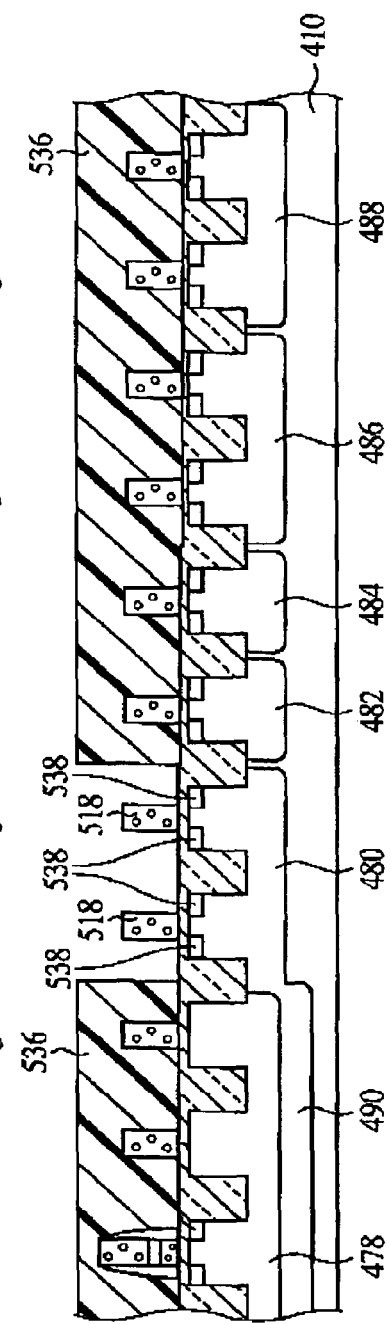

Next, ion implantation is performed with the photoresist film 536 as the mask to form the extensions 538 of the source/drain regions of the p-channel high-voltage/low-threshold voltage transistor (P-HV Low Vt) and the p-channel high-voltage/high-threshold voltage transistor (P-HV High Vt) (FIG. 41B). The extensions 538 are formed by implanting, e.g., boron fluoride ions under conditions of a 80 keV acceleration energy and a $4.5 \times 10^{13}$ cm$^{-2}$ dosage.

Next, the photoresist film 536 is removed by, e.g., ashing.

Then, a photoresist film 540 exposing the region for the n-channel high-voltage transistors (N-HV Low Vt, N-HV High Vt) to be formed in and covering the rest region is formed by photolithography.

Figures 42A, 42B:
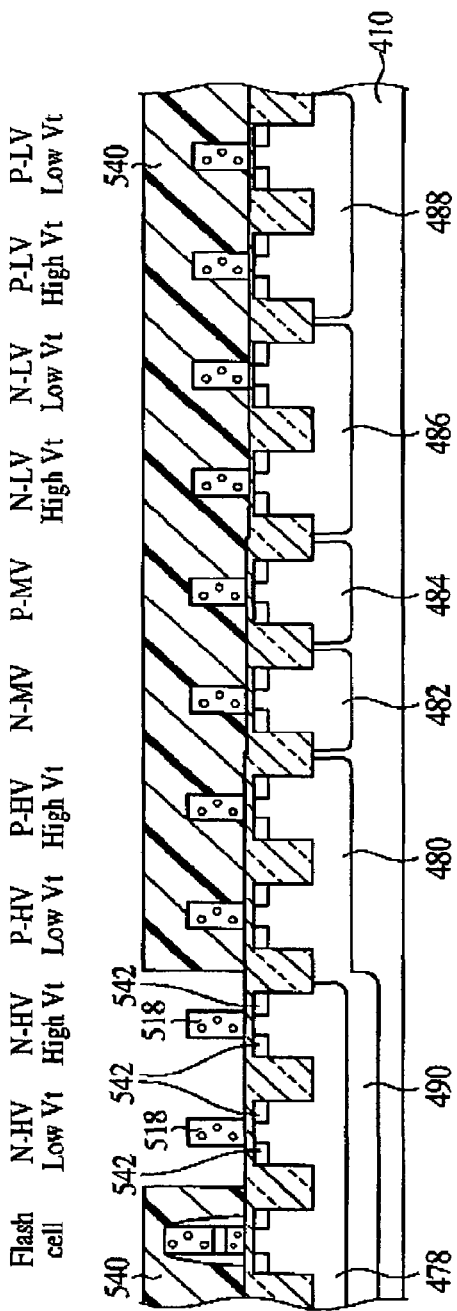

Then, ion implantation is performed with the photoresist film 540 as the mask to form the extensions 542 of the source/drain regions of the n-channel high-voltage/low-threshold voltage transistor (N-HV Low Vt) and the n-channel high-voltage/high-threshold voltage transistor (N-HV High Vt) (FIG. 42A). The extensions 542 are formed by implanting, e.g., phosphorus ions under conditions of a 35 keV acceleration energy and a $4 \times 10^{13}$ cm$^{-2}$ dosage.

Next, the photoresist film 540 is removed by, e.g., ashing.

Next, a silicon oxide film is deposited by, e.g., thermal CVD method, and then the silicon oxide film is etched back to form a sidewall insulating film 544 of the silicon oxide film on the side walls of the gate electrodes 512, 518.

Then, a photoresist film 546 exposing the region for the flash memory cell (Flash cell) to be formed in and the region for the n-channel transistors (N-HV Low Vt, N-HV High Vt, N-MV, N-LV High Vt, N-LV Low Vt) to be formed in and covering the rest region is formed by photolithography.

Then, ion implantation is performed with the photoresist film 546 as the mask to form the source/drain regions of the flash memory cell (Flash cell) and the n-channel transistors (N-HV Low Vt, N-Hv High Vt, N-MV, N-LV High Vt, N-LV Low Vt) (FIG. 42B). This ion implantation concurrently dopes the gate electrode 512 of the flash memory cell (Flash cell) and the gate electrode 518 of the n-channel transistors (N-HV Low Vt, N-HV High Vt, N-MV, N-LV High Vt, N-LV Low Vt) to be n-type. The source/drain regions 548 are formed by implanting, e.g., phosphorus ions under conditions of a 10 keV acceleration energy and a $6 \times 10^{15}$ cm$^{-2}$ dosage.

Then, the photoresist film 546 is removed by, e.g., ashing.

Next, a photoresist film 550 exposing the region for the p-channel transistors (P-HV Low Vt, P-HV High Vt, P-MV, P-LV High Vt, P-LV Low Vt) to be formed in and covering the rest region is formed by photolithography.

Figure 43A:
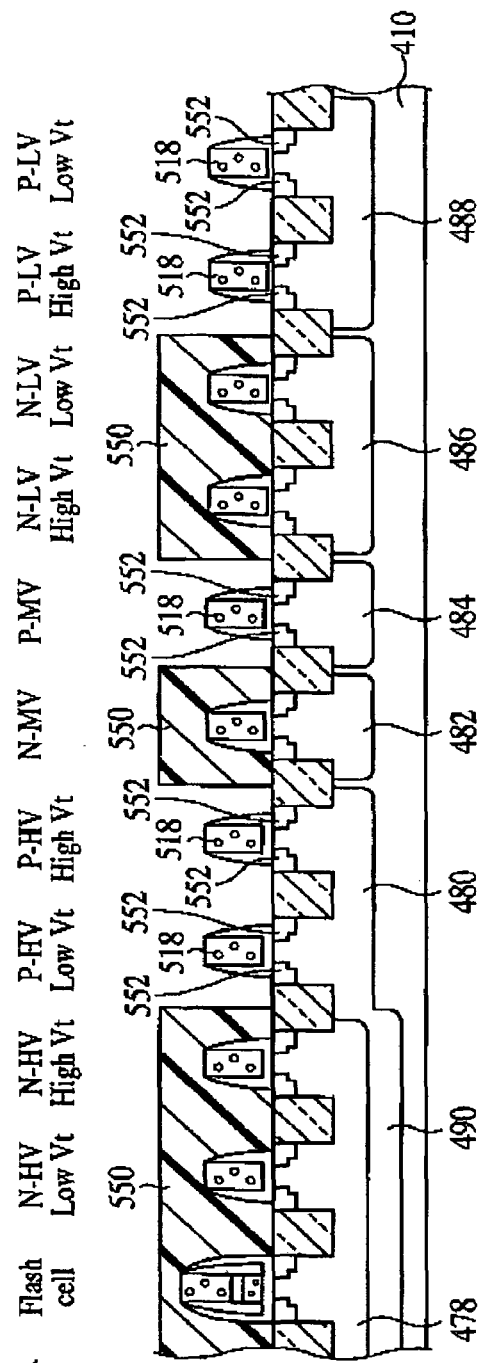

Then, ion implantation is performed with the photoresist film 550 as the mask to form the source/drain regions 552 of the p-channel transistors (P-HV Low Vt, P-HV High Vt, P-MV, P-LV High Vt, P-LV Low Vt) (FIG. 43A). This ion implantation concurrently dopes the gate electrodes 518 of the p-channel transistors (P-HV Low Vt, P-HV High Vt, P-MV, P-LV High Vt, P-LV Low Vt) to be p-type. The source/drain regions 552 are formed by implanting, e.g., boron ions under conditions of a 5 keV acceleration energy and a $4 \times 10^{15}$ cm$^{-2}$ dosage.

Next, the photoresist film 550 is removed by, e.g., ashing.

Then, the upper parts of the gate electrodes 512, 518 and source/drain regions 548, 552 are silicided by the known salicide process.

Thus, on the silicon substrate 410, the 11 kinds of transistors are completed.

Figure 43B:
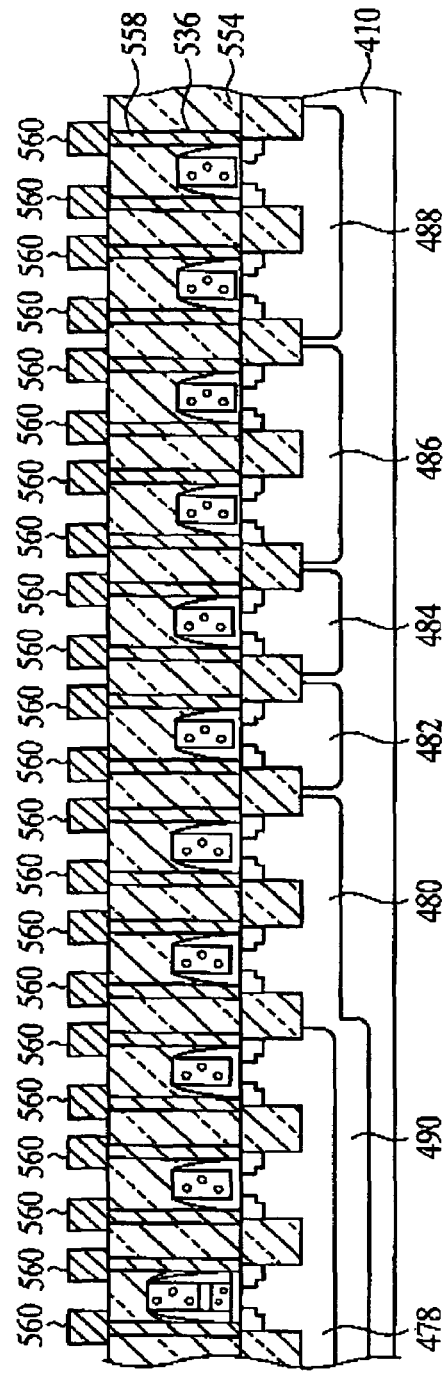

Next, an insulating film 554 is formed on the silicon substrate 410 with the transistors, etc. formed on, contact holes 556, electrode plugs 558, and interconnections 560, etc. are formed, and the structure up to a first-level metal interconnection is completed (FIG. 43B).

Then, the growth of the insulating film and the formation of the interconnections, etc. are repeated to thereby form a multi-level interconnection layer 562 of a required number of layers on the insulating film 554.

Next, an insulating film 564 is grown on the multi-level interconnection layer 562, and contact holes 566, electrode plugs 568, interconnections 570, a pad electrode 572, etc. are formed. Thus, the structure up to the upper most-level metal interconnection is completed.

Figure 44:
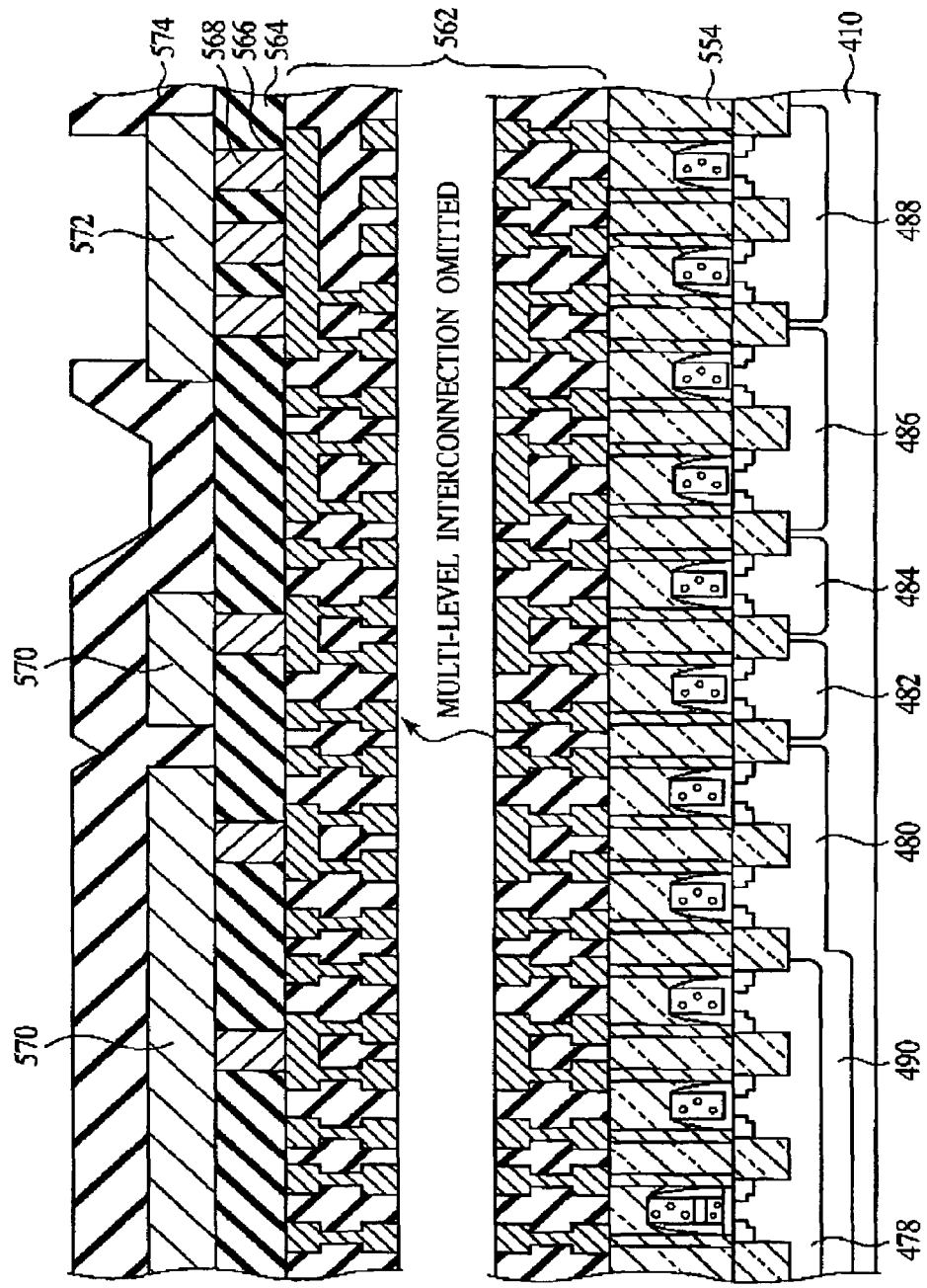
Figure 45A:
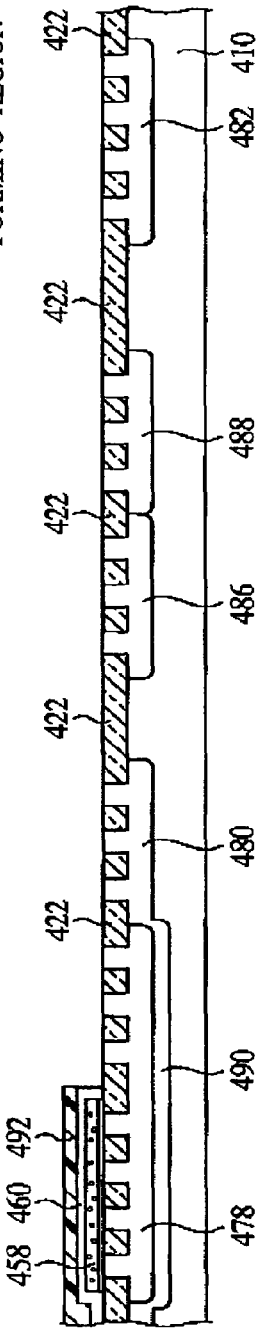
Figure 45B:
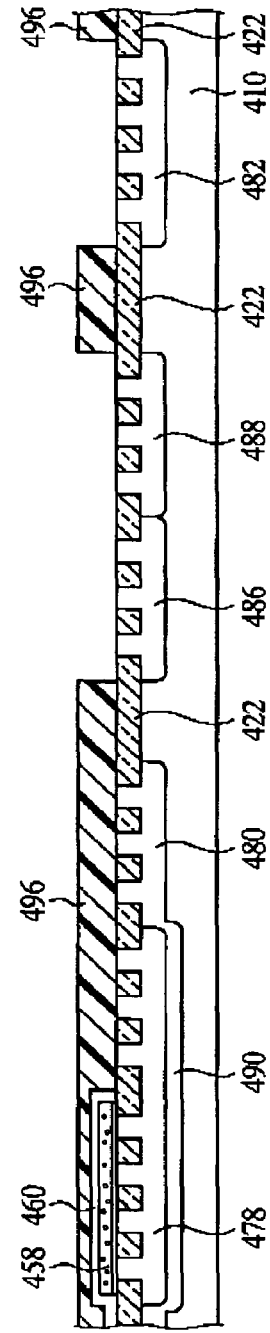
Figure 45C:
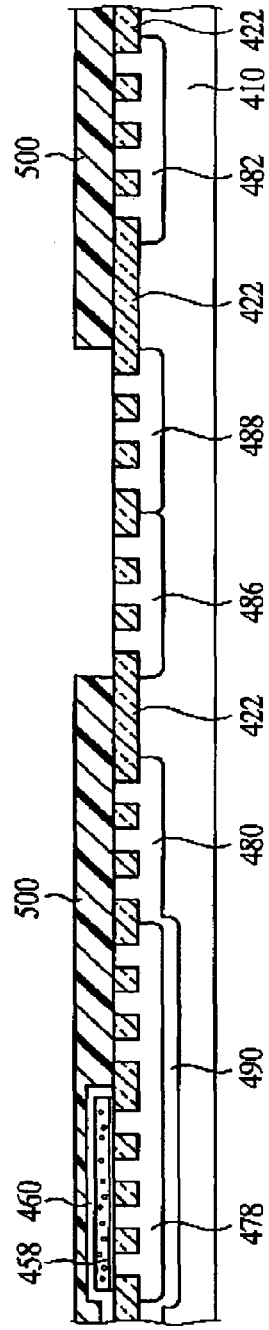

Next, on the insulating film 564 with the interconnection layer 570, the pad electrode 572, etc. formed on, a passivation film 574 is formed, and the semiconductor device is completed (FIG. 44).

As described above, according to the present embodiment, in forming the gate insulating films of different film thicknesses, the mask for selectively removing the insulating film in the region for the low-voltage transistor to be formed in and the region for the middle-voltage transistors to be formed in is prepared based on the mask data of the low-voltage operative wells and the middle-voltage operative wells, and the mask for selectively removing the insulating film in the region for the low-voltage transistors to be formed in is prepared based on the mask data of the low-voltage operative wells, whereby the active regions of the region for the high-voltage transistors to be formed in and the device isolation film are protected without failure. Accordingly, even when the device isolation regions have a large width, the problem that the device isolation film is thinned in the region for the high-voltage transistors to be formed in never takes place. Thus, even when the device isolation film is formed at once in all the regions of the substrate, the device isolation film is kept thick in the high-voltage region, whereby the threshold voltage of the field parasitic transistors can be kept high. The device isolation film can be concurrently formed, which does not add to the fabrication cost.

The steps formed on the device isolation film in forming the gate insulating films of different film thicknesses are formed in the part corresponding to the well edges and accordingly are sufficiently spaced from the edge of the active regions. Thus, no fine concavities are formed between the device isolation film and the active regions, and the generation of residues in the concavities in the device isolation film can be prevented.

The etching masks used in forming the gate insulating films of different film thicknesses are prepared based on the mask data of the wells, which makes it unnecessary to prepare new data for preparing the mask.

A THIRD EMBODIMENT

The semiconductor device and the method for fabricating the same according to a third embodiment of the present invention will be explained with reference to FIGS. 46A to 47B. The same members of the present embodiment as those of the semiconductor device and the method for fabricating the same according to the second embodiment shown in FIGS. 27 to FIG. 45C are represented by the same reference numbers not to repeat or to simplify their explanation.

First, a structure of the semiconductor device according to the present embodiment will be explained with reference to FIGS. 46A-46C.

The semiconductor device according to the present embodiment is a logic semiconductor device with a flash memory combined, which includes 11 kinds of transistors, and the basic structure is the same as that of the semiconductor device according to the second embodiment shown in FIGS. 27 and 28.

In the semiconductor device according to the present embodiment, as in the semiconductor device according to the second embodiment, 3 kinds of gate insulating films of different film thicknesses in addition to a tunnel gate insulating film must be formed. To this end, the region for low-voltage transistors to be formed in is exposed to two etching steps in forming the gate insulating film, and in these steps the device isolation film is etched. The region for middle-voltage transistors to be formed in are exposed to one etching step in forming the gate insulating film, and the device isolation film is etched in this step.

The semiconductor device according to the present embodiment is characterized mainly in that the steps on the device isolation film, which are formed by said etching are formed in the regions of the device isolation film corresponding to the edge of the high-voltage operative wells and to the middle-voltage operative wells. The characteristic of the present embodiment will be explained.

Figure 46A:
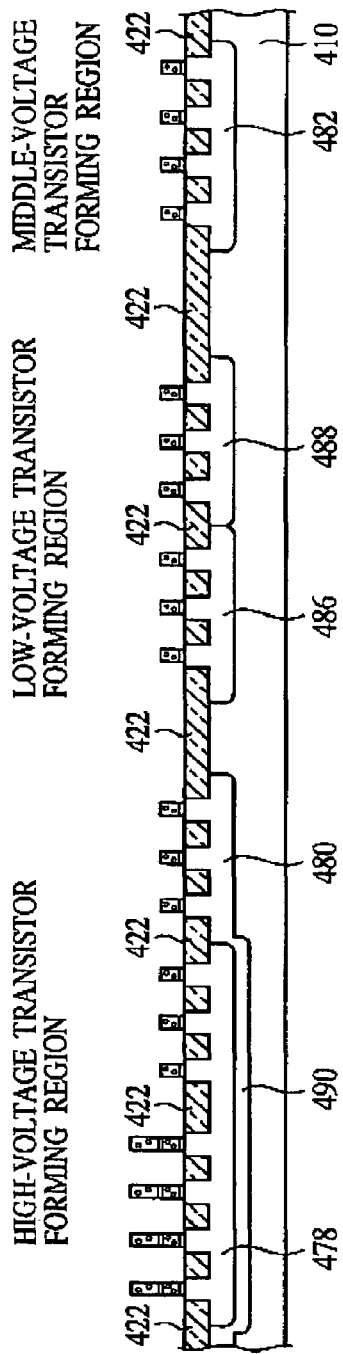
FIGS. 46A-46C are diagrammatic sectional views of the semiconductor device according to the third embodiment of the present invention, which show a structure thereof.

FIG. 46A is a diagrammatic conceptual sectional view of the region for high-voltage transistors including flash memory cells to be formed in and the region for middle-voltage transistors to be formed in formed adjacent to the region for low-voltage transistors to be formed in. As shown in FIG. 46A, an n-well 480 formed in the region for the high-voltage transistor to be formed in and a p-well 486 formed in the region for low-voltage transistors to be formed in are spaced from each other, and a device isolation film 422 is formed in a silicon substrate 410 between the n-well 480 and the p-well 486. An n-well 488 formed in the region for low-voltage transistors to be formed in and a p-well 482 formed in the region for middle-voltage transistors to be formed in are spaced from each other, and the device isolation film 422 is formed in the silicon substrate 410 between the n-well 488 and the p-well 482.

Figure 46C:
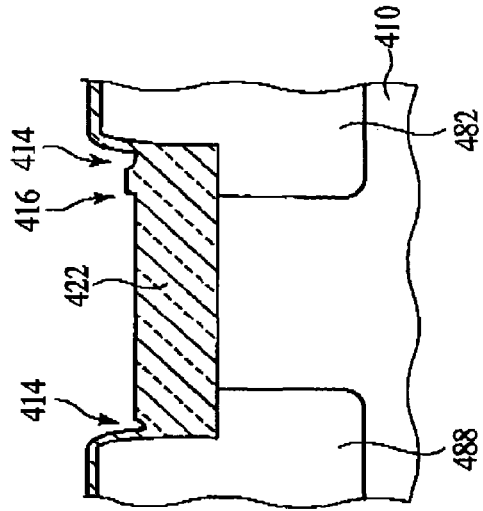
Figure 46B:
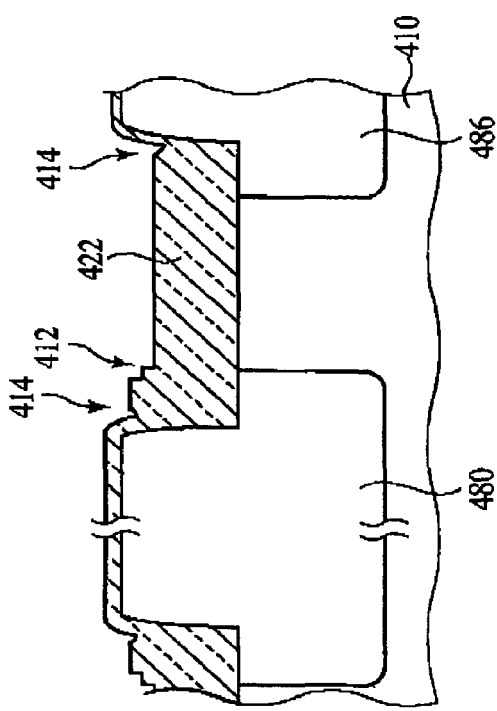

FIG. 46B is an enlarged diagrammatic sectional view of the region between the n-well 480 and the p-well 486. As shown in FIG. 46B, in the surface of the device isolation film 422 in the region corresponding to the edge of the n-well 480, a step 412 in stairs is formed by two etching steps in forming gate insulating films. Concavities 414 formed on the edges of the device isolation film 422, which are adjacent to the active regions are formed not in forming the gate insulating film but in forming the device isolation film 422 by STI method.

FIG. 46C is an enlarged diagrammatic sectional view of the region between the n-well 488 and the p-well 482. As shown in FIG. 46C, on the surface of the device isolation film 422 in the regions corresponding to the edge of the p-well 482, a step 416 are formed by one etching step in forming the gate insulating films. The concavities 414 are formed not in forming the gate insulating film but in forming the device isolation film 422 by STI method.

The step 412 is formed on the device isolation film 422 in parts corresponding to the edge (bordering edge) of the CMOS well (p-well 478, n-wells 480, 490) of the region for the high-voltage transistors to be formed in but is not formed on the other region of the device isolation film 422. Similarly, the step 416 is formed on the device isolation film in parts corresponding to the edge (bordering edge) of the CMOS well (p-well 482, n-well 484) of the region of the middle-voltage transistors to be formed in but is not formed on the other region of the device isolation film 422. The steps 412, 416 are not formed in the region for the low-voltage transistors to be formed in.

Such characteristics of the semiconductor device according to the present embodiment is produced by the patterns of the etching masks used in forming the gate insulating films are prepared based on data of the high-voltage operative wells (p-well 478, n-wells 480, 490) and the middle-voltage operative wells (p-well 482, n-well 484). The patterns of the etching masks are prepared based on the data of these wells, whereby no step is formed on the device isolation film in the region for the high-voltage transistors to be formed in. The device isolation film is formed relatively thicker in all the parts of the high-voltage operative well than in the low-voltage operative well (p-well 486, n-well 488) and the middle-voltage operative well. This structure makes it possible to retain high the threshold voltages of all the field parasitic transistors in the high-voltage operative region.

Also in the semiconductor device according to the present embodiment, as in the second fabrication method described above, the steps 412, 416 are formed on the surface of the device isolation film. However, the steps 412, 416 are formed in the regions of the device isolation film 44 corresponding to the well edge of the high-voltage operative wells or the middle-voltage operative wells, and the concavity caused by the steps 412, 416 takes a large region in the device isolation film 422 (see FIGS. 46B and 46C) Even with the concavities caused on the surface of the device isolation film 422 by the steps 412, 416, the concavities are so sufficiently spaced from each other that a polycrystalline silicon film formed above can be easily patterned without residues.

As described above, the steps 412, 416 are formed in the regions of the device isolation film 422 corresponding to the well edges of the high-voltage operative wells or the middle-voltage operative wells but are not formed in the other regions of the device isolation film 422. Accordingly, the steps involved in forming the gate insulating films are not generated inside the main logic circuit unit 302, and accordingly, the generation of residues of the polycrystalline silicon film can be prevented, which permits the polycrystalline silicon interconnections can be arranged by closest packing suitably for the downsizing of devices.

Figure 47A:
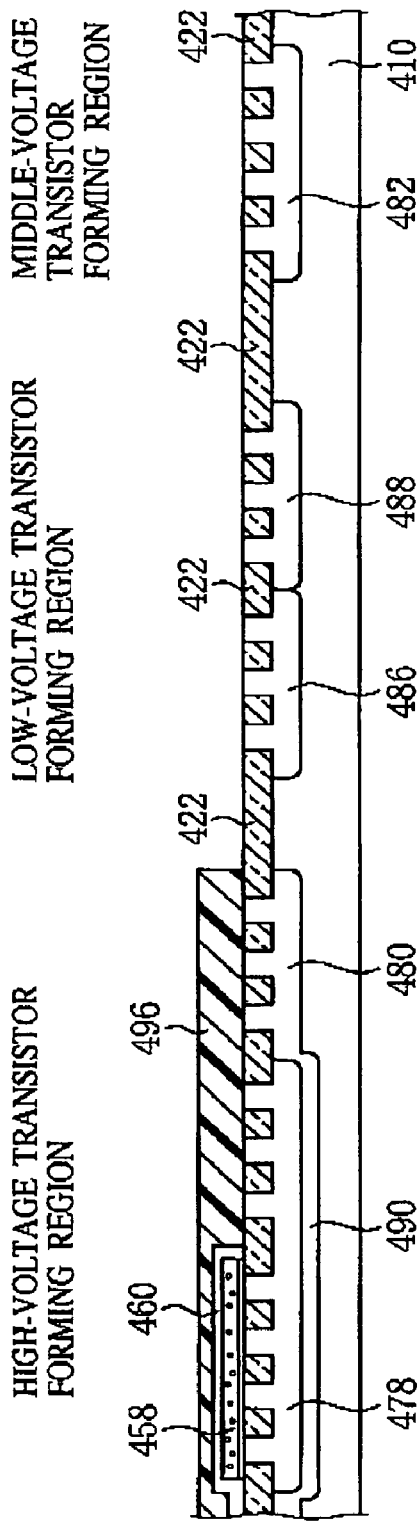
FIGS. 47A-47B are sectional views of the semiconductor device according to the third embodiment of the present invention in the steps of the method for fabricating the same, which show the method.

Then, the method for fabricating the semiconductor device according to the present embodiment will be explained with reference to FIGS. 47A and 47B. The method for fabricating the semiconductor device according to the present embodiment is the same as the method for fabricating the semiconductor device according to the second embodiment except that the mask pattern of the photoresist film 496 used in the steps shown in FIGS. 37A and 45B and the mask pattern of the photoresist film 500 used in the steps shown in FIGS. 37B and 45C are different from those used in the method for fabricating the semiconductor device according to the present embodiment.

In the same way as in the method for fabricating the semiconductor device according to the second embodiment shown in FIGS. 30A to 36B, the p-wells 478, 482, 486 and the n-wells 480, 484, 488, 490, the floating gate 458, the ONO film 460, etc. are formed, and then the ONO film 460 and the tunnel oxide film 456 in the region other than the region for the flash memory cell (Flash cell) to be formed in is removed.

Next, thermal oxidation is performed at, e.g., 850° C. to form a 13 nm-thick silicon oxide film 494 on the active regions.

Then, a photoresist film 496 covering the region for the flash memory cell (Flash cell) to be formed in and the region for the high-voltage transistors (N-HV Low Vt, N-HV High Vt, P-HV Low Vt, P-HV High Vt) to be formed in and exposing the rest region is formed by photolithography.

The pattern of the photoresist film 496 is prepared based on the data of the high-voltage operative wells (p-well 478, n-wells 480, 490). The reversed data of the mask date for forming said wells is used as it is, or the reversed data is shifted to be larger by a certain value, e.g., by about 1 μm on respective sides.

Then, the silicon oxide film 494 is etched by wet etching using, e.g., hydrofluoric acid aqueous solution with the photoresist film 496 as the mask to remove the silicon oxide film 494 in the region for the middle-voltage transistors (N-MV, P-MV) to be formed in and the region for the low-voltage transistors (N-LV Low Vt, N-LV High Vt, P-LV Low Vt, P-LV High Vt) to be formed in (see FIG. 37A).

In this etching step, the device isolation film 422 is also etched. However, the edges of the photoresist film 496 are positioned only on the regions of the device isolation film 422 corresponding to the edges of the high-voltage operative wells (p-well 478, n-wells 480, 490), and the steps 412 are formed only in these regions (see FIG. 46B).

Next, the photoresist film 496 is removed by, e.g., ashing.

Then, thermal oxidation is performed at, e.g., 850° C. to form a 4.5 nm-thick silicon oxide film 498 on the active regions in the region for the middle-voltage transistors (N-MV, P-MV) and in the region for the low-voltage transistors (N-LV Low Vt, N-LV High Vt, P-LV Low Vt, P-LV High Vt). This thermal oxidation step increases the film thickness of the silicon oxide film 494.

Then, a photoresist film 500 covering the region for the flash memory cell (Flash cell) to be formed in, the region for the high-voltage transistors (N-HV Low Vt, N-HV High Vt, P-HV Low Vt, P-HV High Vt) to be formed in, and the region for the middle-voltage transistor (N-MV, P-MV) to be formed in and exposing the region for the low-voltage transistors (N-LV Low Vt, N-LV High Vt, P-LV Low Vt, P-LV High Vt) to be formed in is formed by photolithography.

Figure 47B:
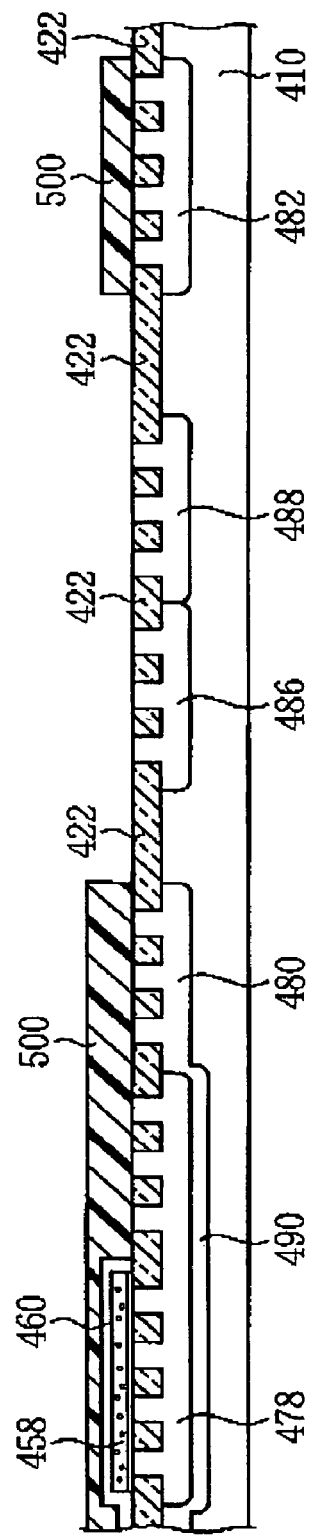
Figure 48A:
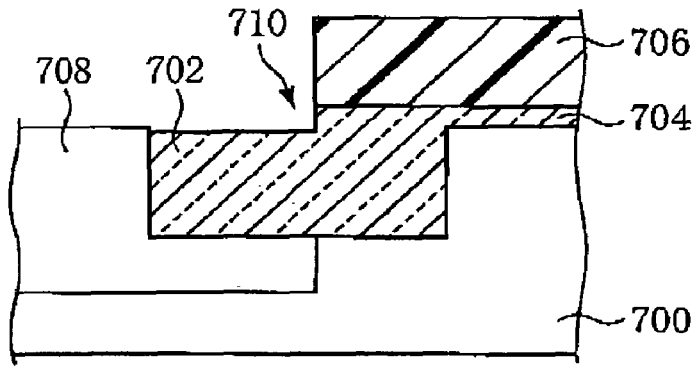
FIGS. 48A-48C are diagrammatic sectional views of the conventional semiconductor device, which explain the problem.
Figure 48B:
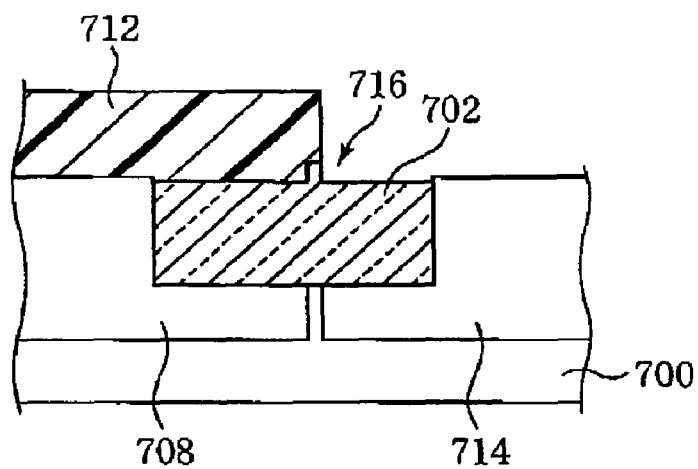
Figure 48C:
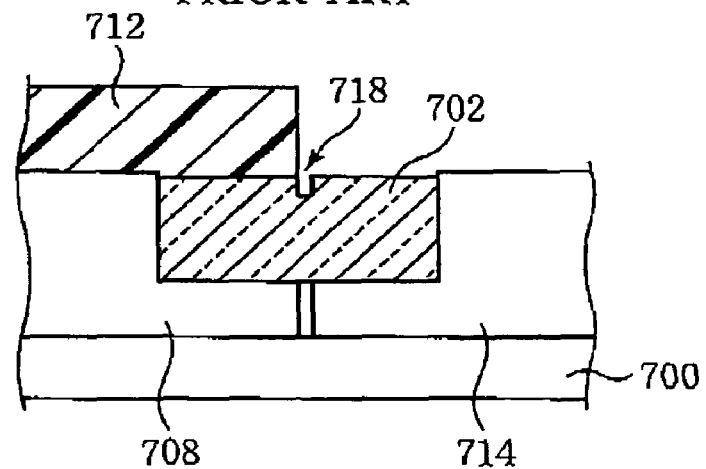

As shown in FIG. 47B, the pattern of the photoresist film 500 is prepared based on the data of the high-voltage operative wells (p-well 478, n-wells 480, 490) and the middle-voltage operative wells (p-well 48s, n-well 484). The reversed data of the mask date for forming said wells are used as it is, or the reversed data are shifted to be larger by a certain value, e.g., by about 1 μm on respective sides.

Next, the silicon oxide film 498 is etched by wet etching using, e.g., hydrofluoric acid aqueous solution with the photoresist film 500 as the mask to remove the silicon oxide film 498 in the region for the low-voltage transistors (N-LV Low Vt, N-LV High Vt, P-LV Low Vt, P-LV High Vt) to be formed in (FIG. 37B).

In this etching step, the device isolation film 422 is also etched. However, the edges of the photoresist film 500 are positioned only on the regions of the device isolation film 422 corresponding to the edges of the high-voltage operative wells (p-well 478, n-wells 480, 490) and the edges of the middle-voltage operative wells (P-well 482, n-well 484), and the steps 412, 416 are formed only in these regions (see FIG. 46C).

Then, the photoresist film 500 is removed by, e.g., ashing.

Hereafter, in the same way as in the method for fabricating the semiconductor device according to the second embodiment shown in FIG. 38A to FIG. 44, the semiconductor device is completed.

As described above, according to the present embodiment, in forming the gate insulating films of different film thicknesses, the mask for selectively-removing the insulating film in the region for the low-voltage transistors to be formed in and the region for the middle-voltage transistors to be formed in is prepared based on the reverse data of mask data for the high-voltage operative wells, and the mask for selectively removing the insulating film in the region for the low-voltage transistors to be formed in is prepared based on the reverse data of the mask data for the high-voltage operative wells and the reverse data of the mask data for the middle-voltage operative wells, whereby the active regions and the device isolation film in the region for the high-voltage transistors to be formed in are protected without failure. Accordingly, even when the width of the device isolation region is large, the problem that the device isolation film in the region for the high-voltage transistors to be formed in is thinned does not take place. Thus, even when the device isolation film is formed at once in all the region of the substrate, the device isolation film in the high-voltage region is retained thick, and the threshold voltages of the field parasitic transistors can be retained high. The device isolation film can be formed at once, which does not add to the fabrication cost.

The steps formed on the device isolation film in forming the gate insulating films of different film thicknesses are formed in the part corresponding to the well edges and accordingly are sufficiently spaced from the edge of the active regions. Thus, no fine concavities are formed between the device isolation film and the active regions, and the generation of residues in the concavities in the device isolation film can be prevented.

The etching mask to be used in forming the gate insulating films of different film thicknesses is prepared based on the mask data of the wells, which makes it unnecessary to prepare new data for forming the masks.

MODIFIED EMBODIMENTS

The present invention is not limited to the above-described embodiments and can cover other various modifications.

For example, in the first embodiment, the present invention is explained by means of an FPGA with no flash memory combined and an FPGA with a flash memory combined. However, the present invention is not essentially applied to FPGAs. The present invention is about the semiconductor device group which includes a semiconductor device with no flash memory combined and a semiconductor device with a flash memory combined and is applicable widely to the semiconductor groups to which the identity of the logic transistors of both semiconductor devices is important.

The curvature radius and the STI recess amounts of the upper end of the active region are not limited to the values described in the embodiments described above and can be suitably set in accordance with characteristics of the flash memory cells and kinds, film thicknesses, etc. of the gate insulating films.

In the second and the third embodiments, the semiconductor device and the method for fabricating the same according to the present invention is explained by means of an FPGA with a flash memory combined, but the semiconductor devices the present invention is applicable to are not limited to FPGAs. The present invention is applicable widely to semiconductor devices including a plurality of gate insulating films of different film thicknesses.

In the first embodiment, the semiconductor device with no flash memory combined includes 6 kinds of transistors, and in the first to the third embodiments, the semiconductor device with a flash memory combined includes 11 kinds of transistors. However, the number of kinds of the transistors is not limited to them. Kinds of transistors mounted on the semiconductor devices can be increased or decreased in accordance with applications. Circuits to be formed can be variously selected.

What is claimed is:

1. A semiconductor device group comprising: a first semiconductor device including a first design macro and a nonvolatile memory, and a second semiconductor device including no nonvolatile memory and a second design macro having functions identical to those of the first design macro, the first design macro including a first element which is formed on a first semiconductor substrate and includes a first active region, a first device isolation region and a first transistor formed in the first active region, the second design macro including a second element which is formed on a second semiconductor substrate discrete from the first semiconductor substrate and includes a second active region, a second device isolation region and a second transistor having characteristics identical to those of the first transistor formed in the second active region, a curvature radius of an upper end of the first active region in a cross section being larger than a curvature radius of an upper end of the second active region in a cross section, and a difference in height between a surface of the first active region and a surface of the first device isolation region being larger than a difference in height between a surface of the second active region and a surface of the second device isolation region.

2. A semiconductor device group according to claim 1, wherein the curvature radius of the first active region is made larger than the curvature radius of the second active region so that a difference in a device characteristic due to the difference in height between the surface of the first active region and the surface of the first device isolation region being different from the difference in height between the surface of the second active region and the surface of the second device isolation region is compensated.

3. A semiconductor device group according to claim 2, wherein the device characteristic is a channel width dependency of a threshold voltages of a transistor.

4. A semiconductor device group according to claim 1, wherein the first device isolation region includes a trench formed in the first semiconductor substrate, and an insulating material buried in the trench, and the second device isolation region includes a trench formed in the second semiconductor substrate, and an insulating material buried in the trench.

5. A semiconductor device group according to claim 1, wherein the first semiconductor device is an FPGA including the nonvolatile memory, and the second semiconductor device is an FPGA including no nonvolatile memory.

6. A semiconductor device group according to claim 1, wherein the first design macro and the second design macro constitute a main logic circuit.

7. The semiconductor device group according to claim 1, wherein the first design macro and the non-volatile memory comprise 11 or more distinct transistor structures, and the second design macro comprises 6 or more distinct transistor structures.

8. The semiconductor device group according to claim 1, wherein the first design macro comprises 6 or more distinct transistor structures formed within the first active region which have the same operational function as 6 or more distinct transistor structures of the second design macro formed in the second active region.

9. The semiconductor device group according to claim 1, wherein the first design macro constitutes a first main logic circuit region formed on the first semiconductor substrate, and the second design macro constitutes a second main logic circuit region formed on the second semiconductor substrate.

10. The semiconductor device group according to claim 1, wherein the nonvolatile memory is a flash memory.

11. A semiconductor device comprising: a first design macro and a nonvolatile memory, the first design macro including a first element which is formed on a semiconductor substrate and includes a first active region, a first device isolation region and a first transistor formed in the first active region, the semiconductor device constituting a semiconductor device group together with another semiconductor device which comprises no nonvolatile memory and a second design macro, the second design macro having functions identical to those of the first design, macro and including a second element which is formed on another semiconductor substrate discrete from the semiconductor substrate and includes a second active region, a second device isolation region and a second transistor having characteristics identical to those of the first transistor formed in the second active region, a curvature radius of an upper end of the first active region in a cross section being larger than a curvature radius of an upper end of the second active region in a cross section, and a difference in height between a surface of the first active region and a surface of the first device isolation region being larger than a difference in height between a surface of the second active region and a surface of the second device isolation region.

* * * * *